United States Patent
Kimura et al.

(10) Patent No.: US 10,762,834 B2
(45) Date of Patent: Sep. 1, 2020

(54) SEMICONDUCTOR DEVICE AND DRIVING METHOD THEREOF

(71) Applicant: Semiconductor Energy Laboratory Co., Ltd., Atsugi-shi, Kanagawa-ken (JP)

(72) Inventors: Hajime Kimura, Kanagawa (JP); Yoshifumi Tanada, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 181 days.

(21) Appl. No.: 15/818,806

(22) Filed: Nov. 21, 2017

(65) Prior Publication Data

US 2018/0137813 A1 May 17, 2018

Related U.S. Application Data

(63) Continuation of application No. 14/957,767, filed on Dec. 3, 2015, now Pat. No. 9,830,853, which is a
(Continued)

(30) Foreign Application Priority Data

Oct. 30, 2001 (JP) .................. 2001-333575
Oct. 10, 2002 (JP) .................. 2002-298062

(51) Int. Cl.
*G09G 3/3225* (2016.01)
*G09G 3/20* (2006.01)
(Continued)

(52) U.S. Cl.
CPC ......... *G09G 3/3225* (2013.01); *G09G 3/2022* (2013.01); *G09G 3/3233* (2013.01);
(Continued)

(58) Field of Classification Search
CPC .. G09G 3/3225; G09G 3/3233; G09G 3/3291; G09G 3/3283; G09G 3/3266;
(Continued)

(56) References Cited

U.S. PATENT DOCUMENTS 5,359,341 A 10/1994 Hutchings
5,550,066 A 8/1996 Tang et al.
(Continued)

FOREIGN PATENT DOCUMENTS

EP 0883191 A 12/1998
EP 1003150 A 5/2000
(Continued)

OTHER PUBLICATIONS

Baldo.M et al., "Highly Efficient Phosphorescent Emission From Organic Electroluminescent Devices", Nature, Sep. 10, 1998, vol. 395, pp. 151-154.
(Continued)

*Primary Examiner* — Roberto W Flores
(74) *Attorney, Agent, or Firm* — Fish & Richardson P.C.

(57) ABSTRACT

Brightness irregularities that develop in a light emitting device due to is persion among pixels in the threshold values of TFTs used for supplying electric current to light emitting devices become obstacles to improved image quality of the light emitting device. As an image signal input to a pixel from a source signal line, a desired electric potential is applied to a gate electrode of a TFT for supplying electric current to an EL device, through a TFT having its gate and drain connected to each other. A voltage equal to the TFT threshold value is produced between the source and the drain of the TFT 105. An electric potential in which the image signal is offset by the amount of the threshold value is therefore applied to the gate electrode of the TFT. Further, TFTs are disposed in close proximity to each other within
(Continued)

the pixel, so that dispersions in the TFT characteristics do not easily develop. A desired drain current can thus be supplied to the EL device even if there is dispersion in the threshold values of the TFTs among pixels, because this is offset by the threshold value of the TFT.

9 Claims, 45 Drawing Sheets

Related U.S. Application Data continuation of application No. 14/155,517, filed on Jan. 15, 2014, now Pat. No. 9,208,717, which is a continuation of application No. 13/097,149, filed on Apr. 29, 2011, now Pat. No. 8,896,506, which is a continuation of application No. 12/208,361, filed on Sep. 11, 2008, now Pat. No. 8,487,841, which is a continuation of application No. 10/283,330, filed on Oct. 30, 2002, now Pat. No. 7,429,985.

(51) Int. Cl.
  *G09G 3/3266* (2016.01)
  *G09G 3/3283* (2016.01)
  *G09G 3/3291* (2016.01)
  *G09G 3/3233* (2016.01)

(52) U.S. Cl.
  CPC ......... *G09G 3/3266* (2013.01); *G09G 3/3283* (2013.01); *G09G 3/3291* (2013.01); *G09G 2300/088* (2013.01); *G09G 2300/0814* (2013.01); *G09G 2300/0819* (2013.01); *G09G 2300/0842* (2013.01); *G09G 2300/0861* (2013.01); *G09G 2300/0866* (2013.01); *G09G 2300/0876* (2013.01); *G09G 2310/027* (2013.01); *G09G 2310/061* (2013.01); *G09G 2320/0233* (2013.01)

(58) Field of Classification Search
  CPC ......... G09G 3/2022; G09G 2320/0233; G09G 2310/061; G09G 2310/027; G09G 2300/088; G09G 2300/0876; G09G 2300/0866; G09G 2300/0861; G09G 2300/0842; G09G 2300/0819; G09G 2300/0814
  USPC .................................... 345/76–111
  See application file for complete search history.

(56) References Cited

U.S. PATENT DOCUMENTS

| | | | |
|---|---|---|---|
| 5,581,160 A | 12/1996 | Fujita | |
| 5,673,058 A | 9/1997 | Uragami et al. | |
| 6,037,719 A | 3/2000 | Yap et al. | |
| 6,048,573 A | 4/2000 | Tang et al. | |
| 6,175,345 B1 | 1/2001 | Kuribayashi et al. | |
| 6,229,506 B1 | 5/2001 | Dawson et al. | |
| 6,348,906 B1 | 2/2002 | Dawson et al. | |
| 6,362,798 B1 | 3/2002 | Kimura et al. | |
| 6,373,454 B1 | 4/2002 | Knapp et al. | |
| 6,373,455 B1 | 4/2002 | Kuribayashi et al. | |
| 6,380,687 B1 | 4/2002 | Yamazaki | |
| 6,525,704 B1 | 2/2003 | Kondo et al. | |
| 6,538,374 B2 | 3/2003 | Hosokawa | |
| 6,583,775 B1 | 6/2003 | Sekiya et al. | |
| 6,611,130 B2 | 8/2003 | Chang | |
| 6,653,996 B2 | 11/2003 | Komiya | |
| 6,661,397 B2 | 12/2003 | Mikami et al. | |
| 6,693,383 B2 | 2/2004 | Bae et al. | |
| 6,734,836 B2 | 5/2004 | Nishitoba | |
| 6,750,833 B2 | 6/2004 | Kasai | |
| 6,777,888 B2 | 8/2004 | Kondo | |
| 6,859,193 B1 | 2/2005 | Yumoto | |
| 6,909,242 B2 | 6/2005 | Kimura | |
| 6,917,350 B2 | 7/2005 | Pae et al. | |
| 6,933,672 B2 | 8/2005 | Hosokawa | |
| 6,943,759 B2 | 9/2005 | Tam | |
| 6,989,826 B2 | 1/2006 | Kasai | |
| 7,015,884 B2 | 3/2006 | Kwon | |
| 7,098,884 B2 | 8/2006 | Onoya | |
| 7,148,884 B2 | 12/2006 | Kasai | |
| 7,173,584 B2 | 2/2007 | Kimura et al. | |
| 7,209,101 B2 | 4/2007 | Abe | |
| 7,250,718 B2 | 7/2007 | Hosokawa | |
| 7,324,101 B2 | 1/2008 | Miyazawa | |
| 7,429,985 B2 | 9/2008 | Kimura et al. | |
| 7,583,032 B2 | 9/2009 | Kimura | |
| 7,623,106 B2 | 11/2009 | Onoya | |
| 7,688,290 B2 | 3/2010 | Yamazaki et al. | |
| 7,915,830 B2 | 3/2011 | Kimura | |
| 7,994,705 B2 | 8/2011 | Hosokawa | |
| 8,253,662 B2 | 8/2012 | Yamazaki et al. | |
| 8,487,841 B2 | 7/2013 | Kimura et al. | |
| 8,743,028 B2 | 6/2014 | Yamazaki et al. | |
| 8,896,506 B2 | 11/2014 | Kimura et al. | |
| 9,087,476 B2 | 7/2015 | Yamazaki et al. | |
| 9,368,089 B2 | 6/2016 | Yamazaki et al. | |
| 2001/0009280 A1 | 7/2001 | Tanaka et al. | |
| 2002/0070913 A1 | 6/2002 | Kimura et al. | |
| 2003/0043131 A1* | 3/2003 | Iguchi ................... G09G 3/325 345/204 | |
| 2003/0111966 A1* | 6/2003 | Mikami ............... G09G 3/3233 315/169.3 | |
| 2006/0256047 A1 | 11/2006 | Kimura et al. | |
| 2006/0290617 A1 | 12/2006 | Miyazawa | |
| 2007/0139315 A1 | 6/2007 | Abe | |
| 2008/0316152 A1 | 12/2008 | Kimura et al. | |
| 2009/0009676 A1 | 1/2009 | Kimura et al. | |
| 2011/0169008 A1 | 7/2011 | Kimura | |
| 2011/0260167 A1 | 10/2011 | Hosokawa | |
| 2016/0365029 A1 | 12/2016 | Yamazaki et al. | |
| 2019/0156742 A1 | 5/2019 | Yamazaki et al. | |

FOREIGN PATENT DOCUMENTS

| | | |
|---|---|---|
| EP | 1061497 A | 12/2000 |
| EP | 1117085 A | 7/2001 |
| EP | 1220191 A | 7/2002 |
| EP | 1594116 A | 11/2005 |
| EP | 2151865 A | 2/2010 |
| JP | 09-081053 A | 3/1997 |
| JP | 11-003048 A | 1/1999 |
| JP | 11-272233 A | 10/1999 |
| JP | 2000-259098 A | 9/2000 |
| JP | 2001-060076 A | 3/2001 |
| JP | 2001-111053 A | 4/2001 |
| JP | 2001-203080 A | 7/2001 |
| JP | 2001-230086 A | 8/2001 |
| JP | 2001-249627 A | 9/2001 |
| JP | 2001-272968 A | 10/2001 |
| JP | 2001-282137 A | 10/2001 |
| JP | 2001-296843 A | 10/2001 |
| JP | 2001-343931 A | 12/2001 |
| JP | 2002-514320 | 5/2002 |
| JP | 2002-184575 A | 6/2002 |
| JP | 2002-215096 A | 7/2002 |
| JP | 2003-195811 A | 7/2003 |
| JP | 2003-202833 A | 7/2003 |
| JP | 2004-062041 A | 2/2004 |
| JP | 2004-145278 A | 5/2004 |
| JP | 2008-233933 A | 10/2008 |
| WO | WO-1998/048403 | 10/1998 |
| WO | WO-1999/048078 | 9/1999 |

(56) References Cited

FOREIGN PATENT DOCUMENTS

WO WO-2001/075852  10/2001
WO WO-2002/075709   9/2002

OTHER PUBLICATIONS

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.
Tsutsui.T et al., "Electroluminescence in Organic Thin Films", Photochemical Processes in Organized Molecular Systems, 1991, pp. 437-450.
Tsutsui.T et al., "High Quantum Efficiency in Organic Light-Emitting Devices With Iridium-Complex as a Triplet Emissive Center", Jpn. J. Appl. Phys. (Japanese Journal of Applied Physics) , Dec. 15, 1999, vol. 38, No. 12B, pp. L1502-L1504.

\* cited by examiner

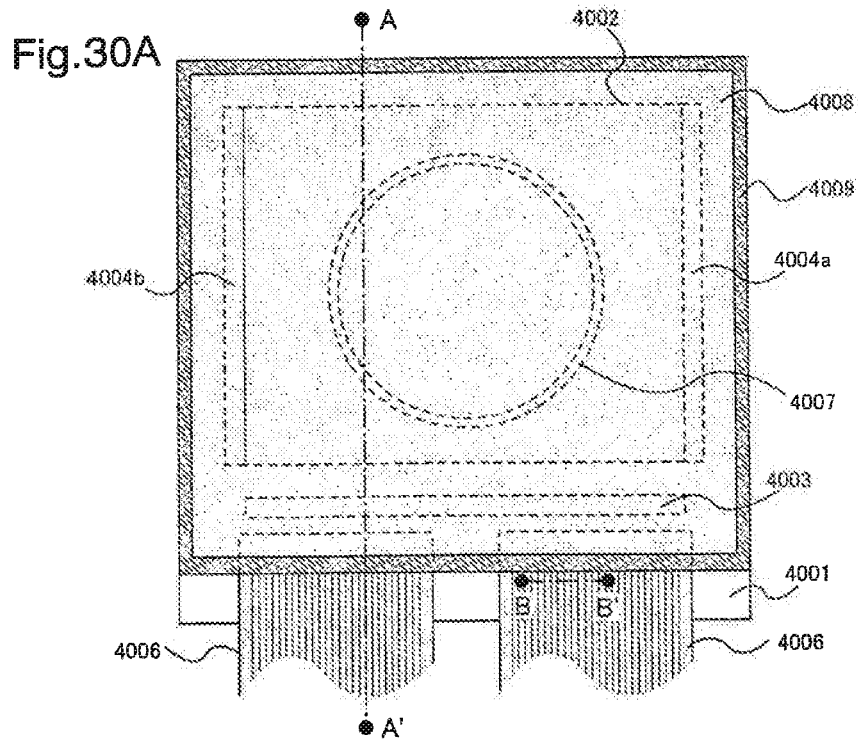
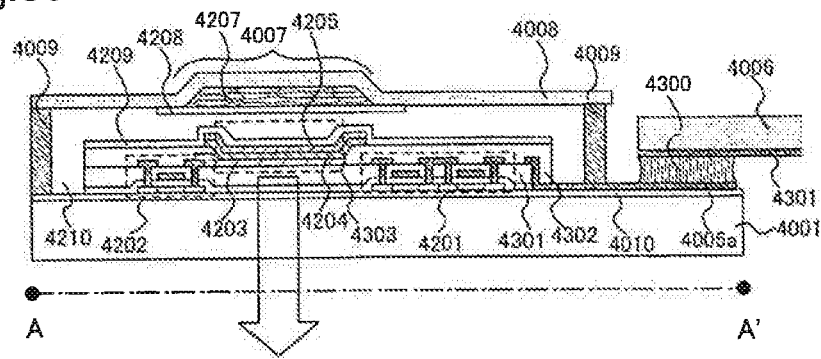
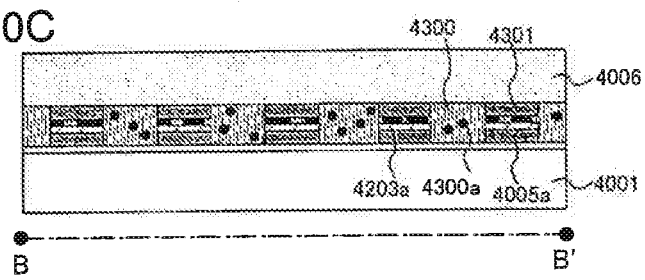

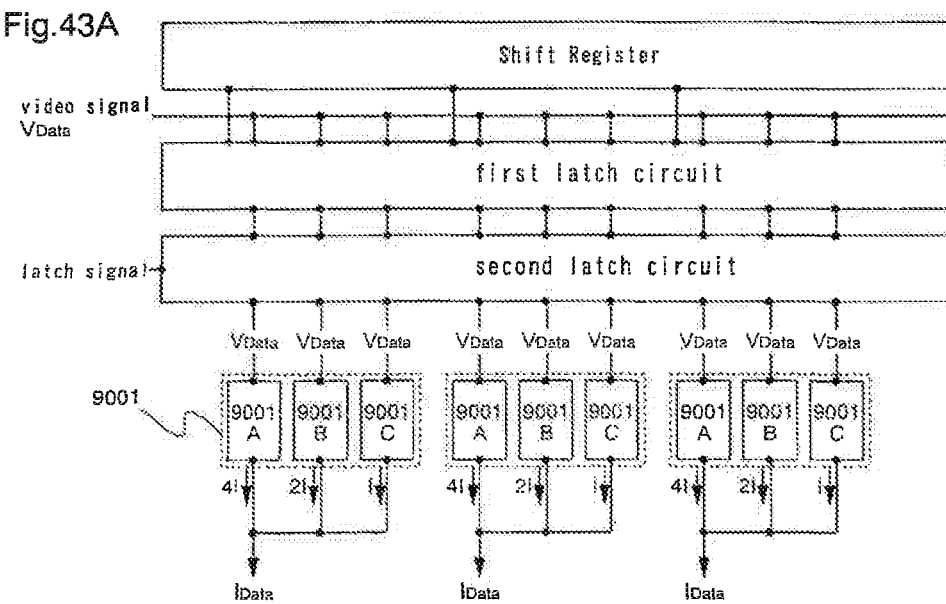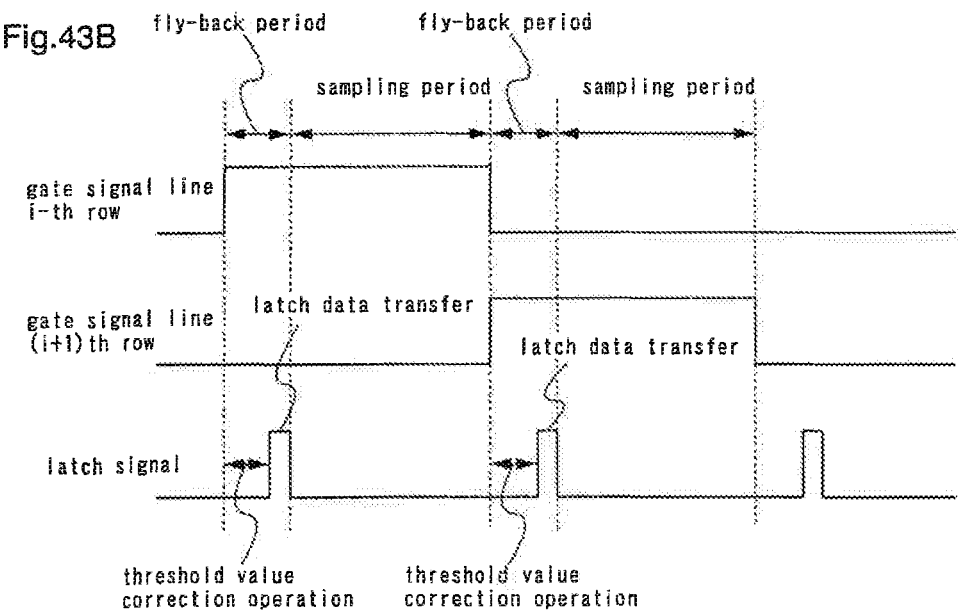

SEMICONDUCTOR DEVICE AND DRIVING METHOD THEREOF

CROSS-REFERENCE TO RELATED APPLICATIONS

This application is a continuation of U.S. application Ser. No. 14/957,767, filed Dec. 3, 2015, now allowed, which is a continuation of U.S. application Ser. No. 14/155,517, filed Jan. 15, 2014, now U.S. Pat. No. 9,208,717, which is a continuation of U.S. application Ser. No. 13/097,149, filed Apr. 29, 2011, now U.S. Pat. No. 8,896,506, which is a continuation of U.S. application Ser. No. 12/208,361, filed Sep. 11, 2008, now U.S. Pat. No. 8,487,841, which is a continuation of U.S. application Ser. No. 10/283,330, filed Oct. 30, 2002, now U.S. Pat. No. 7,429,985, which claims the benefit of foreign priority applications filed in Japan as Serial No. 2001-333575 on Oct. 30, 2001, and as Serial No. 2002-298062 on Oct. 10, 2002, all of which are incorporated by reference.

TECHNICAL FIELD

The present invention relates to the configuration of a semiconductor device having a transistor. The invention also relates to the configuration of an active matrix light emitting device including a semiconductor device having a thin film transistor (hereafter, referred to as TFT) fabricated on an insulator such as glass and plastics. In addition, the invention relates to an electronic apparatus using such a light emitting device.

BACKGROUND

In recent years, the development of display devices using light emitting devices including electroluminescent (EL) devices has been conducted actively. The light emitting device has high visibility because it emits light for itself. It does not need a back light that is needed in liquid crystal display devices (LCD), and thus it is suitable for forming items that have a low profile and have nearly no limits to the field of view.

Here, the EL device is a device having a light emitting layer that can obtain luminescence generated by applying an electric filed. The light emitting layer has light emission (fluorescence) in returning from the singlet excited state to the ground state, and light emission (phosphorescence) in returning from the triplet excited state to the ground state. In the invention, the light emitting device may have any light emission forms above.

The EL device is configured in which the light emitting layer is sandwiched between a pair of electrodes (an anode and a cathode), forming a laminated structure in general. Typically, a laminated structure of the anode/hole transport layer/emissive layer/electron transport layer/cathode is exemplary. Furthermore, there are the other structures laminated between an anode and a cathode in the order of the hole injection layer/hole transport layer/light emitting layer/electron transport layer, or hole injection layer/hole transport layer/light emitting layer/electron transport layer/electron injection layer. As the EL device structure used for the light emitting device in the invention, any structure described above may be adapted. Moreover, fluorescent pigment may be doped into the light emitting layer.

In the specification, the entire layers disposed between the anode and the cathode are collectively called the EL layer in the EL element. Accordingly, the hole injection layer, the hole transport layer, the light emitting layer, the electron transport layer, and the electron injection layer are all included in the EL element. The light emitting element formed of the anode, the EL layer, and the cathode is called EL element.

SUMMARY

According to the present invention, there is provided a semiconductor device comprising:
a switching device; and
a rectifying device,
characterized in that:
a first signal V1 is input to a first electrode of the rectifying device;
a second electrode of the rectifying device is electrically connected to a first electrode of the switching device;
a certain electric potential V is imparted to a second electrode of the switching device; and
an offset signal V2 equal to the signal V1 offset by a threshold value Vth is obtained from the second electrode of the rectifying device.

According to the present invention, there is provided a semiconductor device comprising:
first and second switching devices; and
a rectifying device,
characterized in that:
a first signal V1 is input to a first electrode of the first switching device;
a second electrode of the first switching device is electrically connected to a first electrode of the rectifying device;
a second electrode of the rectifying device is electrically connected to a first electrode of the second switching device;
a certain electric potential V is imparted to a second electrode of the second switching device; and
an offset signal V2 equal to the signal V1 offset by a threshold value Vth is obtained from the second electrode of the rectifying device.

According to the present invention, there is provided a semiconductor device comprising first and second rectifying devices, characterized in that:
a first signal V1 is input to a first electrode of the first rectifying device;
a second electrode of the first rectifying device is electrically connected to a first electrode of the second rectifying device;
a certain electric potential V is imparted to a second electrode of the second rectifying device; and
an offset signal V2 equal to the signal V1 offset by a threshold value Vth is obtained from the second electrode of the first rectifying device.

According to the present invention, there is provided a semiconductor characterized in that:
the rectifying device uses a transistor having a connection between its gate and its drain;
$V1+Vth<V$, and $V2=V1+Vth$ are satisfied when the polarity of the transistor is n-channel and its threshold value is Vth; and
$V1>V+|Vth|$, and $V2=V1-|Vth|$ are satisfied when the polarity of the transistor is p-channel and its threshold value is Vth.

According to the present invention, there is provided a semiconductor device characterized in that:

the rectifying device uses a diode; and

V1>V+Vth, and V2=V1+Vth, or V1<V−|Vth|, and V2=V1−|Vth| are satisfied when the threshold value of the diode is Vth.

According to the present invention, there is provided a semiconductor device comprising a pixel including a light emitting device, characterized in that:

the pixel has:

a source signal line;

first and second gate signal lines;

an electric current supply line;

first to fourth transistors; and the light emitting device;

a gate electrode of the first transistor is electrically connected to the first gate signal line;

a first electrode of the first transistor is electrically connected to the source signal line;

a second electrode of the first transistor is electrically connected to a first electrode of the second transistor;

a gate electrode of the second transistor is electrically connected to a second electrode of the second transistor, a first electrode of the third transistor, and a gate electrode of the fourth transistor;

a gate electrode of the third transistor is electrically connected to the second gate signal line;

a first electrode of the fourth transistor is electrically connected to the electric current supply line; and a second electrode of the fourth transistor is electrically connected to a first electrode of the light emitting device.

According to the present invention, there is provided a semiconductor device comprising a pixel including a light emitting device, characterized in that:

the pixel has:

a source signal line;

a gate signal line;

an electric current supply line;

first to fourth transistors; and the light emitting device;

a gate electrode of the first transistor is electrically connected to the gate signal line;

a first electrode of the first transistor is electrically connected to the source signal line;

a second electrode of the first transistor is electrically connected to a first electrode of the second transistor;

a gate electrode of the second transistor is electrically connected to a second electrode of the second transistor, a first electrode of the third transistor, and a gate electrode of the fourth transistor;

a gate electrode of the third transistor is electrically connected to the first gate signal line of a pixel in a row scanned at least one row previously;

a first electrode of the fourth transistor is electrically connected to the electric current supply line; and a second electrode of the fourth transistor is electrically connected to a first electrode of the light emitting device.

According to the present invention, there is provided a semiconductor device comprising a pixel including a light emitting device, characterized in that:

the pixel has:

a source signal line;

first and second gate signal lines;

an electric current supply line;

first to fourth transistors; and the light emitting device;

a gate electrode of the first transistor is electrically connected to the first gate signal line;

a first electrode of the first transistor is electrically connected to a gate electrode and a first electrode of the second transistor;

a second electrode of the first transistor is electrically connected to a first electrode of the third transistor and a gate electrode of the fourth transistor;

a second electrode of the second transistor is electrically connected to the source signal line;

a gate electrode of the third transistor is electrically connected to the second gate signal line;

a first electrode of the fourth transistor is electrically connected to the electric current supply line; and a second electrode of the fourth transistor is electrically connected to a first electrode of the light emitting device.

According to the present invention, there is provided a semiconductor device comprising a pixel including a light emitting device, characterized in that:

the pixel has:

a source signal line;

first and second gate signal lines;

an electric current supply line;

first to fourth transistors; and the light emitting device;

a gate electrode of the first transistor is electrically connected to the first gate signal line;

a first electrode of the first transistor is electrically connected to a gate electrode of the second transistor, a first electrode of the second transistor, and a first electrode of the third transistor;

a second electrode of the first transistor is electrically connected to a gate electrode of the fourth transistor;

a gate electrode of the third transistor is electrically connected to the second gate signal line;

a first electrode of the fourth transistor is electrically connected to the electric current supply line; and a second electrode of the fourth transistor is electrically connected a first electrode of the light emitting device.

According to the present invention, there is provided a semiconductor device comprising a pixel including a light emitting device, characterized in that:

the pixel has:

a source signal line;

a gate signal line;

an electric current supply line;

first to fourth transistors; and the light emitting device;

a gate electrode of the first transistor is electrically connected to the first gate signal line;

a first electrode of the first transistor is electrically connected to a gate electrode of the second transistor, a first electrode of the second transistor, and a first electrode of the third transistor;

a second electrode of the first transistor is electrically connected to a gate electrode of the fourth transistor;

a gate electrode of the third transistor is electrically connected to the gate signal line of a pixel in a row scanned at least one row previously;

a first electrode of the fourth transistor is electrically connected to the electric current supply line; and a second electrode of the fourth transistor is electrically connected a first electrode of the light emitting device.

According to the present invention, there is provided a semiconductor device characterized in that the second electrode of the third transistor of one pixel is electrically connected to a reset electric power source line.

According to the present invention, there is provided a semiconductor device characterized in that the second electrode of the third transistor of one pixel is electrically connected to any one of the gate signal lines included in any of the pixels scanned in a row different from the row including the one pixel.

According to the present invention, there is provided a semiconductor device comprising a pixel including a light emitting device, characterized in that:
the pixel has:
a source signal line;
first and second gate signal lines;
an electric current supply line;
first to fourth transistors; and
the light emitting device;
a gate electrode of the first transistor is electrically connected to the first gate signal line;
a first electrode of the first transistor is electrically connected to the source signal line;
a second electrode of the first transistor is electrically connected to a first electrode of the second transistor and a first electrode of the third transistor;
a gate electrode of the second transistor is electrically connected to a second electrode of the second transistor, a second electrode of the third transistor, and a gate electrode of the fourth transistor;
a first electrode of the fourth transistor is electrically connected to the electric current supply line; and
a second electrode of the fourth transistor is electrically connected a first electrode of the light emitting device.

According to the present invention, there is provided a semiconductor device comprising a pixel including a light emitting device, characterized in that:
the pixel has:
a source signal line;
first and second gate signal lines;
an electric current supply line;
first to third transistors;
capacitive means; and
the light emitting device;
a gate electrode of the first transistor is electrically connected to the first gate signal line;
a first electrode of the first transistor is electrically connected to the source signal line;
a second electrode of the first transistor is electrically connected to a first electrode of the second transistor;
a gate electrode of the second transistor is electrically connected to a second electrode of the second transistor and a gate electrode of the third transistor;
a first electrode of the third transistor is electrically connected to the electric current supply line;
a second electrode of the third transistor is electrically connected to a first electrode of the light emitting device;
a first electrode of the capacitive means is electrically connected to a gate electrode of the third transistor; and
a second electrode of the capacitive means is electrically connected to the second gate signal line.

According to the present invention, there is provided a semiconductor device comprising a pixel including a light emitting device, characterized in that:
the pixel has:
a source signal line;
first and second gate signal lines;
an electric current supply line;
first to third transistors;
a diode; and
the light emitting device;
a gate electrode of the first transistor is electrically connected to the first gate signal line;
a first electrode of the first transistor is electrically connected to the source signal line;
a second electrode of the first transistor is electrically connected to a first electrode of the second transistor;
a gate electrode of the second transistor is electrically connected to a second electrode of the second transistor and a gate electrode of the third transistor;
a first electrode of the third transistor is electrically connected to the electric current supply line;
a second electrode of the third transistor is electrically connected to a first electrode of the light emitting device;
a first electrode of the diode is electrically connected to a gate electrode of the third transistor;
a second electrode of the diode is electrically connected to the second gate signal line; and
electric current develops in only one direction when the electric potential of the second gate signal line is changed, either from the first electrode of the diode to the second electrode of the diode, or from the second electrode of the diode to the first electrode of the diode.

According to the present invention, there is provided a semiconductor device comprising a pixel including a light emitting device, characterized in that:
the pixel has:
a source signal line;
first to third gate signal lines;
an electric current supply line;
first to fifth transistors; and
the light emitting device;
a gate electrode of the first transistor is electrically connected to the first gate signal line;
a first electrode of the first transistor is electrically connected to the source signal line;
a second electrode of the first transistor is electrically connected to a first electrode of the second transistor;
a gate electrode of the second transistor is electrically connected to a second electrode of the second transistor, a first electrode of the third transistor, and a gate electrode of the fourth transistor;
a gate electrode of the third transistor is electrically connected to the second gate signal line;
a first electrode of the fourth transistor is electrically connected to the electric current supply line;
a second electrode of the fourth transistor is electrically connected to a first electrode of the light emitting device;
a gate electrode of the fifth transistor is electrically connected to the third gate signal line;
a first electrode of the fifth transistor is electrically connected to the electric current supply line;
a second electrode of the fifth transistor is electrically connected the gate electrode of the fourth transistor; and
the voltage between the gate and the source of the fourth transistor is set to zero by the fifth transistor becoming conductive.

According to the present invention, there is provided a semiconductor device comprising a pixel including a light emitting device, characterized in that:
the pixel has:
a source signal line;
first and second gate signal lines;
an electric current supply line;
first to fifth transistors; and
the light emitting device;
a gate electrode of the first transistor is electrically connected to the first gate signal line;

a first electrode of the first transistor is electrically connected to the source signal line;

a second electrode of the first transistor is electrically connected to a first electrode of the second transistor;

a gate electrode of the second transistor is electrically connected to a second electrode of the second transistor, a first electrode of the third transistor, and a gate electrode of the fourth transistor;

a gate electrode of the third transistor is electrically connected to the first gate signal line included in a pixel in a row scanned at least one row previously;

a first electrode of the fourth transistor is electrically connected to the electric current supply line;

a second electrode of the fourth transistor is electrically connected to a first electrode of the light emitting device;

a gate electrode of the fifth transistor is electrically connected to the second gate signal line;

a first electrode of the fifth transistor is electrically connected to the electric current supply line;

a second electrode of the fifth transistor is electrically connected the gate electrode of the fourth transistor; and the voltage between the gate and the source of the fourth transistor is set to zero by the fifth transistor becoming conductive.

According to the present invention, there is provided a semiconductor device comprising a pixel including a light emitting device, characterized in that:

the pixel has:
a source signal line;
first to third gate signal lines;
an electric current supply line;
first to fifth transistors; and
the light emitting device;

a gate electrode of the first transistor is electrically connected to the first gate signal line;

a first electrode of the first transistor is electrically connected to the source signal line;

a second electrode of the first transistor is electrically connected to a first electrode of the second transistor;

a gate electrode of the second transistor is electrically connected to a second electrode of the second transistor, a first electrode of the third transistor, and a gate electrode of the fourth transistor;

a gate electrode of the third transistor is electrically connected to the second gate signal line;

a first electrode of the fourth transistor is electrically connected to the electric current supply line;

a second electrode of the fourth transistor is electrically connected to a first electrode of the fifth transistor;

a gate electrode of the fifth transistor is electrically connected to the third gate signal line;

a second electrode of the fifth transistor is electrically connected to a second electrode of the light emitting device; and electric current supplied to the light emitting device from the electric current supply line is cut off by the fifth transistor becoming non-conductive.

According to the present invention, there is provided a semiconductor device comprising a pixel including a light emitting device, characterized in that:

the pixel has:
a source signal line;
first to third gate signal lines;
an electric current supply line;
first to fifth transistors; and
the light emitting device;

a gate electrode of the first transistor is electrically connected to the first gate signal line;

a first electrode of the first transistor is electrically connected to the source signal line;

a second electrode of the first transistor is electrically connected to a first electrode of the second transistor;

a gate electrode of the second transistor is electrically connected to a second electrode of the second transistor, a first electrode of the third transistor, and a gate electrode of the fourth transistor;

a gate electrode of the third transistor is electrically connected to the first gate signal line included in a pixel in a row scanned at least one row previously;

a first electrode of the fourth transistor is electrically connected to the electric current supply line;

a second electrode of the fourth transistor is electrically connected to a first electrode of the fifth transistor;

a gate electrode of the fifth transistor is electrically connected to the third gate signal line;

a second electrode of the fifth transistor is electrically connected to a second electrode of the light emitting device; and electric current supplied to the light emitting device from the electric current supply line is cut off by the fifth transistor becoming non-conductive.

According to the present invention, there is provided a semiconductor device characterized in that the second electrode of the third transistor of one pixel is electrically connected to a reset electric power source line.

According to the present invention, there is provided a semiconductor device characterized in that the second electrode of the third transistor of one pixel is electrically connected to any one of the gate signal lines included in any pixel of any row that does not include the one pixel.

According to the present invention, there is provided a semiconductor device comprising a pixel including a light emitting device, characterized in that:

the pixel has:
a source signal line;
first and second gate signal lines;
an electric current supply line;
first to fifth transistors; and
the light emitting device;

a gate electrode of the first transistor is electrically connected to the first gate signal line;

a first electrode of the first transistor is electrically connected to the source signal line;

a second electrode of the first transistor is electrically connected to a first electrode of the second transistor;

a gate electrode of the second transistor is electrically connected to a second electrode of the second transistor, a first electrode of the third transistor, and a gate electrode of the fourth transistor;

a gate electrode of the third transistor is electrically connected to the first gate signal line included in a pixel in a row scanned at least one row previously;

a second electrode of the third transistor is electrically connected to the second gate signal line;

a first electrode of the fourth transistor is electrically connected to the electric current supply line;

a second electrode of the fourth transistor is electrically connected to a first electrode of the fifth transistor;

a gate electrode of the fifth transistor is electrically connected to the second gate signal line;

a second electrode of the fifth transistor is electrically connected to a first electrode of the light emitting device; and electric current supplied to the light emitting device from the electric current supply line is cut off by the fifth transistor becoming non-conductive.

According to the present invention, there is provided a semiconductor device comprising a pixel including a light emitting device, characterized in that:

the pixel has:
a source signal line;
first and second gate signal lines;
an electric current supply line;
first to fifth transistors; and
the light emitting device;
a gate electrode of the first transistor is electrically connected to the first gate signal line;
a first electrode of the first transistor is electrically connected to the source signal line;
a second electrode of the first transistor is electrically connected to a first electrode of the second transistor;
a gate electrode of the second transistor is electrically connected to a second electrode of the second transistor, a first electrode of the third transistor, and a gate electrode of the fourth transistor;
a gate electrode of the third transistor is electrically connected to the first gate signal line included in a pixel in a row scanned at least one row previously;
a second electrode of the third transistor is electrically connected to the first gate signal line;
a first electrode of the fourth transistor is electrically connected to the electric current supply line;
a second electrode of the fourth transistor is electrically connected to a first electrode of the fifth transistor;
a gate electrode of the fifth transistor is electrically connected to the second gate signal line;
a second electrode of the fifth transistor is electrically connected to a first electrode of the light emitting device; and
electric current supplied to the light emitting device from the electric current supply line is cut off by the fifth transistor becoming non-conductive.

According to the present invention, there is provided a semiconductor device characterized in that:
the semiconductor device includes storage capacitive means;
a first electrode of the storage capacitive means is electrically connected to the second electrode of the first transistor;
a fixed electric potential is imparted to a second electrode of the storage capacitive means; and
the electric potential of the second electrode of the first transistor is stored.

According to the present invention, there is provided a semiconductor device characterized in that:
the semiconductor device includes storage capacitive means;
a first electrode of the storage capacitive means is electrically connected to a gate electrode of the fourth transistor;
a fixed electric potential is imparted to a second electrode of the storage capacitive means; and
the electric potential applied to the gate electrode of the fourth transistor is stored.

According to the present invention, there is provided a method of driving a semiconductor device, the semiconductor device comprising:
a switching device; and
a rectifying device,
the semiconductor device being characterized in that:
a first signal V1 is input to a first electrode of the rectifying device;
a second electrode of the rectifying device is electrically connected to a first electrode of the switching device;
a certain electric potential V is imparted to a second electrode of the switching device,
the method of driving the semiconductor device being characterized by comprising:
a first step of making the switching device conductive, thus setting the electric potential of the second electrode of the rectifying device to V;
a second step of making the switching device non-conductive, thus making the voltage between both the electrodes of the rectifying device converge to a threshold value Vth from the state of the first step; and
a third step of storing the threshold value Vth and obtaining an offset signal V2, which is equal to the signal V1 offset by the threshold value Vth, from the second electrode of the rectifying device.

According to the present invention, there is provided a method of driving a semiconductor device, the semiconductor device comprising:
first and second switching devices; and
a rectifying device,
the semiconductor device being characterized in that:
a first signal V1 is input to a first electrode of the first switching device;
a second electrode of the first switching device is electrically connected to a first electrode of the rectifying device;
a second electrode of the rectifying device is electrically connected to a first electrode of the second switching device; and
a certain electric potential V is imparted to a second electrode of the second switching device,
the method of driving the semiconductor device being characterized by comprising:
a first step of making the second switching device conductive, thus setting the electric potential of the second electrode of the rectifying device to V;
a second step of further making the first switching device conductive, thus setting the electric potential of the first electrode of the rectifying device to V1 from the state of the first step;
a third step of making the second switching device non-conductive, thus making the voltage between both the electrodes of the rectifying device converge to a threshold value Vth from the state of the second step;
a fourth step of further making the first switching device non-conductive, thus storing the threshold value Vth and obtaining an offset signal V2, which is equal to the signal V1 offset by the threshold value Vth, from the second electrode of the rectifying device, from the state of the third step.

According to the present invention, there is provided a method of driving a semiconductor device, the semiconductor device comprising first and second rectifying devices, the semiconductor being device characterized in that:
a first signal V1 is input to a first electrode of the rectifying device;
a second electrode of the first rectifying device is electrically connected to a first electrode of the second rectifying device; and a certain electric potential V is imparted to a second electrode of the second rectifying device, the method of driving the semiconductor device being characterized by comprising:

a first step of making the electric potential of the second electrode of the second rectifying device go from V to V0 (where V0>V) when V1>(V−|Vth|), thus cutting off electric current flowing in the second rectifying device; and a second step of obtaining an offset signal V2, which is equal to the signal V1 offset by the threshold value Vth, from the second electrode of the first rectifying device.

According to the present invention, there is provided a method of driving a semiconductor device characterized in that:

the rectifying device uses a transistor having a connection between its gate and its drain;

V1+Vth<V, and V2=V1+Vth are satisfied when the polarity of the transistor is n-channel and its threshold value is Vth; and V1>V+|Vth|, and V2=V1−|Vth| are satisfied when the polarity of the transistor is p-channel and its threshold value is Vth.

According to the present invention, there is provided a method of driving a semiconductor device characterized in that:

the rectifying device uses a diode; and

V1>V+Vth, and V2=V1+Vth, or V1<V−|Vth|, and V2=V1−|Vth| are satisfied when the threshold value of the diode is Vth.

DESCRIPTION OF DRAWINGS

FIGS. 30A-30C are an upper surface diagram and a cross sectional diagrams, respectively, of a light emitting device.

FIGS. 43A and 43B are diagrams showing an example of structuring an electric current source circuit by use of a threshold value correction principle of the present invention.

Like reference symbols in the various drawings indicate like elements.

DETAILED DESCRIPTION

Figure 20:
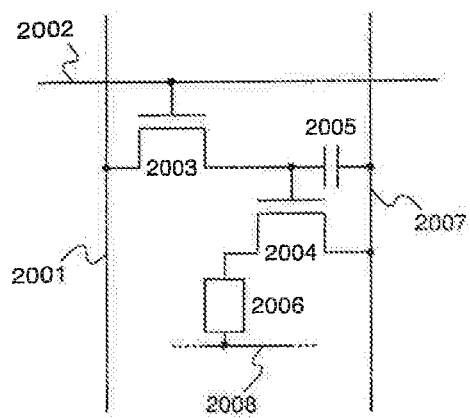
FIG. 20 is a diagram showing the structure of a pixel of a general light emitting device.

The invention may be discussed in the context of a general light emitting device. FIG. 20 shows the structure of a pixel in a general light emitting device. Note that an example of an EL display device is taken as a typical light emitting device. The pixel shown in FIG. 20 has a source signal line 2001, a gate signal line 2002, a switching TFT 2003, a driver TFT 2004, capacitive means 2005, an EL device 2006, an electric current supply line 2007, and an electric power source line 2008.

The connectivity relationship of each portion is explained. A TFT has three terminals here, a gate, a source, and a drain, and it is not possible to clearly distinguish between the source and the drain due to the TFT structure. One of the source and the drain is therefore referred to as a first electrode when explaining connections between the devices, while the other is referred to as a second electrode. The terms source, drain, and the like are used, however, when it is necessary to explain the TFT turning on and off, and thus the electric potential and the like of each terminal (such as the voltage between the gate and the source of a certain TFT).

Further, in this specification, the TFT turning on refers to a state in which the voltage between the gate and the source of the TFT exceeds the threshold value of the TFT, and an electric current flows between the source and the drain. The TFT turning off refers to a state in which the voltage between the gate and the source of the TFT is less than the threshold value of the TFT, and electric current does not flow between the source and the drain.

A gate electrode of the switching TFT 2003 is connected to the gate signal line 2002, a first electrode of the switching TFT 2003 is connected to the source signal line 2001, and a second electrode of the switching TFT 2003 is connected to a gate electrode of the driver TFT 2004. The first electrode of the driver TFT 2004 is connected to the electric current supply line 2007, and a second electrode of the driver TFT 2004 is connected to a first electrode of the EL device 2006. A second electrode of the EL device 2006 is connected to the electric power source line 2008. The electric current supply line 2007 and the electric power source line 2008 have a mutual electric potential difference. Further, the capacitive means 2005 may be formed between the gate electrode of the driver TFT 2004 and the first electrode thereof in order to store the voltage between the gate and the source of the driver TFT 2004.

An image signal output to the source signal line 2001 is then input to the gate electrode of the driver TFT 2004 if a pulse is input to the gate signal line 2002 and the switching TFT 2003 is turned on. The voltage between the gate and the source of the driver TFT 2004, and the amount of electric current flowing between the source and the drain of the driver TFT 2004 (hereinafter referred to as drain current), are determined in accordance with the electric potential of the input image signal. This electric current is then supplied to the EL device 2006, which emits light.

TFTs formed by using polycrystalline silicon (polysilicon, hereinafter referred to as P-Si) have a higher field effect mobility, and a larger on current, than TFTs formed by using amorphous silicon (hereinafter referred to as A-Si), and are therefore more suitable as transistors used in light emitting devices.

Conversely, TFTs formed by using polysilicon have a problem in that dispersion in their electrical characteristics tends to develop due to defects in crystal grain boundaries.

If there is dispersion per pixel in the threshold values of the TFTs structuring the pixels shown in FIG. 20, the sizes of the corresponding drain currents flowing in the TFTs differ, even if the same image signal is input, and there is dispersion in the brightness of the EL devices 2006. This therefore becomes a problem when using analog gray scales.

In view of this problem, it has been proposed recently that the TFT threshold value dispersion can be corrected. A structure shown in FIG. 22 can be given as one example of such a proposal. The structure has a source signal line 2201, a first gate signal line 2202, a second gate signal line 2203, a third gate signal line 2204, TFTs 2205 to 2208, storage means 2209 (C2) and 2210 (C1), an EL device 2211, and an electric current supply line 2212.

A gate electrode of the TFT 2205 is connected to the first gate signal line 2202, a first electrode of the TFT 2205 is connected to the source signal line 2201, and a second electrode of the TFT 2205 is connected to a first electrode of the capacitive means 2209. A second electrode of the capacitive means 2209 is connected to a first electrode of the capacitive means 2210, and a second electrode of the capacitive means 2210 is connected to the electric current supply line 2212. A gate electrode of the TFT 2206 is connected to the second electrode of the capacitive means 2209 and the first electrode of the capacitive means 2210. A first electrode of the TFT 2206 is connected to the electric current supply line 2212, and a second electrode of the TFT 2206 is connected to a first electrode of the TFT 2207 and a first electrode of the TFT 2208. A gate electrode of the TFT 2207 is connected to the second gate signal line 2203, and a second electrode of the TFT 2207 is connected to the second electrode of the capacitive means 2209 and the first electrode of the capacitive means 2210. A gate electrode of the TFT 2208 is connected to the third gate signal line 2204, and a second electrode of the TFT 2208 is connected to a first electrode of the EL device 2211. A second electrode of the EL device 2211 is connected to the electric power source line 2213, and has a mutual electric potential difference with the electric current supply line 2212.

Figure 22A:
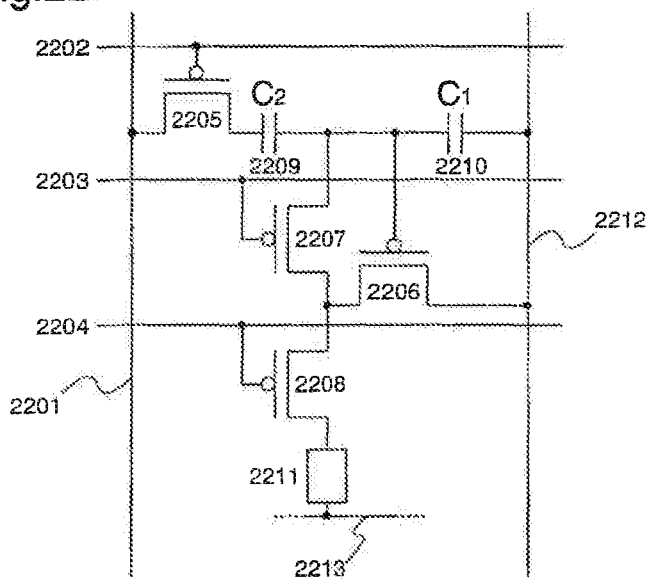
FIGS. 22A and 22B are diagrams showing an example of the structure of a pixel which performs TFT threshold value correction.
Figure 22B:
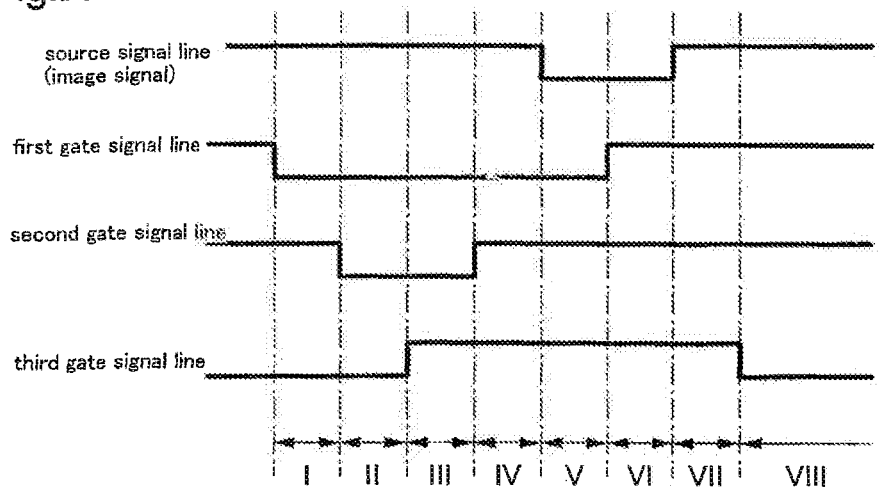

Operation is explained using FIG. 22B and FIGS. 23A to 23F. FIG. 22B shows a timing for inputting an image signal and pulses to the source signal line 2201, the first gate signal line 2202, the second gate signal line 2203, and the third gate signal line 2204, and is divided into sections I to VIII corresponding to each operation shown in FIG. 23. Further, a structure using four TFTs is employed by the pixel shown in FIG. 22, and the polarity of each of the TFTs is p-channel. The TFTs therefore turn on if L level is input to their gate electrodes, and turn off if H level is input. Further, although the image signal input to the source signal line 2201 is shown by pulses here in order to display only the input period, predetermined analog electric potentials are used with an analog gray scale method.

Figure 23A:
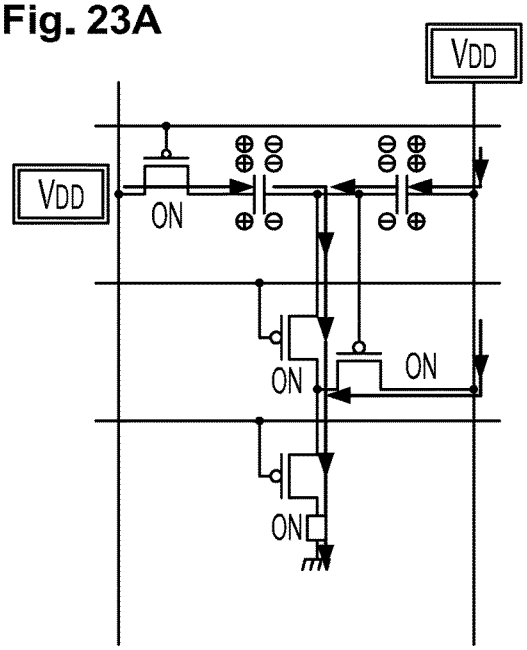
FIGS. 23A-23F are diagrams for explaining operations by the structure shown in FIG. 22.

The first gate signal line 2202 initially becomes L level, and the TFT 2205 turns on (section I). The second gate signal line 2203 and the third gate signal line 2204 then become L level, and the TFTs 2207 and 2208 turn on. Here, electric charge accumulates in the capacitive means 2209 and 2210 as shown in FIG. 23A, and the TFT 2206 turns on at the point where the voltage stored by the capacitive means 2210 exceeds the threshold value (Vth) of the TFT 2206 (section II).

Figure 23B:
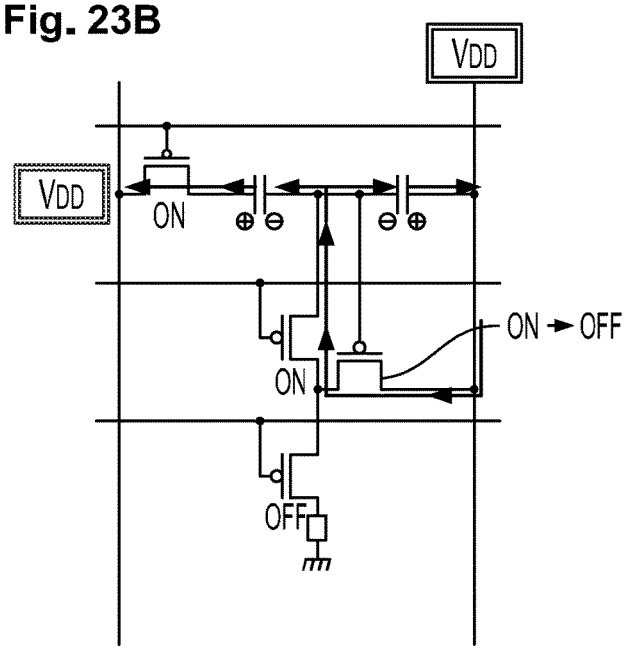

The third gate signal line 2204 then becomes H level, and the TFT 2208 turns off. The electric charge that has accumulated in the capacitive means 2209 and 2210 thus moves once again, and the voltage stored in the capacitive means 2210 soon becomes equal to Vth. The electric potentials of the electric current supply line 2212 and the source signal line 2201 are both VDD at this point as shown in FIG. 23B, and therefore the voltage stored in the capacitive means 2209 also becomes equal to Vth. Consequently, the TFT 2206 soon turns off.

Figure 23C:
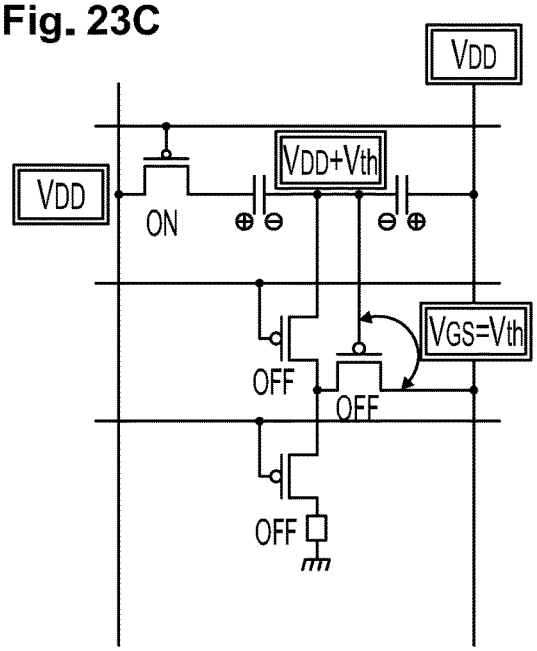

As discussed above, the second gate signal line 2203 becomes H level and the TFT 2207 turns off at the point where the voltages stored in the capacitive means 2209 and 2210 become equal to Vth (section IV). The voltage Vth is thus stored in the capacitive means 2209 by this operation as shown in FIG. 23C.

A relationship like that of Equation (1) is established for an electric charge Q1 stored in the capacitive means 2210 (C1). At the same time, a relationship like that of Equation (2) is established for an electric charge Q2 stored in the capacitive means 2209 (C2).

[Equation (1)]

$$Q_1 = C_1 \times |V_{th}| \quad (1)$$

[Equation (2)]

$$Q_2 = C_2 \times |V_{th}| \quad (2)$$

Figure 23D:
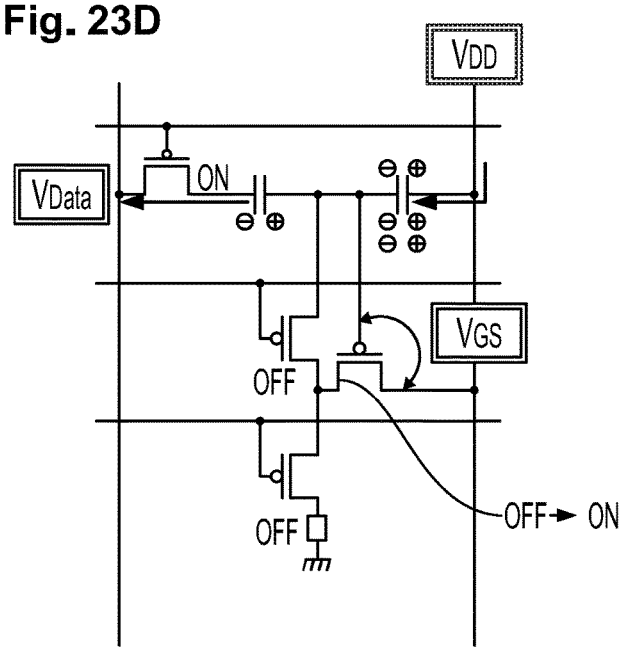

Input of the image signal is then performed as shown in FIG. 23D (section V). The image signal is output to the source signal line 2201, and the electric potential of the source signal line 2201 changes from VDD to an electric potential VData of the image signal (the TFT 2206 is a p-channel TFT here, and therefore VDD>VData). If the electric potential of the gate electrode of the TFT 2206 is taken as VP at this point, and the electric charge in this node is taken as Q, then relationships like those of Equations (3) and (4) are established due to conservation of charge contained in the capacitive means 2209 and 2210.

[Equation (3)]

$$Q + Q_1 = C_1 \times (V_{DD} - V_P) \quad (3)$$

[Equation (4)]

$$Q - Q_2 = C_2 \times (V_P - V_{Data}) \quad (4)$$

From Equations (1) to (4), the electric potential VP of the gate electrode of the TFT 2206 can be expressed by Equation (5).

[Equation (5)]

$$V_P = \frac{C_1}{C_1 + C_2} V_{DD} + \frac{C_2}{C_1 + C_2} V_{Data} - |V_{th}| \quad (5)$$

A voltage VGS between the gate and the source of the TFT 2206 is therefore expressed by Equation (6).

[Equation (6)]

$$\begin{aligned} V_{GS} &= V_P - V_{DD} \\ &= \frac{C_2}{C_1 + C_2}(V_{Data} - V_{DD}) - |V_{th}| \\ &= \frac{C_2}{C_1 + C_2}(V_{Data} - V_{DD}) + V_{th} \end{aligned} \quad (6)$$

The term Vth is included in the right side of Equation (6). That is, the threshold value of the TFT 2206 is added to the image signal input to the pixel from the source signal line 2201, and is stored by the capacitive means 2209 and 2210.

Figure 23E:
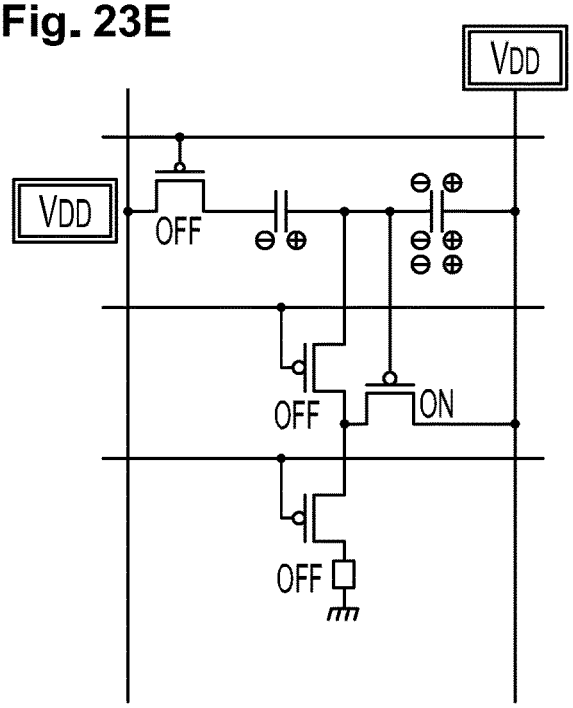

The first gate signal line 2202 becomes H level when input of the image signal is complete, and the TFT 2205 turns off (section V1). The source signal line then returns to a predetermined electric potential (section VII). Operations for writing the image signal into the pixel are thus complete (FIG. 23E).

Figure 23F:
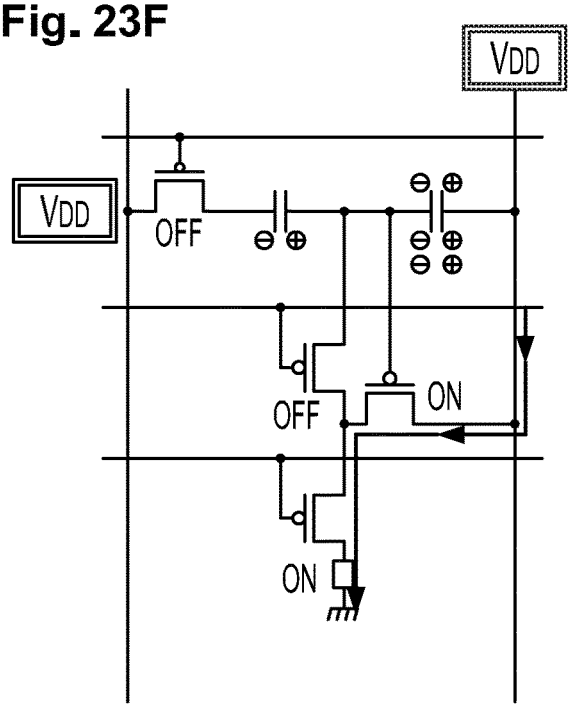

The third gate signal line 2204 then becomes L level, the TFT 2208 turns on, electric current flows in the EL device 2211 as shown in FIG. 23F, and the EL device 2211 thus emits light. The value of electric current flowing in the EL device 2211 at this point is in accordance with the voltage between the gate and the source of the TFT 2206. A drain current IDS flowing in the TFT 2206 is expressed by Equation (7).

[Equation (7)]

$$\begin{aligned} I_{DS} &= \frac{\beta}{2}(V_{GS} - V_{th})^2 \\ &= \frac{\beta}{2}\{\frac{C_2}{C_1 + C_2}(V_{Data} - V_{DD})\}^2 \end{aligned} \quad (7)$$

It can be understood from Equation (7) that the drain current IDS flowing in the TFT 2206 does not depend upon the threshold value Vth. It can therefore be understood that, even if there is dispersion per pixel in the threshold values of the TFTs 2206, those values are corrected and added to the image signal, and electric current thus flows in the EL devices 2211 in accordance with the electric potential VData of the image signal.

However, if there is dispersion in the capacitance values of the capacitive means 2209 and 2210 in the aforementioned structure, then there is also dispersion in the drain current IDS of the TFTs 2206. Therefore, an object of the present invention is to provide a light emitting device using as a pixel a semiconductor device that is capable of correcting dispersion in TFT threshold values, by employing a structure that is not influenced by dispersion in capacitance values.

The operating principle of the present invention is explained using FIG. 29. Consider circuits like those of FIGS. 29A and 29B. Switching devices 2901, 2903, 2911, and 2913 are each devices controlled by signals Signal 1 and Signal 2, and are capable of turning on and off by TFTs or the like. A device in which electric current only develops in a single direction when an electric potential difference is imparted to electrodes at both ends of the device is defined as a rectifying device here. Diodes, and TFTs that have a connection between their gate and drain (this type of connection is referred to as diode connection) can be given as examples of rectifying devices.

Figure 29A:
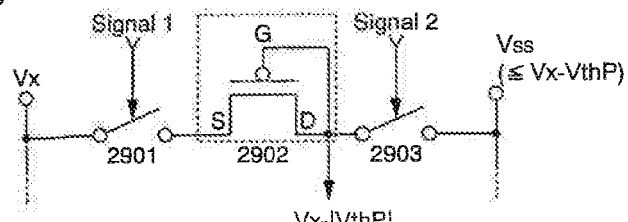
FIGS. 29A-29F are diagrams for explaining the operating principle of the present invention.
Figure 29B:
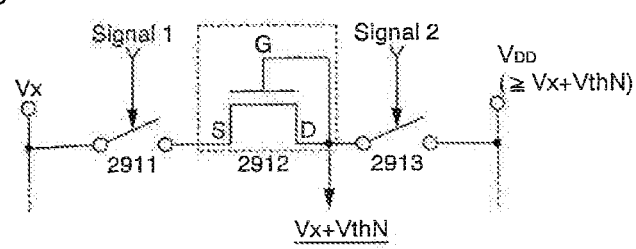

Consider circuits in which the switching devices 2901 and 2911, rectifying devices 2902 and 2912, and the switching devices 2903 and 2913 are connected as shown in FIGS. 29A and 29B.

A certain signal is input from one terminal of the circuit, and a certain fixed electric potential is imparted to the other terminal of the circuit. The signal input in FIG. 29A is taken as Vx, and the fixed electric potential is taken as VSS (VSS£Vx−|VthP|, where VthP is the TFT threshold value), while the signal input in FIG. 29B is also taken as Vx, and the fixed electric potential is taken as VDD (VDD>Vx+|VthN|, where VthN is the TFT threshold value).

Figure 29C:
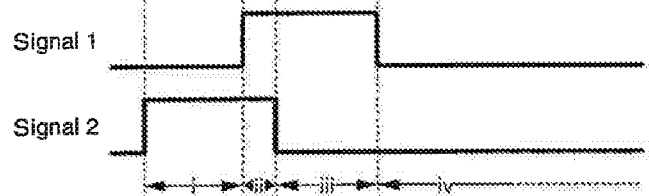

Now, the switching devices 2903 and 2913 are conductive in a period denoted by reference symbol i in FIG. 29C. The electric potentials of a drain electrode and a gate electrode of the TFT 2902, which is a rectifying device (a diode connected TFT is used here as the rectifying device), thus drop in FIG. 29A. The electric potentials of a second electrode and a gate electrode of the TFT 2912 rise in FIG. 29B. The voltage between both electrodes exceeds the absolute value of the threshold values for both of the rectifying devices 2902 and 2912, and therefore the TFTs 2902 and 2912 turn on. Note that the switching devices 2901 and 2911 are both off at this point, and electric current does not flow.

Thereafter, the switching devices 2901, 2903, 2911, and 2913 are conductive in a period denoted by reference symbol ii in FIG. 29C. In this period, the voltages between the gate and the source for the TFTs 2902 and 2912 become VSS−Vx and VDD−Vx, respectively, exceeding the absolute values of the threshold values of the TFTs, and electric current flows from Vx to VSS, and from VDD to Vx.

Figure 29D:
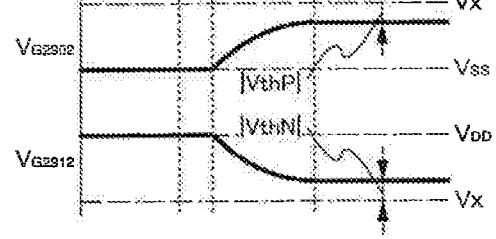

The switching devices 2901 and 2911 are then conductive in a period denoted by reference symbol iii in FIG. 29C, and the switching devices 2903 and 2913 become on-conductive. The electric potentials of the sources of the TFTs 2902 and 2912 are Vx at this point. The voltages between the gate and the source of the TFTs 2902 and 2912 exceed the absolute values of their respective threshold values, the TFTs 2902 and 2912 are in an on state, and therefore electric current continues to flow. The drain electric potential of the TFT 2902 thus increases, and the drain electric potential of the TFT 2912 decreases. The voltage between the gate and the source of the TFT 2902, and the voltage between the gate and the source of the TFT 2912 soon become equal to their respective threshold values, and the TFTs 2902 and 2912 both turn off. At this point, the drain electric potentials of the TFTs 2902 and 2912 become Vx−|VthP| and Vx+|VthN|, respectively. That is, operations for adding the respective threshold values to the electric potential Vx of the input signal are performed by the TFTs 2902 and 2912. If the electric potentials of the gate electrodes of the TFTs 2902 and 2912 are taken as VG2902 and VG2912, respectively, then VG2902 and VG2912 take on electric potentials as shown in FIG. 29D in the above operations.

A predetermined electric potential is applied to TFT gate electrodes in order to supply electric current to EL devices through the TFTs, which have connections between their gates and drains like those shown by the reference numerals 2902 and 2912 in FIGS. 29A and 29B, for image signals input to the pixels by the source signal lines in the present invention. An electric potential difference equal to the TFT threshold value develops here between the source and the drain in the TFTs having connections between their gates and drains. An electric potential equal to the image signal, offset by the threshold value, is therefore applied to driver TFT gate electrodes.

Figure 29E:
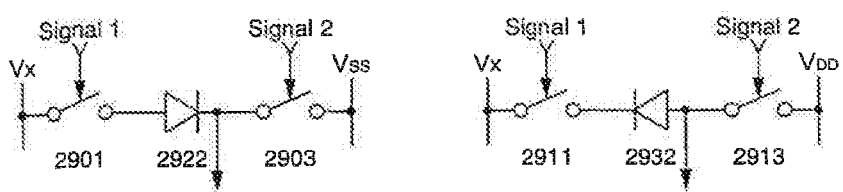

Note that diodes 2922 and 2932 may also be used for the TFTs 2902 and 2912, respectively, as shown in FIG. 29E.

Figure 29F:
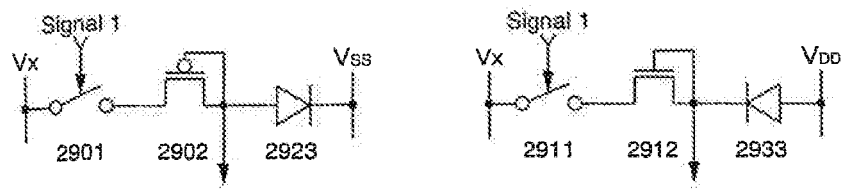

Further, diodes 2923 and 2933 may also be used for the TFTs 2903 and 2913, respectively, as shown in FIG. 29F. Behavior similar to VG2902 and VG2912 can also be achieved by changing the electric potentials to VDD or VSS by the operations of the section iii in FIG. 29C.

In addition to diodes having a normal PN junction, diode connected TFTs may also be used here for the diodes.

Furthermore, both the switching devices 2901 and 2911 may also be omitted. That is, the signal Vx may also be input to the first electrodes of the rectifying devices 2902 and 2912.

Methods have been discussed here with respect to the objectives of correcting dispersions in TFT threshold values of a light emitting device, and reducing dispersions in the brightness of EL devices, but the operating principle of the present invention is not limited to the correction of TFT threshold values in a light emitting device, and it is of course also possible to apply the present invention to other electronic circuits.

Structures of the present invention are described below.

EMBODIMENT MODES OF THE INVENTION

Embodiment Mode 1

Figure 1A:
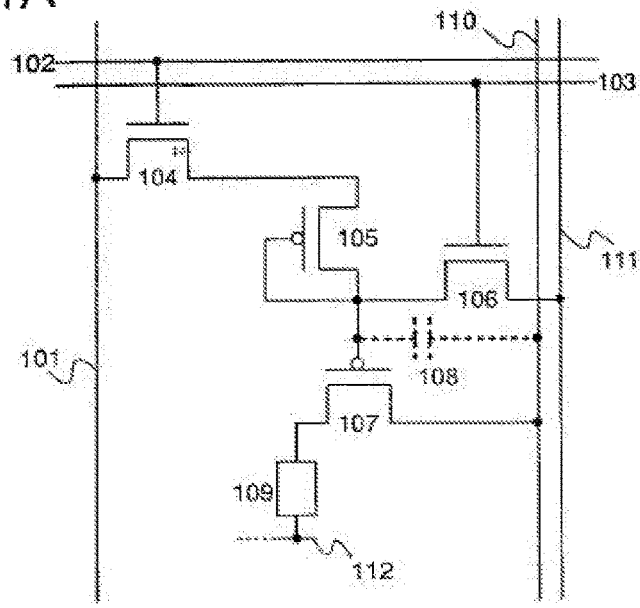
FIGS. 1A and 1B are diagrams showing an embodiment mode of the present invention.

FIG. 1A shows a first embodiment mode of the present invention. The embodiment mode has a source signal line 101, a first gate signal line 102, a second gate signal line 103, TFTs 104 to 107, an EL device 109, an electric current supply line 110, a reset electric power source line 111, and an electric power source line 112. In addition, a capacitive means 108 may also be formed in order to store an image signal.

A gate electrode of the TFT 104 is connected to the first gate signal line 102, a first electrode of the TFT 104 is connected to the source signal line 101, and a second electrode of the TFT 104 is connected to a first electrode of the TFT 105. A gate electrode and a second electrode of the TFT 105 are connected to each other, and are connected to a first electrode of the TFT 106 and a gate electrode of the TFT 107. A gate electrode of the TFT 106 is connected to the second gate signal line 103, and a second electrode of the TFT 106 is connected to the reset electric power source line 111. A first electrode of the TFT 107 is connected to the electric current supply line 110, and a second electrode of the TFT 107 is connected to a first electrode of the EL device 109. A second electrode of the EL device 109 is connected to the electric power source line 112, and there is a mutual electric potential difference between the electric power source line 112 and the electric current supply line 110. If the capacitive means 108 is formed, it may be formed between the gate electrode of the TFT 107 and a position at which a fixed electric potential can be obtained, such as the electric current supply line 110. Further, the capacitive means 108 may also be formed between the second electrode of the TFT 104 and the fixed electric potential such as the electric current supply line 110. Capacitive means may also be formed at both the locations if there is a desire to increase the value of the storage capacitance.

Figure 1B:
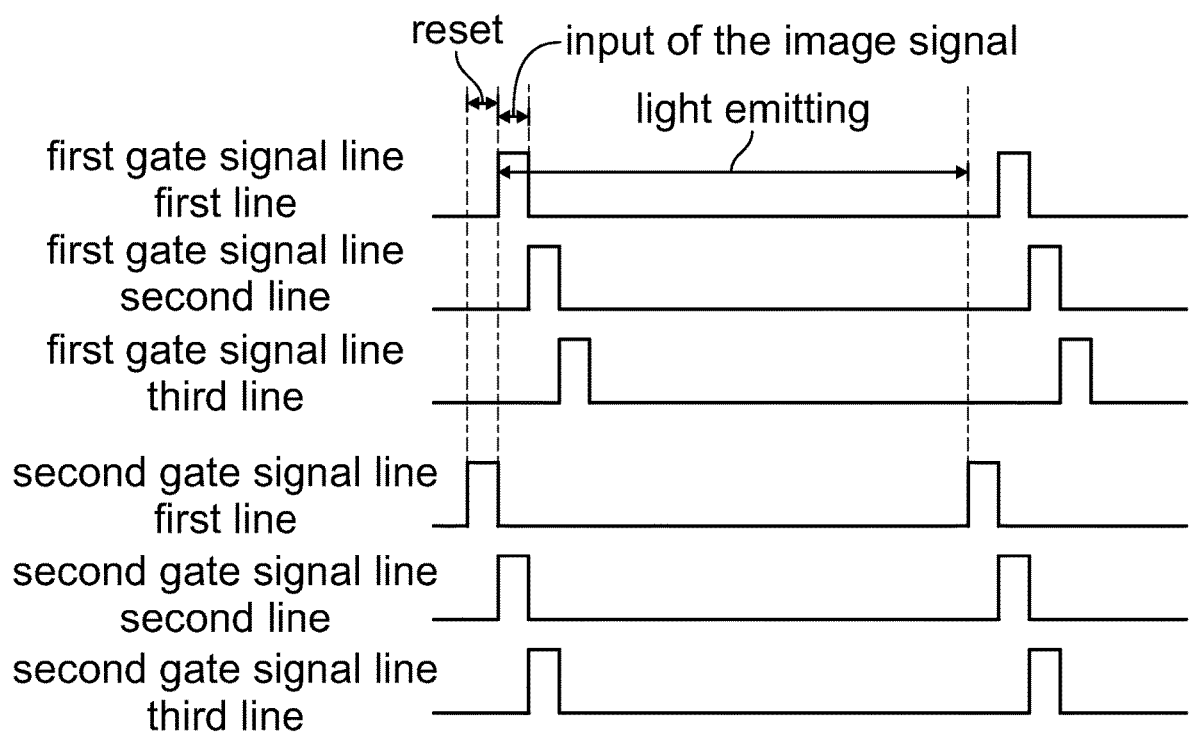

FIG. 1B shows the timing for pulses input to the first gate signal line and the second gate signal line. Operation is explained using FIG. 1B and FIG. 2. Note that a structure is used here in which the TFTs 104 and 106 are n-channel TFTs, and therefore the TFTs turn on when the electric potential of the gate signal line is H level, and the TFTs turn off when the electric potential of the gate signal line is L level. However, the TFTs 104 and 106 function as simple switching devices, and therefore any polarity may be used.

Figure 2A:
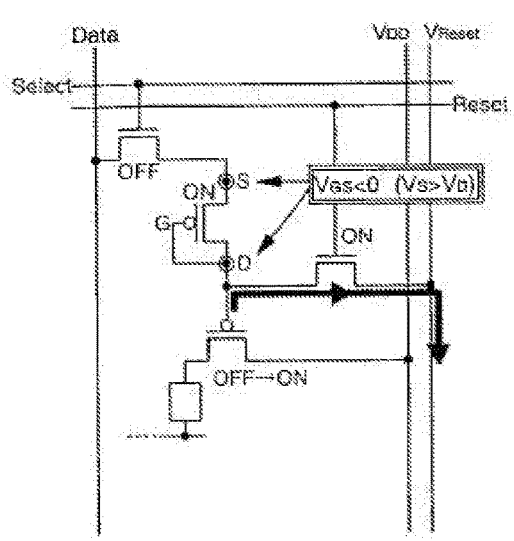
FIGS. 2A-2C are diagrams for explaining operations by the structure shown in FIG. 1.

With the electric potential of the source signal line 101 taken as VDD, the electric potential of the electric current supply line taken as VDD, and the electric potential of the reset electric power source line taken as VReset (<VDD−|Vth|), a gate G a source (S), a drain D of the TFT 105 are defined as shown in FIG. 2A. First, a pulse is input to the second gate signal line 103, and the TFT 106 turns on. The electric potential of the drain of the TFT 105 thus drops as shown in FIG. 2A, a voltage VGS between the gate and the source of the TFT 105 becomes less than zero, and in addition, exceeds the absolute value of the threshold value Vth, and the TFT 105 turns on. At the same time, the voltage between the gate and the source of the TFT 107 exceeds the absolute value of the threshold value, and the TFT 107 thus turns on.

Figure 2B:
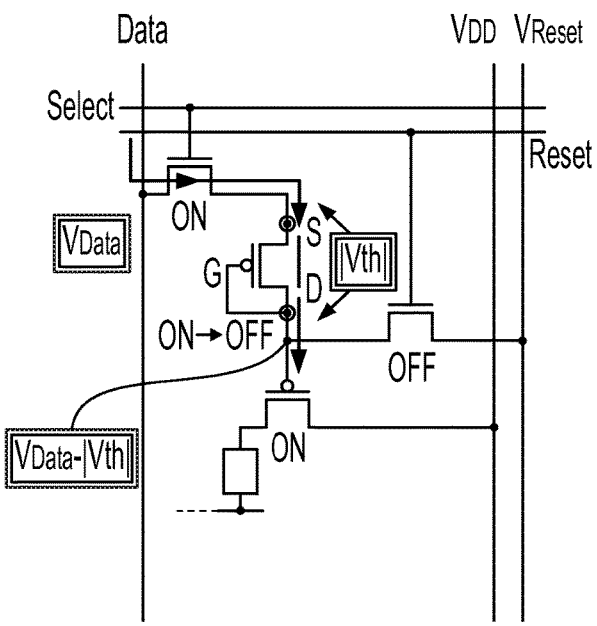

The TFT 106 then turns off, a pulse is input to the first gate signal line 102, and the TFT 104 turns on. An image signal is output to the source signal line here, the electric potential of the source signal line becomes VData (VReset<VData<VDD), and therefore the electric potential of the source of the TFT 105 increases to VData. The electric potential of the gate electrode of the TFT 107, that is the electric potential of the gate electrode of the TFT 105, also rises through the TFT 105. The voltage between the gate and the source of the TFT 105 becomes equal to the threshold value of the TFT 105 at the point where the electric potential becomes VData−|Vth|, and therefore the TFT 105 turns off. The electric potential of the gate electrode of the TFT 107, that is the electric potential of the gate electrode of the TFT 105, stops rising (FIG. 2B).

Figure 2C:
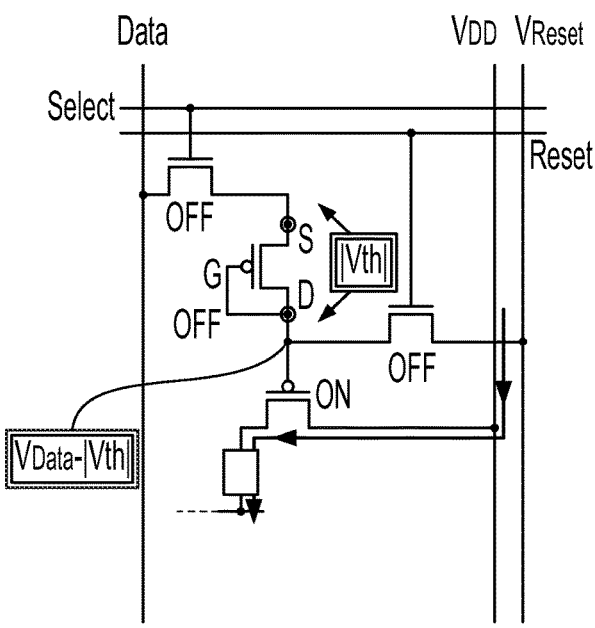

The TFT 104 then turns off, and operation transfers to a light emitting period. An electric potential obtained by adding the threshold value to a desired image signal electric potential, is applied to the gate electrode of the TFT 107 at this point, a proportional electric current flows from the electric current supply line 110, through the TFT 107, into the EL device 109 as shown in FIG. 2C, and the EL device 109 emits light. In practice, an electric potential exceeding the absolute value of the threshold value is applied to the gate electrode of the TFT 107 at the initialization stage of FIG. 2A, the TFT 107 turns on, and light is emitted at the maximum brightness. However, a period for selecting the first gate signal line and the second gate signal line is sufficiently short compared to the actual light emitting period. Light is emitted similarly for all cases, and therefore there is no influence on dispersions in the relative brightness.

Pixel control is performed by the aforementioned operations. A drain current IDS flowing in the TFT 107 at this point is expressed by Equation (8).

[Equation (8)]

$$I_{DS} = \frac{\beta}{2}(V_{GS} - V_{th})^2 \qquad (8)$$
$$= \frac{\beta}{2}\{(V_{Data} + V_{th} - V_{DD}) - V_{th}\}^2$$
$$= \frac{\beta}{2}\{V_{Data} - V_{DD}\}^2$$

Even supposing that dispersion in the TFT threshold values develops in pixels within a screen, this is offset provided that the threshold values of the TFTs structuring one pixel, specifically the TFTs 105 and 107, are equal. The drain current IDS no longer contains a threshold value term. That is, IDS can be determined irrespective of the threshold value, and influence caused by dispersion in the threshold values can be eliminated.

Embodiment Mode 2

A digital gray scale method for driving EL devices in only two states, a brightness of 100% and a brightness of 0%, by using a region in which TFT threshold values and the like do not easily influence on current, is proposed as a driving method that differs from the above analog gray scale method. Only two gray scales, white and black, can be expressed by this digital gray scale method, and therefore multiply gray scales are achieved by combining the digital gray scale method with a time gray scale method or the like.

Figure 21A:
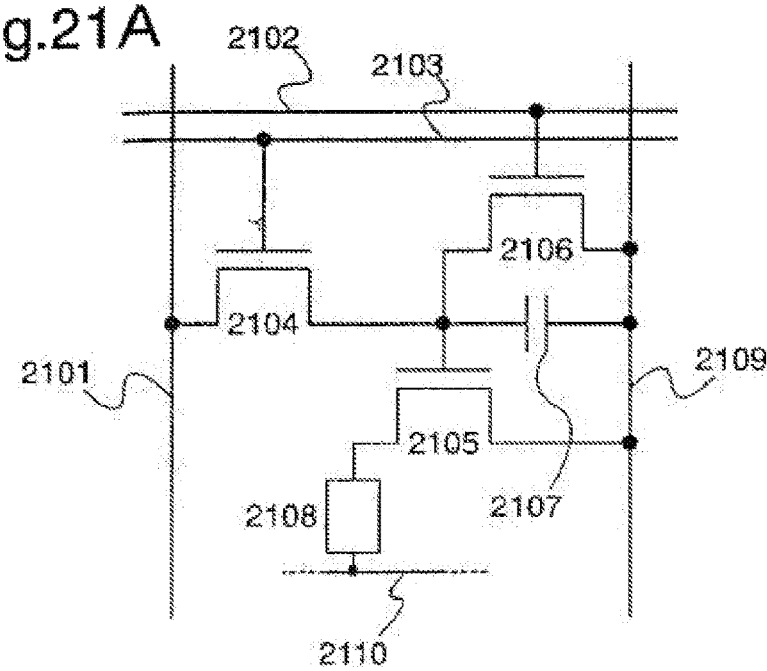
FIGS. 21A-21C are diagrams for explaining operation by a method of combining a digital gray scale method and a time gray scale method.

The structure of a pixel of a semiconductor device for a case of using a method in which a digital gray scale method and a time gray scale method are combined is shown in FIG. 21A. It becomes possible to finely control the length of a light emitting period by using an erasure TFT 2106 in addition to a switching TFT 2104 and a driver TFT 2105.

Figure 21B:
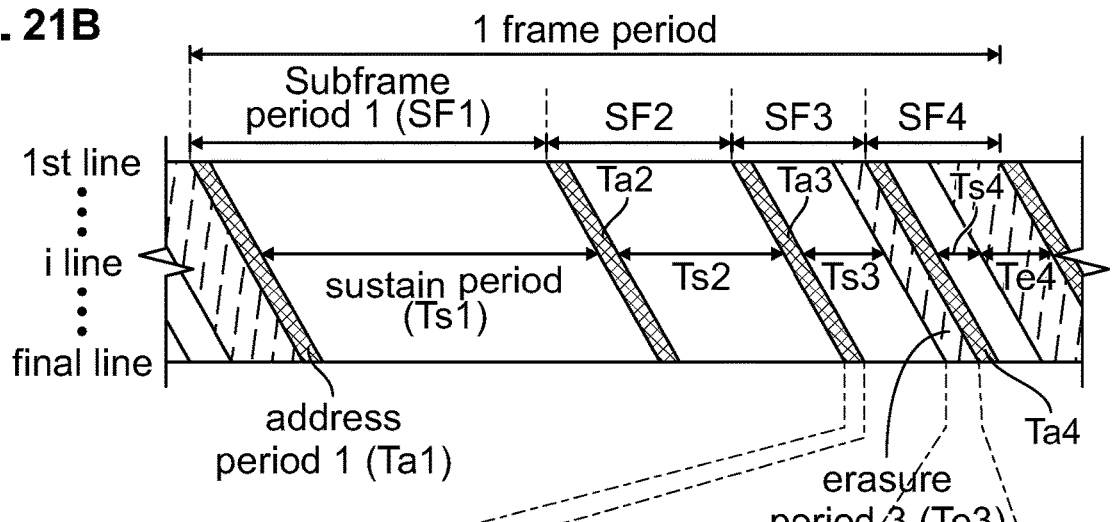

One frame period is divided into a plurality of subframe periods when a digital gray scale method and a time gray scale method are combined, as shown in FIG. 21B. Each subframe period has an address (write in) period, a sustain (light emitting) period, and an erasure period.

Figure 21C:
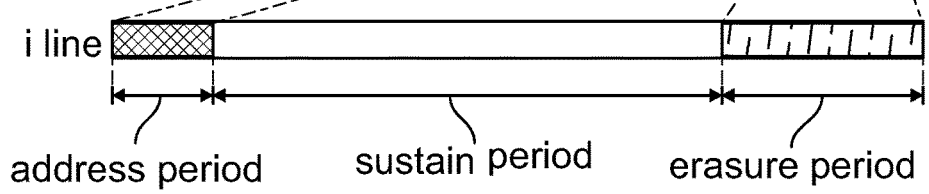

Subframe periods are formed corresponding to the number of display bits. The lengths of the sustain (light emitting) periods in each of the subframe periods are set to 2(n−1):2(n−2): . . . :2:1. A selection is made between light emission and non-light emission for EL devices in each of the sustain (light emitting) periods, and gray scale expression is performed by utilizing the difference in the lengths of the total period of time during which each of the EL devices emits light. Brightness becomes higher as the total light emission period becomes longer, and brightness becomes lower as the total light emission period becomes shorter. Note that a 4-bit gray scale example is shown in FIG. 21, wherein one frame period is divided into four subframe periods. A total of 2⁴=16 gray scales can be expressed by combining the sustain (light emitting) periods.

The lengths of the sustain periods of the less significant bits become short when realizing multiple gray scales by using a time gray scale method, and therefore an overlapping period develops if an address period begins immediately after the previous sustain (light emitting) period is complete, wherein the address (write in) periods of different subframe periods overlap. An image signal input to a certain pixel is also input to different pixels at the same time in this case, and therefore normal display becomes impossible. The erasure period is formed in order to resolve these kinds of problems, and is formed so that two different address (write in) periods do not overlap after sustain (light emitting) periods Ts3 and Ts4, as shown in FIG. 21B. The erasure periods therefore are not formed in subframe periods SF1 and SF2, which have sufficiently long sustain (light emitting) periods and no concern that two different address (write in) periods will overlap.

Figure 9A:
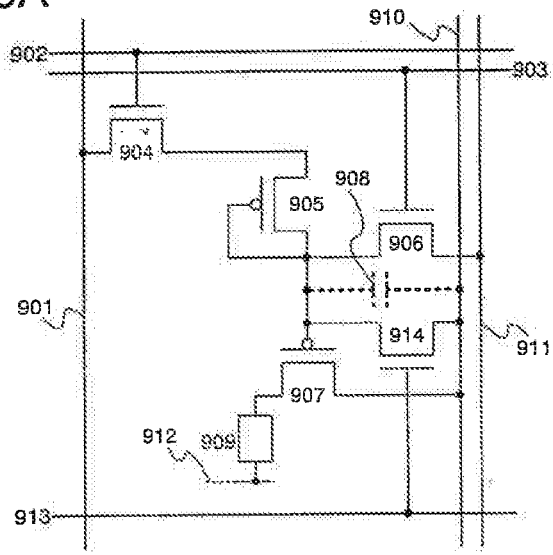
FIGS. 9A-9C are diagrams for explaining an embodiment mode of the present invention, and operation of the embodiment mode.

FIG. 9A is a diagram in which a third gate signal line 913 and an erasure TFT 914 are added to a pixel having the structure of Embodiment Mode 1, and a method of combining a digital gray scale method and a time gray scale method is used. A gate electrode of the erasure TFT 914 is connected to the third gate signal line 913, a first electrode of the erasure TFT 914 is connected to a gate electrode of a TFT 907, and a second electrode of the erasure TFT 914 is connected to an electric current supply line 910. Further, if a capacitive means 908 is formed in order to store an image signal, it may be formed between the gate electrode of the TFT 907 and a position at which a fixed electric potential can be obtained, such as the electric current supply line 910. The capacitive means 908 may also be formed between a second electrode of a TFT 904 and a fixed electric potential, such as the electric current supply line 910, and the capacitive means may also be formed at both locations if there is a desire to increase the value of the storage capacitance.

Initialization and image signal input operations are similar to those disclosed by Embodiment Mode 1. Note that the erasure TFT 914 is off during a period for performing initialization and image signal input.

Figure 11A:
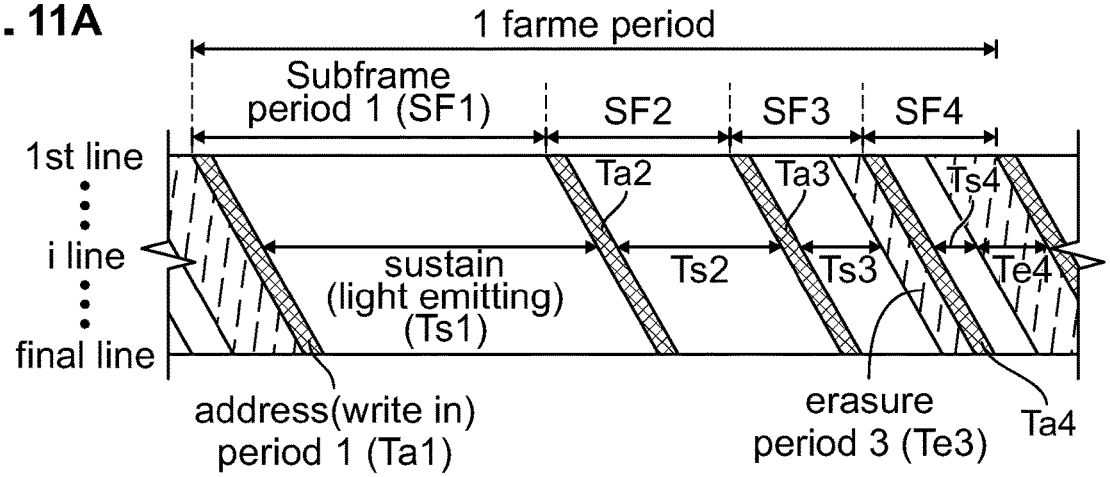
FIGS. 11A-11C are diagrams showing a timing for operations by the structure shown in FIG. 9.
Figure 11B:
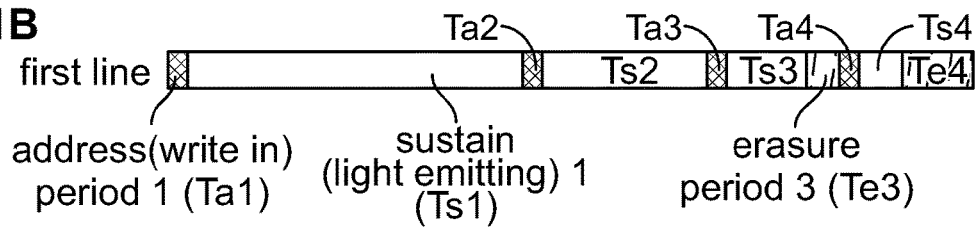

Operations from the sustain (light emitting) period to the erasure period are explained here using FIG. 9 and FIG. 11. FIG. 11A is a diagram similar to that of FIG. 21A, and one frame period has four subframe periods, as shown in FIG. 11B. Subframe periods SF3 and SF4, which have short sustain (light emitting) periods, have erasure periods Te3 and Te4, respectively. Operations during the subframe period SF3 are explained here as an example.

Figure 9B:
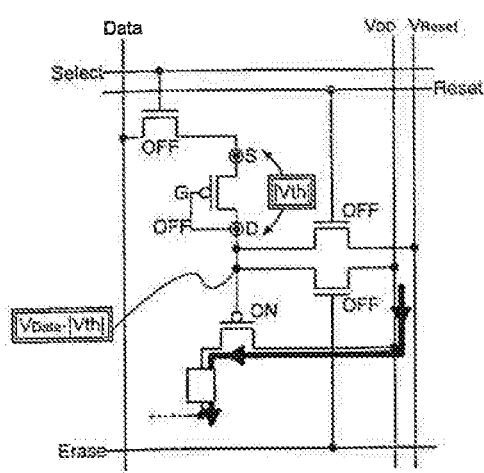
Figure 9C:
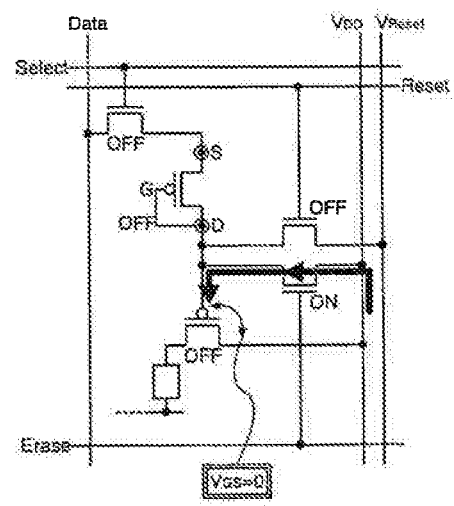

Electric current corresponding to the voltage between the gate and the source of the TFT 907 flows in an EL device 909 after image signal input is complete, as shown in FIG. 9B, and the EL device 909 emits light. A pulse is then input to the third gate signal line 913 when the timing for completion of the sustain (light emitting) period is reached, the erasure TFT 914 turns on, and the voltage between the gate and the source of the TFT 907 is set to zero, as shown in FIG. 9C. The TFT 907 therefore turns off, electric current flow to the EL device 909 is cutoff, and the EL device 909 is forcibly placed in a non-light emitting state.

Figure 11C:
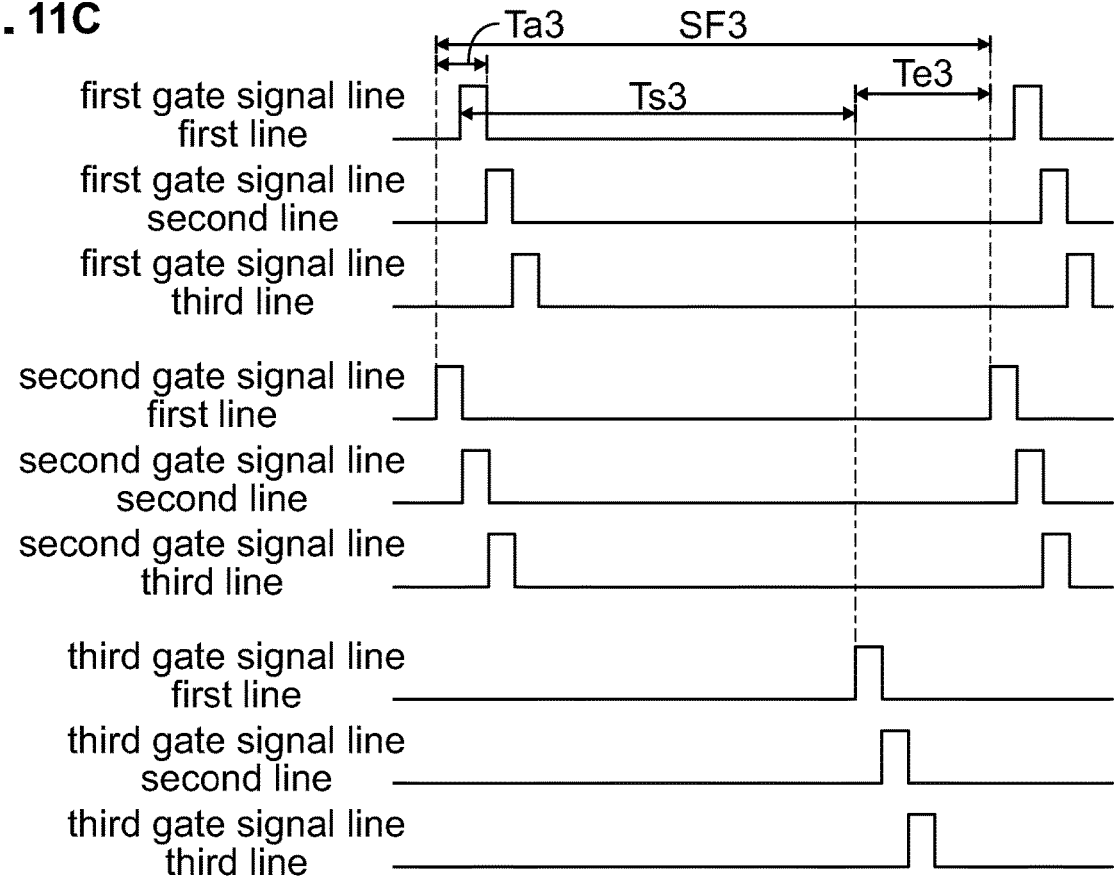

A timing chart for these operations is shown in FIG. 11C. A pulse is input to the third gate signal line 913 after the sustain (light emitting) period Ts3, the EL device 909 becomes in a non-light emitting state. Next, a pulse is input to the second gate signal line 903, and a period up through the beginning of initialization becomes the erasure period Te3.

The erasure TFT 914 used by Embodiment Mode 2 can also be used in combination with the structures of other embodiment modes.

Embodiment Mode 3

Figure 10A:
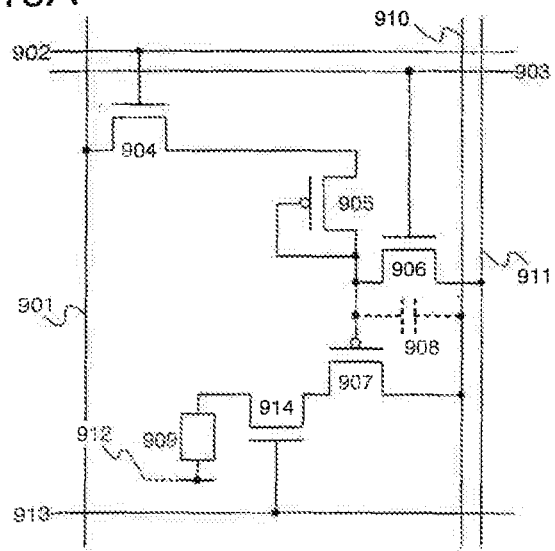
FIGS. 10A-10C are diagrams for explaining an embodiment mode of the present invention, and operation of the embodiment mode.

Operations in the erasure period in Embodiment Mode 2 cutoff the supply of electric current to the EL device 909 by setting the voltage between the gate and the source of the TFT 907 to zero, thus making the TFT 907 turn off. An example using another method is shown in FIG. 10A. The erasure TFT 914 is formed between the gate electrode of the TFT 907 and the electric current supply line 910 in Embodiment Mode 2, but in Embodiment Mode 3 the erasure TFT 914 is formed between the TFT 907 and the EL device 909.

Initialization and image signal input operations are similar to those of Embodiment Mode 1. The erasure TFT 914 is on only during the sustain (light emitting) period. The erasure TFT 914 is off during initialization, image signal input, and the erasure period, and electric current to the EL device 909 is thus cutoff.

Figure 12A:
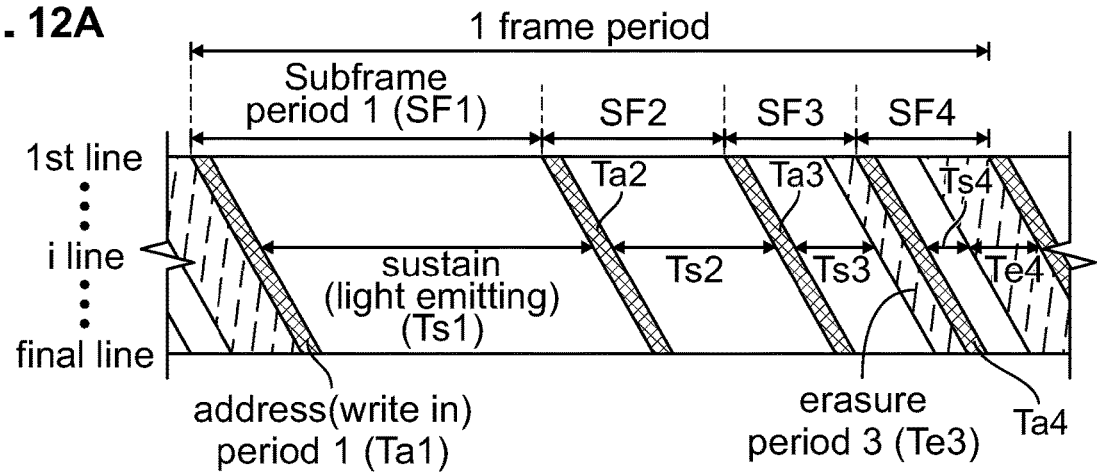
FIGS. 12A-12C are diagrams showing a timing for operations by the structure shown in FIG. 10.
Figure 12B:
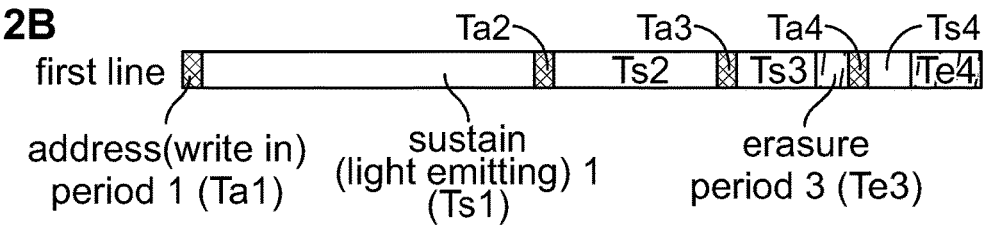
Figure 12C:
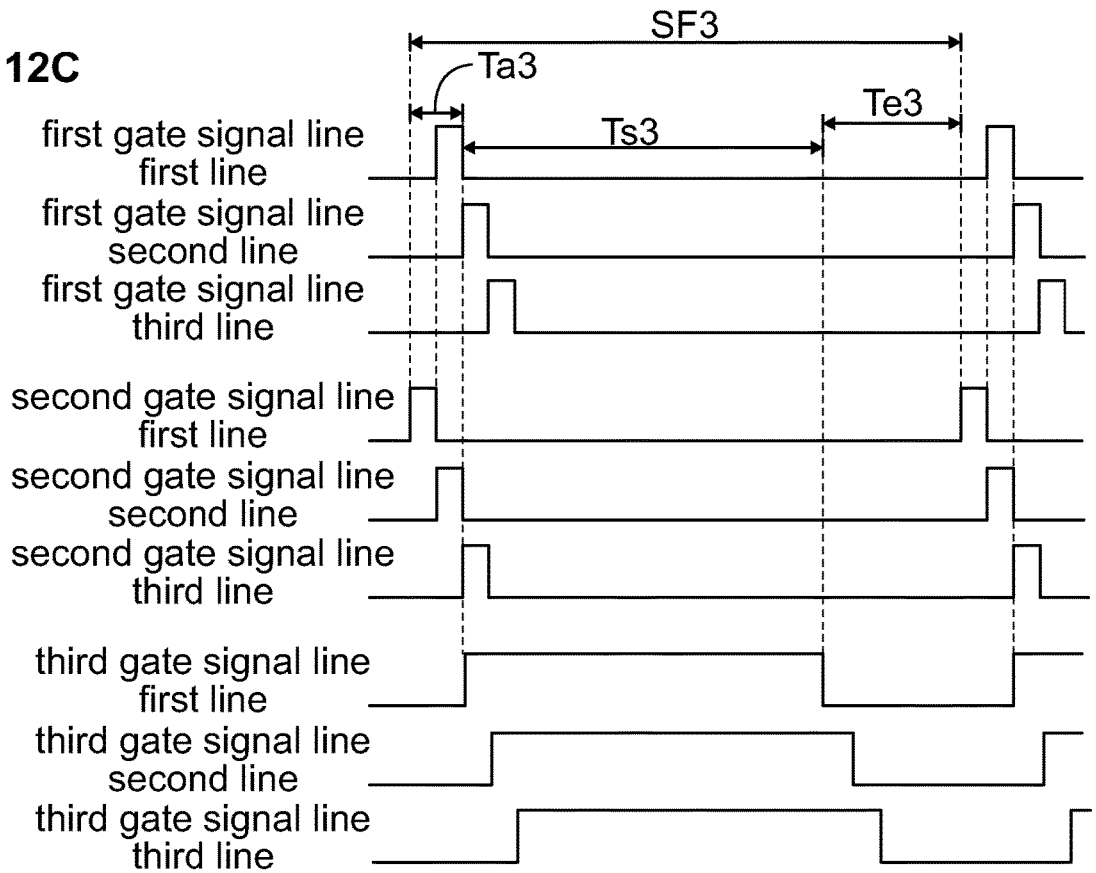

Differences with Embodiment Mode 2 from an operational perspective are discussed. If the erasure TFT 914 once turns on and the voltage between the gate and the source of the TFT 907 is set to zero, the EL device 909 thereafter does not emit light in Embodiment Mode 2, and a short pulse may therefore be input at the start of the erasure period, as shown in FIG. 11. In Embodiment Mode 3, however, it is necessary for the erasure TFT to be on throughout the sustain period, and therefore a pulse having the same length as the sustain (light emitting) period is input to the third gate signal line 913, as shown in FIG. 12.

Figure 28A:
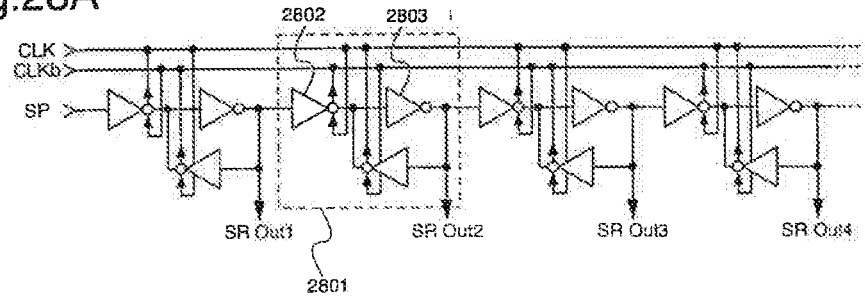
FIGS. 28A and 28B are diagrams showing examples of pulse width adjustments by a general shift register using D-FF.
Figure 28B:
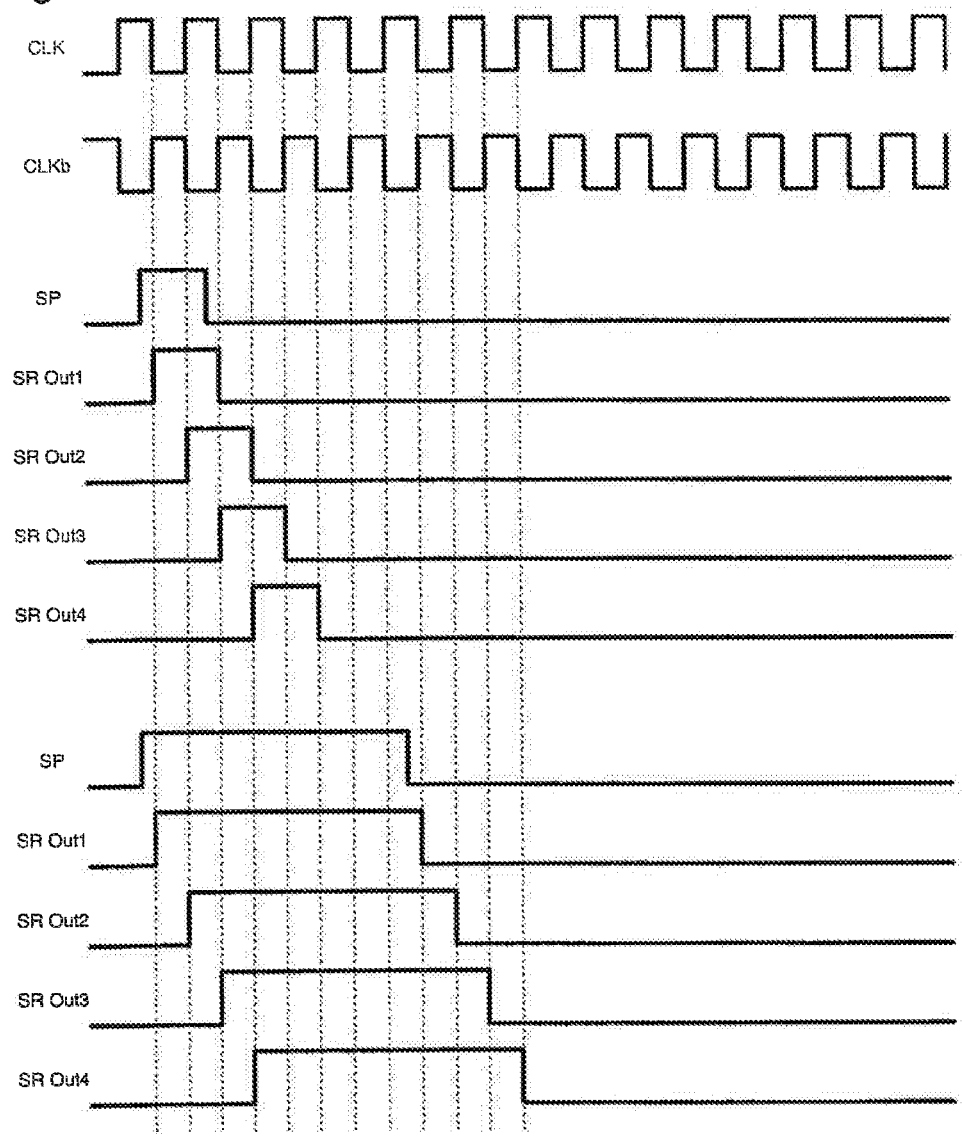

A specialized circuit is not necessary in order to generate this type of pulse. The length of an output pulse may be changed to be thereby generated as shown in FIG. 28B by changing the length of a start pulse input from the outside by using a shift register composed of a plurality of stages of D-flip flop circuits 2801 made from a clocked inverter 2802, an inverter 2803, and the like, as shown in FIG. 28A. Fine adjustments in order to conform it to the sustain (light emitting) period can easily be performed by using a pulse width adjuster circuit or the like.

Figure 10B:
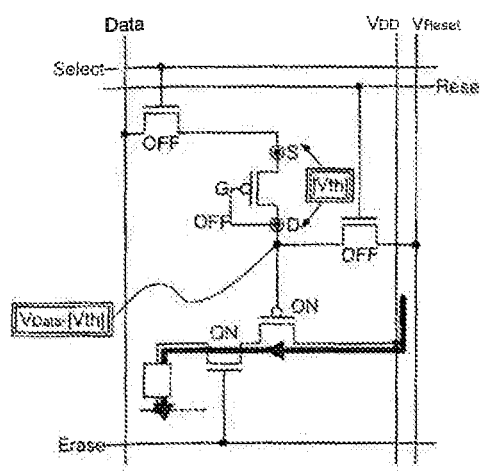
Figure 10C:
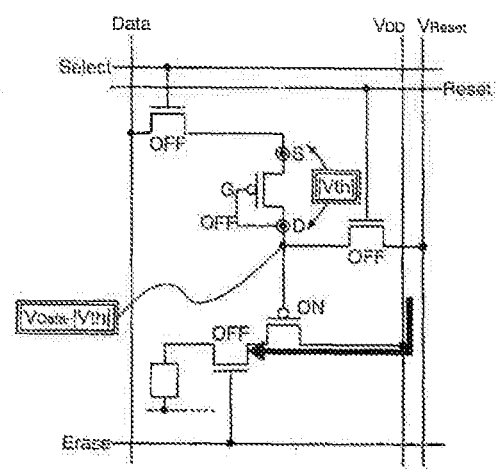

Note that, although the erasure TFT 914 uses an n-channel TFT in FIG. 9 and FIG. 10, and therefore turns on when the third gate signal line is H level and turns off when the third gate signal line is L level, there are no particular limitations placed on the polarity of the erasure TFT 914.

The erasure TFT 914 used by Embodiment Mode 3 can also be used in combination with the structures of other embodiment modes.

Embodiment Mode 4

Signal lines and electric power source lines used for driving one pixel in the structure disclosed in Embodiment Mode 1 are a source signal line, a first gate signal line, a second gate signal line, an electric current supply line, and a reset electric power source line. In Embodiment Modes 2 and 3, erasure TFT control is performed using an additional third gate signal line. It is clear that the surface area occupied by wirings in a pixel portion is large, even compared to the conventional structure shown in FIG. 20 and the structure having an erasure TFT shown in FIG. 21.

Figure 16A:
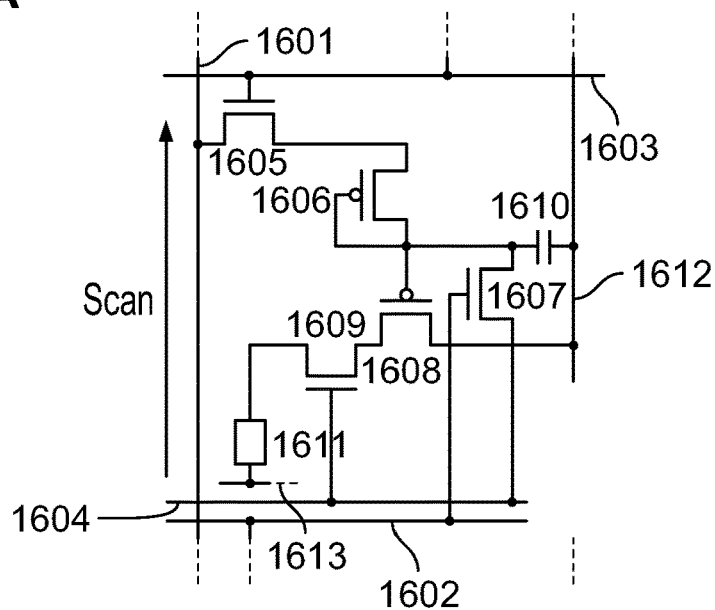
FIGS. 16A and 16B are diagrams for explaining an embodiment mode of the present invention, and operation of the embodiment mode.
Figure 16B:
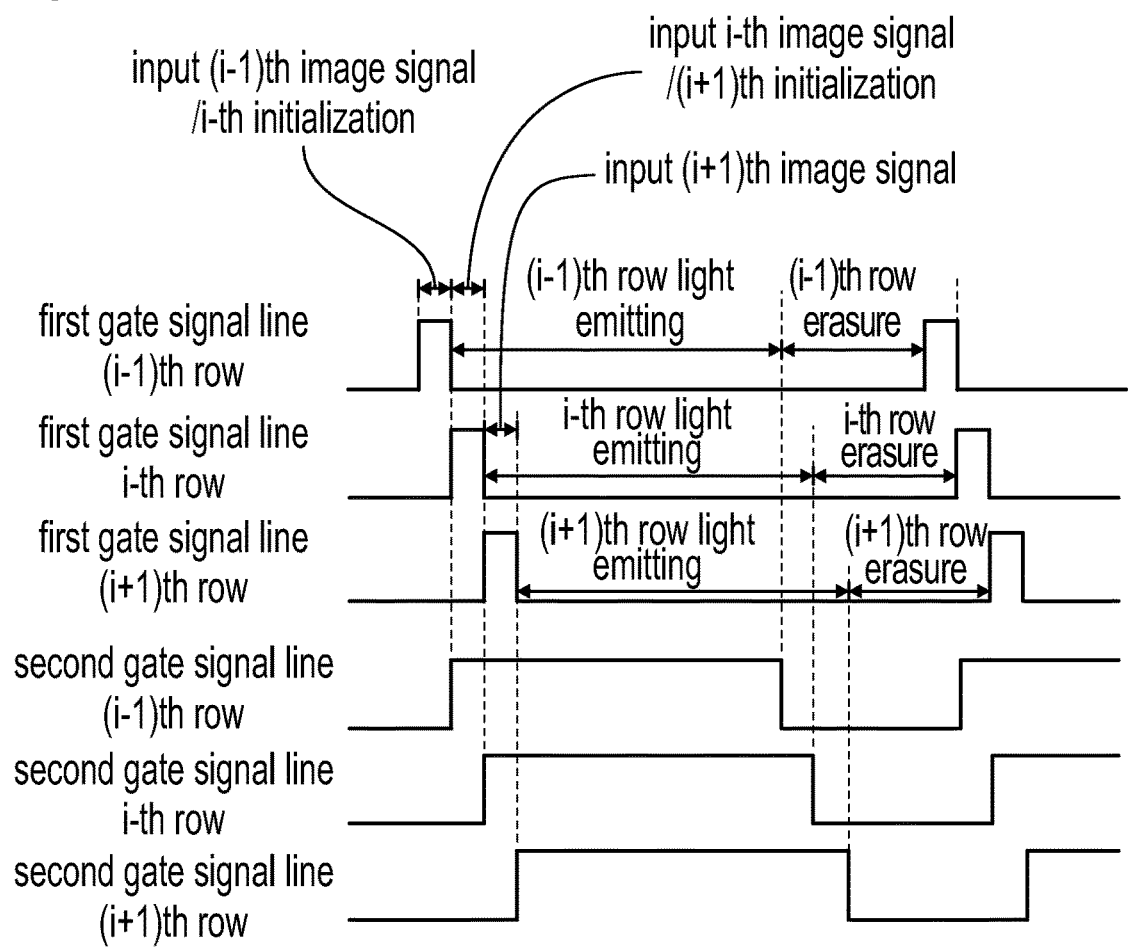

A pixel having the structure shown in FIG. 16 is used in Embodiment Mode 4. The structure has a source signal line 1601, a first gate signal line 1603, a second gate signal line 1604, TFTs 1605 to 1609, a capacitive means 1610, an EL device 1611, and electric current supply line 1612, and the like as shown in FIG. 16A. The number of wirings per single pixel is four.

A structure is explained in which the pixel shown in FIG. 16A is anti-throw pixel. A gate electrode of the TFT 1605 is connected to the first gate signal line 1603 of an i-th row, a first electrode of the TFT 1605 is connected to the source signal line 1601, and a second electrode of the TFT 1605 is connected to a first electrode of the TFT 1606. A gate electrode and a second electrode of the TFT 1606 are connected to each other, and connected to a first electrode of the TFT 1607 and a gate electrode of the TFT 1608. A gate electrode of the TFT 1607 is connected to the gate signal line

1602 of an (i−1)th row, and a second electrode of the TFT 1607 is connected to the second gate signal line. A first electrode of the TFT 1608 is connected to the electric current supply line 1612, and a second electrode of the TFT 1608 is connected to a first electrode of the TFT 1609. A gate electrode of the TFT 1609 is connected to the second gate signal line 1604 of the i-th row, and a second electrode of the TFT 1609 is connected to a first electrode of the EL device 1611. A second electrode of the EL device 1611 is connected to the electric power source line 1613, which has a mutual electric potential difference with the electric current supply line 1612. The capacitive means 1610 is connected between a node containing the gate electrode of the TFT 1608 and the electric current supply line 1612. The capacitive means 1610 stores an electric potential applied to the gate electrode of the TFT 1608 during the sustain (light emitting) period.

Operation is explained using FIG. 16 and FIG. 17. Note that the TFTs 1605, 1607, and 1609 use n-channel TFTs in the example explained here, and therefore turn on when an H level pulse is input to their gate electrodes, and turn off when an L level pulse is input thereto. The reason that an n-channel TFT is used for the TFT 1609 here is that it is necessary for the second gate signal line of the i-th row to be L level when the TFT 1607 is on and initialization is performed, and that it is necessary for the TFT 1609 to be off at this time.

Figure 17A:
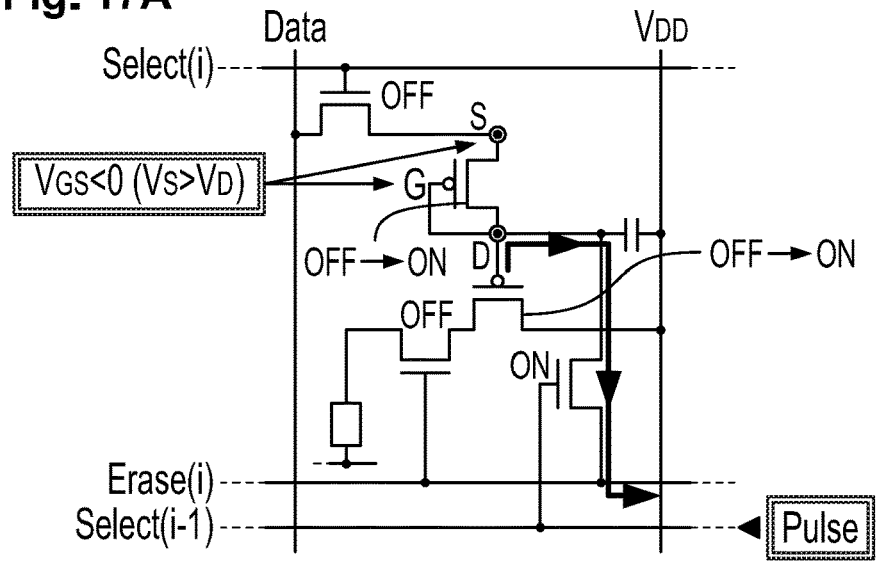
FIGS. 17A-17C are diagrams for explaining operations by the structure shown in FIG. 16.
Figure 17B:
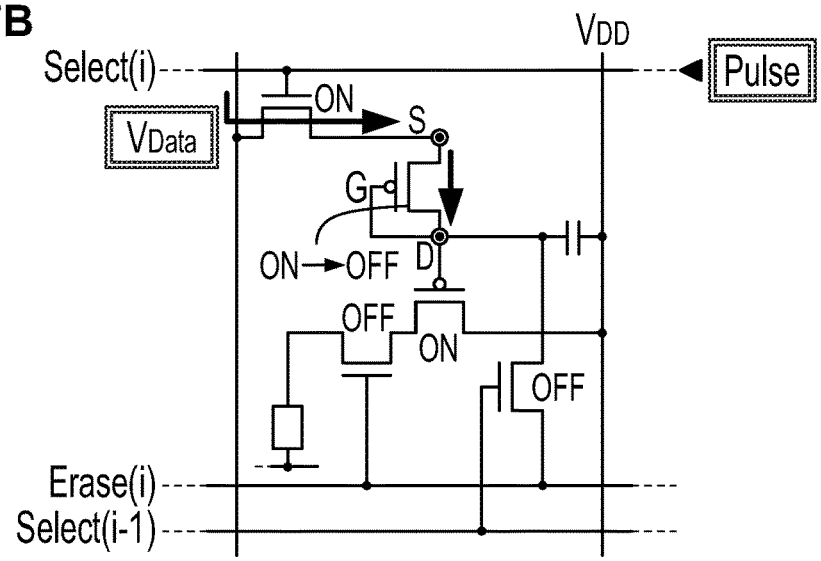

With the electric potential of the source signal line 1601 taken as VDD, the electric potential of the electric current supply line taken as VDD, and the electric potential when a gate signal line is L level taken as VReset (<VDD−|Vth|), a gate G a source (S), a drain D of the TFT 1606 are defined as shown in FIG. 17A.

The TFT 1607 turns on when the first gate signal line 1602 of the (i−1)th row is selected, that is when image signal input into the (i−1)th row is performed, and the TFT 1607 in the i-th row of pixels turns on. The second gate signal line 1604 of the i-th row is L level at this point, and therefore the electric potential of the gate electrode of the TFT 1608 drops as shown in FIG. 17A. The electric potential of the gate electrode of the TFT 1608 is thus initialized.

The first gate signal line 1602 of the (i−1)th row becomes L level when image signal input in the (i−1)th row is complete, and the TFT 1607 turns off. On the other hand, the first gate signal line 1603 of the i-th row is selected, the TFT 1605 turns on, and the image signal is input to the i-th row. The voltage between the source and the drain of the TFT 1606 becomes equal to Vth when the electric potential of the image signal is VData (where VData+Vth<VDD), and the electric potential of the gate electrode of the TFT 1608 becomes (VData−Vth). Initialization is performed at this point in an (i+1)th row, similar to that discussed above (FIG. 17B).

Figure 17C:
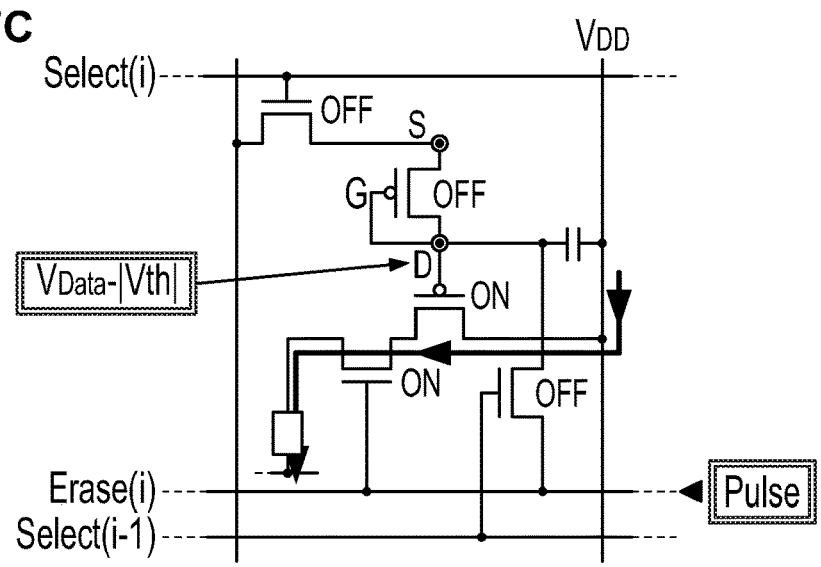

The image signal input is complete, and the i-th row moves to the sustain (light emitting) period. An H level pulse is input to the second gate signal line 1604 of the i-th row, the TFT 1609 turns on, and electric current corresponding to the voltage between the gate and the source of the TFT 1608 flows in the EL device as shown in FIG. 17C. The EL device thus emits light.

Embodiment Mode 4 is characterized in that in order to perform initialization of a certain row, it utilizes the selection pulse of the gate signal line of the previous row in controlling the TFT 1607, and that it utilizes non-selected gate signal lines that are left at a fixed electric potential as reset electric power source lines. The number of signal lines can be kept to a minimum and a high aperture ration can be obtained by using this type of structure, and a structure that performs operations similar to those of Embodiment Mode 2 can be achieved.

Note that, although the second electrode of the TFT 1607 is connected to the second gate signal line 1604, it may also be connected to other signal lines, provided that the other signal lines become L level at the same timing as the TFT 1607 turns on. Further, although the TFT 1607 is controlled by the first gate signal line of the (i−1)th row, it may also be controlled by other rows, provided that they are rows before the i-th row.

Embodiment Mode 5

Figure 18A:
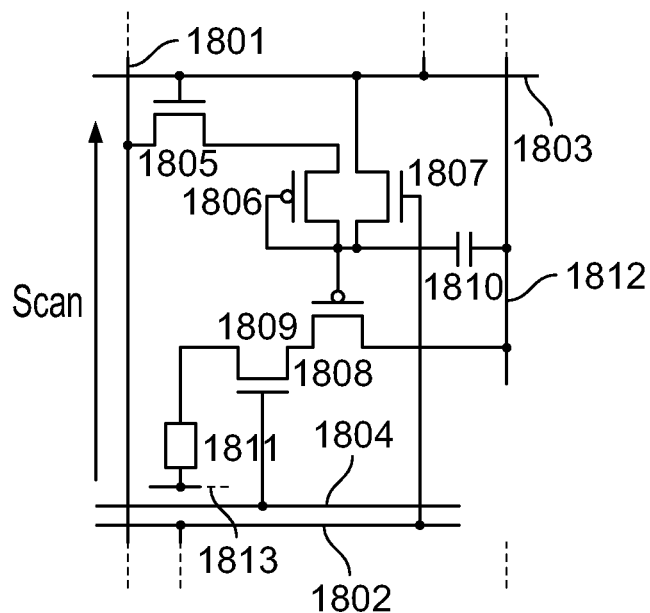
FIGS. 18A and 18B are diagrams for explaining an embodiment mode of the present invention, and operation of the embodiment mode.
Figure 18B:
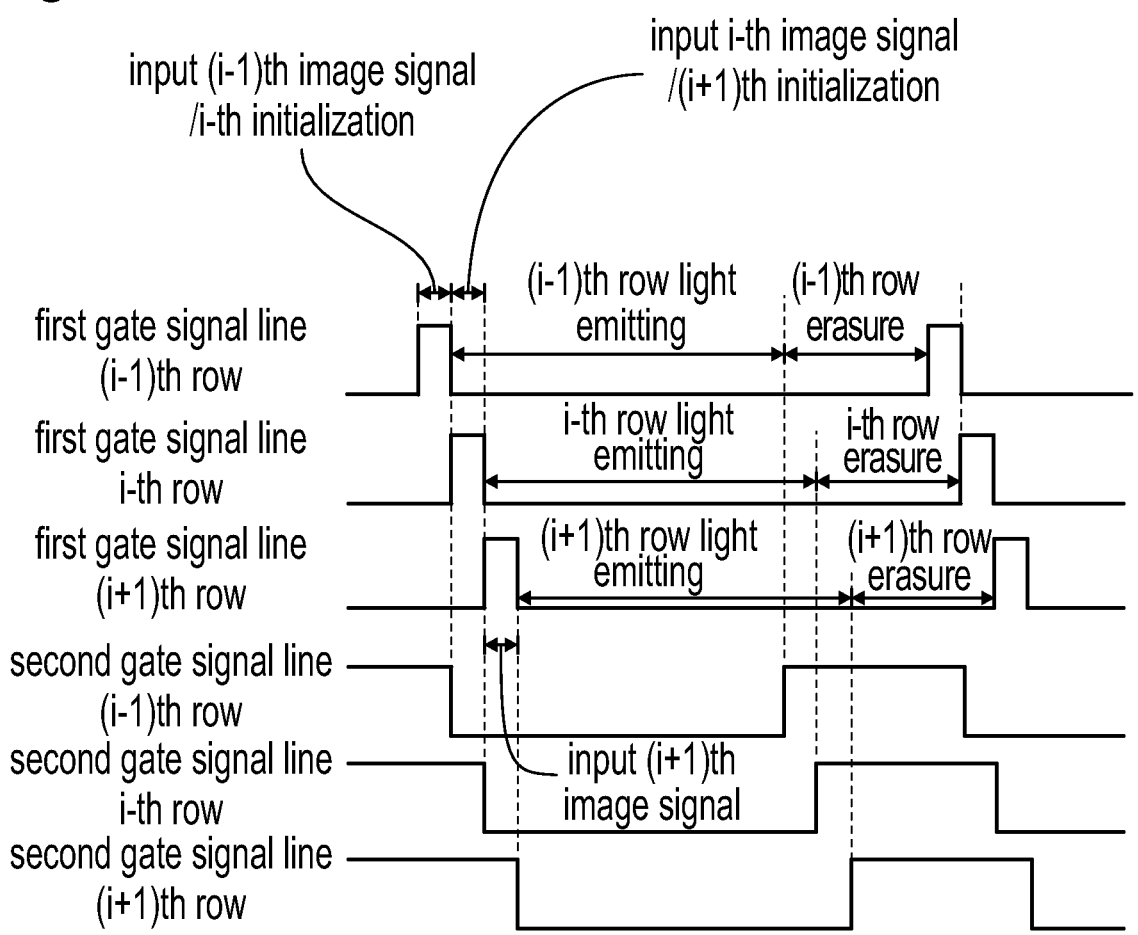

The TFT 1609 is n-channel in Embodiment Mode 4, and the reason is that one terminal of the TFT 1607 used in initialization, the source or the drain, is connected to the second gate signal line 1604 of the i-th row, as discussed above. In order to increase the aperture ratio within a pixel, and to reduce the tendency for dispersion in TFT characteristics to develop, it is preferable that the TFTs be disposed together as close as possible. A structure is therefore used in which a TFT 1809 is p-channel and capable of being disposed in very close proximity to a TFT 1808, as shown in FIG. 18A.

A portion of the connections of a TFT 1807 used in initialization are changed. A gate electrode of the TFT 1807 is connected to the first gate signal line of the (i−1)th row, and a first electrode of the TFT 1807 is connected to a gate electrode of the TFT 1808. This is because the TFT 1807 must be on during initialization, and the electric potential of the gate electrode of the TFT 1808 must drop. It is therefore necessary that the location to which one terminal, the source or the drain, of the TFT 1807 is connected become L level during this period. By making the TFT 1809 p-channel, the electric potential of a second gate signal line 1804 of the i-th row is H level during the period for performing initialization of the i-th row of pixels, and therefore cannot be used. The connecting point is therefore changed to a first gate signal line 1802 of the i-th row.

Figure 19A:
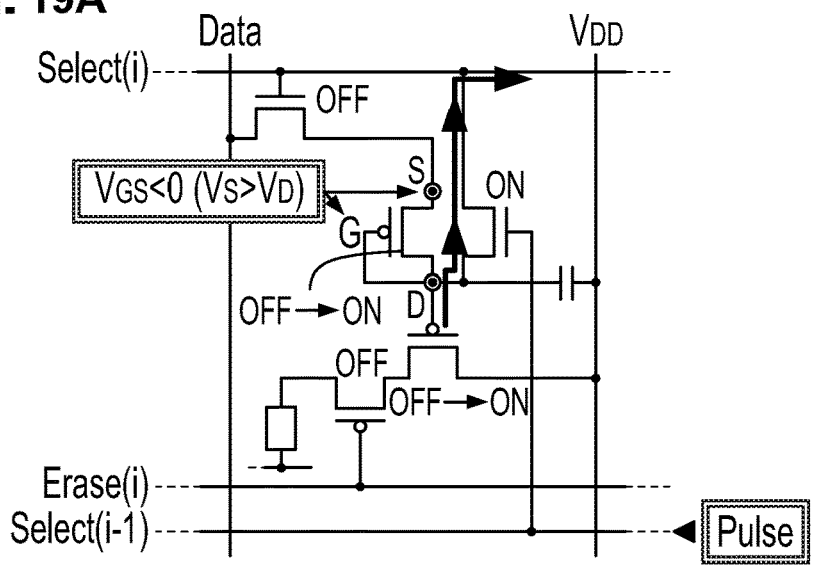
FIGS. 19A-19C are diagrams for explaining operations by the structure shown in FIG. 18.
Figure 19B:
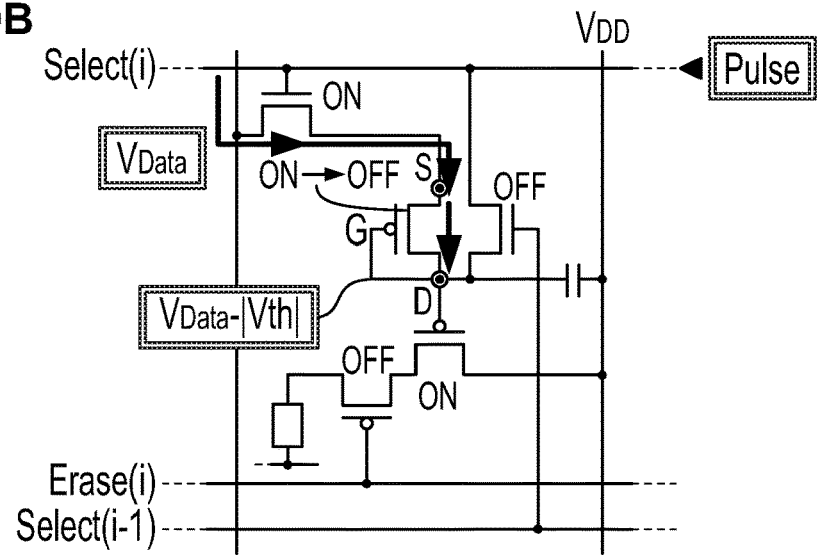
Figure 19C:
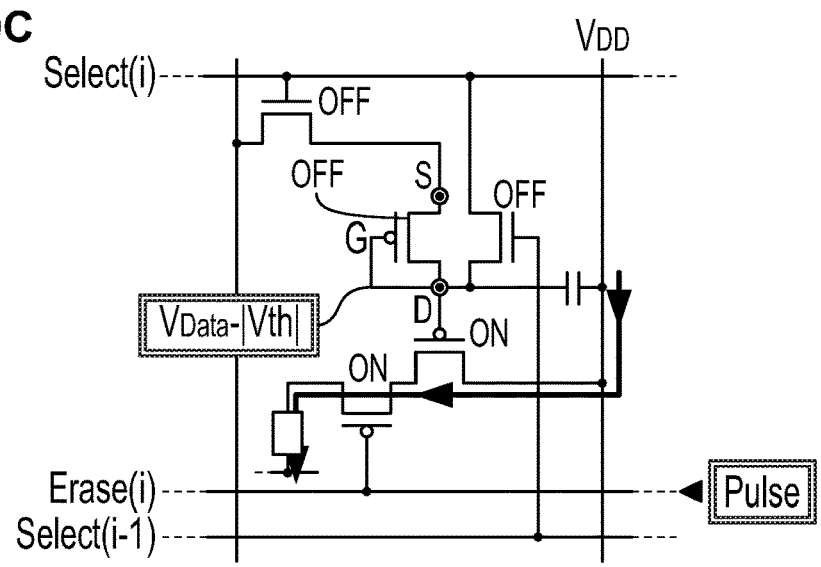

Circuit operation is shown in FIGS. 19A to 19C. However, operation is similar to that of Embodiment Mode 4, except for the point that the H level and L level electric potentials of the second gate signal line 1804 of the i-th row are reversed, and therefore a detailed explanation is omitted here. By turning on and off, the TFT 1809 is used as a switching device for selecting whether an electric current supply path to an EL device is conductive or non-conductive, and therefore any polarity may be used for its operation. Suitable selections may therefore be made for Embodiment Mode 4 and Embodiment Mode 5 depending upon factors such as the actual circuit layout.

Note that, although the second electrode of the TFT 1807 is connected to the second gate signal line 1803, it may also be connected to other signal lines, provided that the other signal lines become L level at the same timing as the TFT 1807 turns on. Further, although the TFT 1807 is controlled by the first gate signal line of the (i−1)th row, it may also be controlled by other rows, provided that they are rows before the i-th row.

Embodiment Mode 6

Figure 3A:
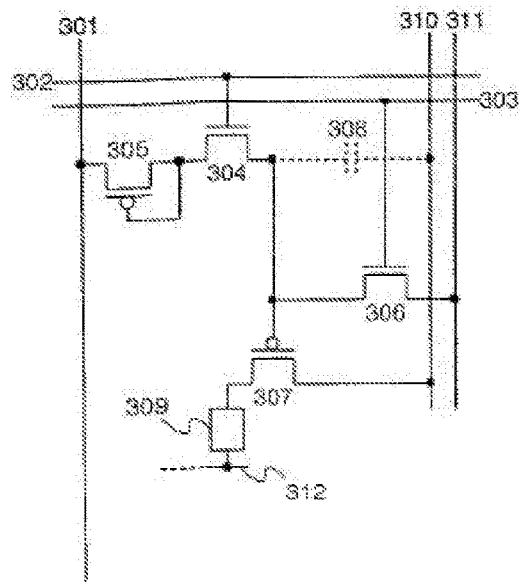
FIGS. 3A-3D are diagrams for explaining an embodiment mode of the present invention, and operation of the embodiment mode.

A structure in which a portion of the connections in the structure disclosed by Embodiment Mode 1 is changed is shown in FIG. 3A. The TFT 105, which has a connection between its gate and drain, is formed between the second electrode of the TFT 104 and the gate electrode of the TFT 107 in Embodiment Mode 1, as shown in FIG. 1. In Embodiment Mode 6, however, a TFT 305, which has a connection between its gate and drain, is formed between a source signal line 301 and a first electrode of a TFT 304. Further, if a capacitive means 308 or the like is formed in order to store an image signal, then it may be formed between a second electrode of the TFT 304 and a fixed electric potential, such as an electric current supply line 310.

Figure 3B:
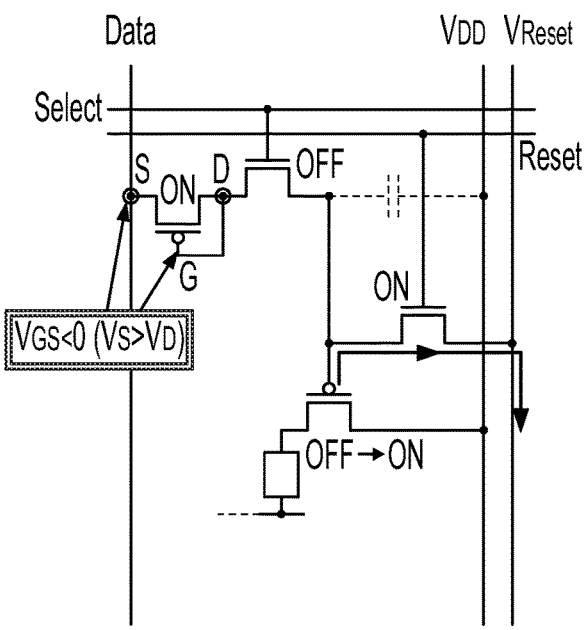
Figure 3C:
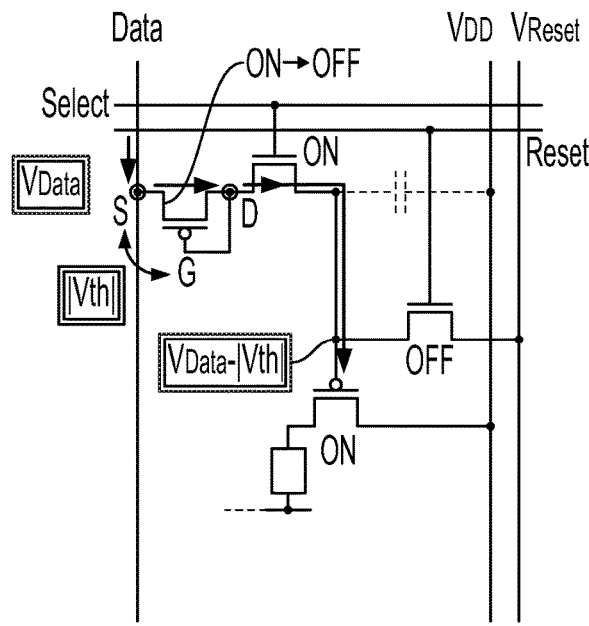
Figure 3D:
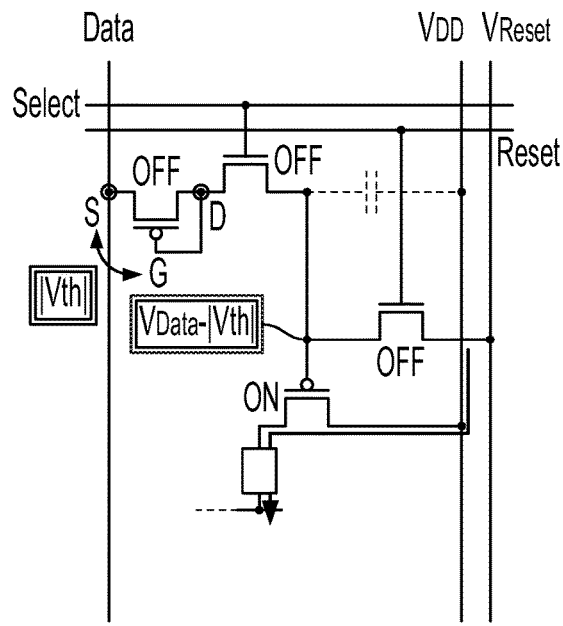

Operation is explained using FIG. 3B to 3D. Note that a structure is used here in which the TFTs 304 and 306 are n-channel TFTs, and therefore the TFTs turn on when the electric potential of the gate signal line is H level, and the TFTs turn off when the electric potential of the gate signal line is L level. However, the TFTs 304 and 306 function as simple switching devices, and therefore any polarity may be used.

With the electric potential of the source signal line 301 taken as VDD, the electric potential of the electric current supply line taken as VDD, and the electric potential of a reset electric power source line taken as VReset (<VDD−|Vth|), a gate G a source (S), the drain D of the TFT 305 are defined as shown in FIG. 3B.

First, a pulse is input to a second gate signal line 303, and a TFT 306 turns on. The pulse is input to a first gate signal line 302 during the period in which the TFT 306 is on, and the TFT 304 turns on. The electric potential of the drain of the TFT 305 thus drops as shown in FIG. 3B, and a voltage VGS between the gate and the source of the TFT 305 becomes less than zero, and in addition, exceeds the absolute value of the threshold value Vth, and the TFT 305 turns on. The TFT 306 is quickly turned off at the instant that the TFT 305 turns on when performing the aforementioned operations. If a state in which both of the TFTs 305 and 306 are turned on continues for a long time, then an electric current path soon develops between the source signal line 301 and the reset electric power source line 311, and there are cases in which electric potential of a gate electrode of a TFT 307 does not become lower. At the same time, the voltage between the gate and the source of the TFT 307 exceeds the absolute value of the threshold value, and the TFT 307 turns on.

Input of an image signal is then performed. An image signal is output to the source signal line 301, and the electric potential of the source signal line becomes VData (VReset<VData<VDD), and therefore the electric potential of the source of the TFT 305 increases to VData. Then, the electric potential of the gate electrode of the TFT 307 also rises through the TFTs 305 and 304. The voltage between the gate and the source of the TFT 305 becomes equal to the threshold value of the TFT 307 at the point where the electric potential becomes VData−|Vth|, and therefore the TFT 305 turns off. The electric potential of the gate electrode of the TFT 307 stops rising (FIG. 3C).

Operation then passes to the light emitting period. Light emission begins at the point where the TFT 307 turns on, but electric current corresponding to the image signal first flows from the electric current supply line 310, through the TFT 307, and into the EL device 309, after the image signal is input and the electric potential of the gate of the TFT 307 becomes (VData−Vth). The EL device 309 then emits light.

Embodiment Mode 7

Figure 4A:
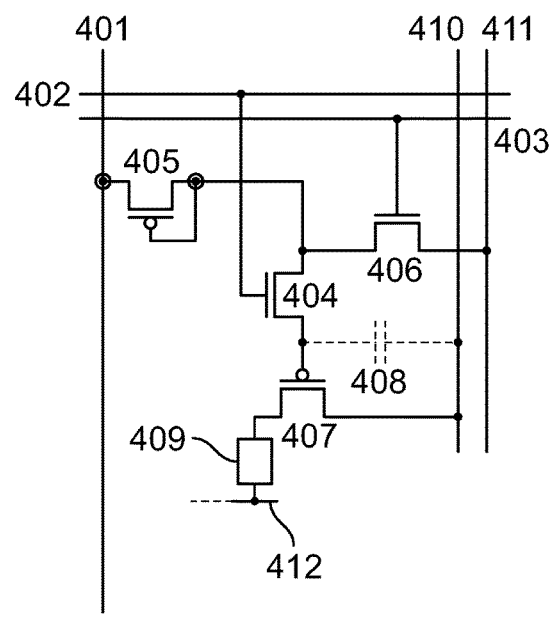
FIGS. 4A-4D are diagrams for explaining an embodiment mode of the present invention, and operation of the embodiment mode.

A structure in which a portion of the connections in the structure disclosed by Embodiment Mode 6 is changed is shown in FIG. 4A. The TFT 304 is formed between the second electrode of the TFT 305 and the first electrode of the TFT 306 in Embodiment Mode 6, as shown in FIG. 3A. In Embodiment Mode 7, however, a TFT 404 is formed between a first electrode of a TFT 406 and a gate electrode of a TFT 407. Further, if a capacitive means 408 is formed in order to store an image signal, then it may be formed between the gate electrode of the TFT 407 and a portion where a fixed electric potential is obtained, such as an electric current supply line 410. Further, the capacitive means 408 may also be formed between the second electrode of the TFT 405 and a fixed electric potential such as the electric current supply line 410. Capacitive means may also be formed at both locations if there is a desire to increase the value of the storage capacitance.

Figure 4B:
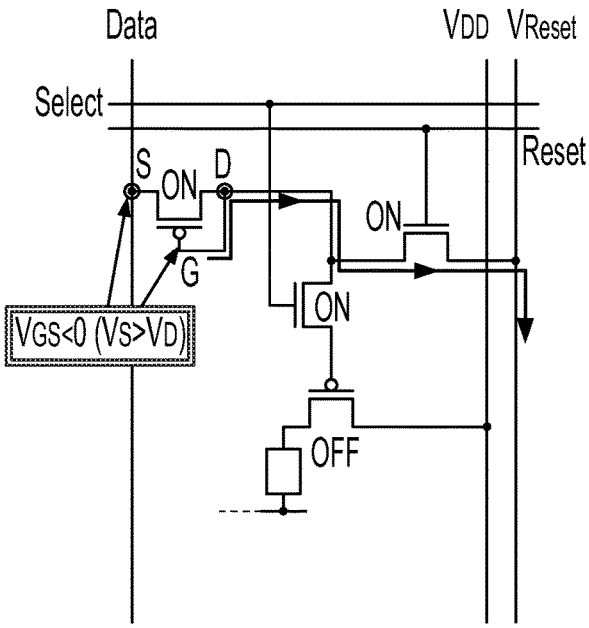
Figure 4C:
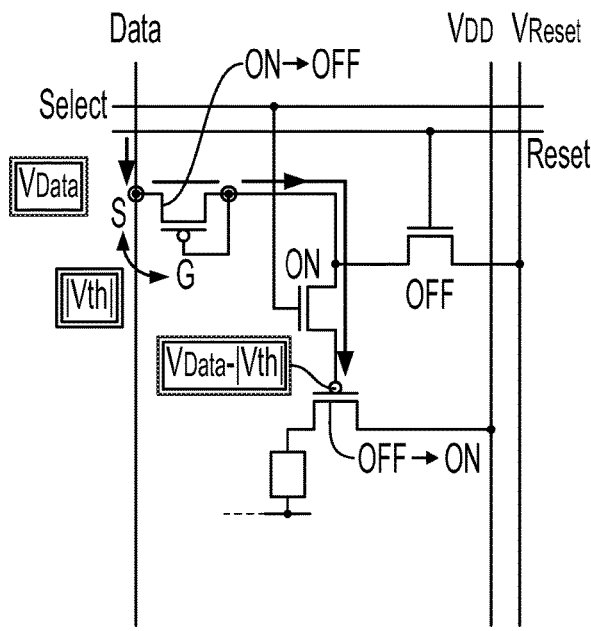
Figure 4D:
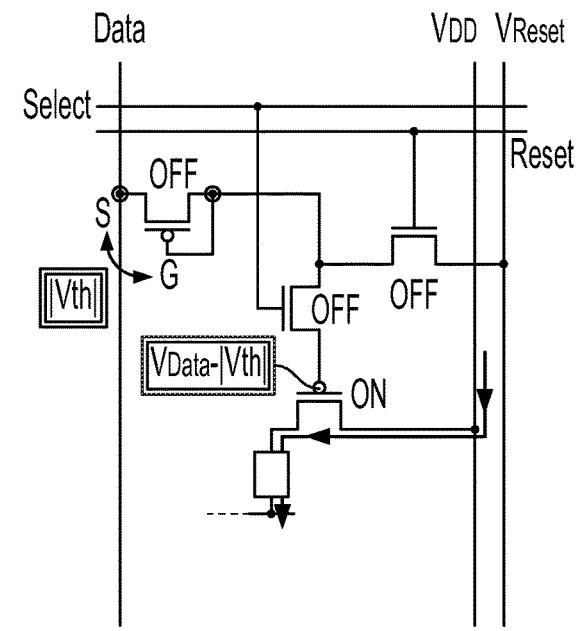

Operation is explained using FIGS. 4B to 4D. Note that a structure in which the TFTs 404 and 406 are n-channel TFTs is shown here, and therefore the TFTs turn on when the electric potential of the gate signal line is H level, and the TFTs turn off when the electric potential of the gate signal line is L level. The TFTs 404 and 406 function as simple switching devices, however, and may therefore use any polarity.

The with the electric potential of the source signal line 401 taken as VDD, the electric potential of the electric current supply line taken as VDD, and the electric potential of a reset electric power source line taken as VReset (<VDD−|Vth|), a gate GS a source (S), the drain D of the TFT 405 are defined as shown in FIG. 4B.

First, a pulse is input to a first gate signal line 402 and a second gate signal line 403, and a TFTs 404 and 406 turn on. The electric potential of the drain of the TFT 405 thus drops as shown in FIG. 4B, and a voltage VGS between the gate and the source of the TFT 405 becomes less than zero, and in addition, exceeds the absolute value of the threshold value Vth, and the TFT 405 turns on. Initialization is thus completed. Note that TFT 404 may be turned off here.

Image signal input is then performed. The second gate signal line 403 becomes L level, and the TFT 406 turns off. The first gate signal line 402 becomes H level, and the TFT 404 turns on. The voltage between the gate and the source of the TFT 407 exceeds the absolute value of the threshold value, and the TFT 407 turns on. The electric potential of the source signal line becomes VData from VDD, and the electric potential applied to the gate electrode of the TFT 407 thus settles at (VData−Vth).

Operation then passes to the light emitting period. Light emission begins at the point where the TFT 407 turns on. However, a desired electric current first flows in the EL device 409 after the image signal is input and the electric potential of the gate of the TFT 407 becomes (VData−Vth). The first gate signal line becomes L level at the same time, and the TFT 404 turns off.

Embodiment Mode 8

Figure 5A:
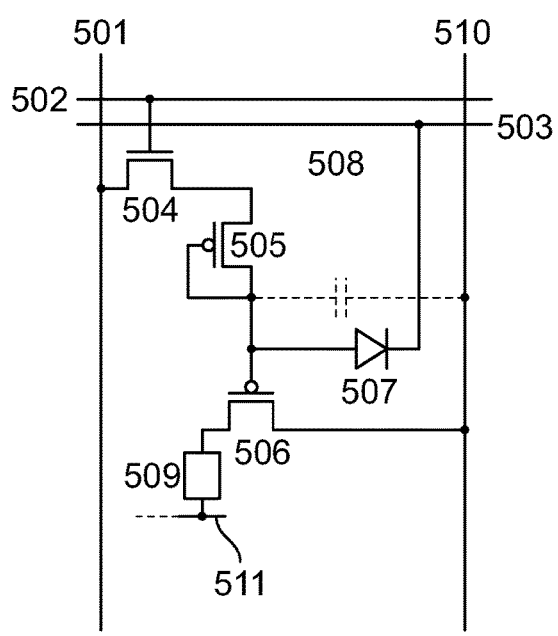
FIGS. 5A-5D are diagrams for explaining an embodiment mode of the present invention, and operation of the embodiment mode.

A certain TFT is used in performing initialization before inputting an image signal in Embodiment Modes 1 to 7. FIG. 5A uses a diode 507 as a substitute for the TFT. A first electrode of the diode 507 is connected to a gate electrode and a second electrode of a TFT 505, and a second electrode of the diode 507 is connected to a second gate signal line 503. Further, if a capacitive means 508 is formed in order to store an image signal, it may be formed between a gate electrode of a TFT 506 and a position at which a fixed electric potential can be obtained, such as an electric current supply line 510. Further, the capacitive means 508 may be formed between a second electrode of a TFT 504 and a fixed electric potential, such as the electric current supply line 510, and the capacitive means 508 may also be formed in both locations if it is desired to make the storage capacitance value larger.

The only point that differs from Embodiment Mode 1 is initialization. Explanations of image signal input and light emission operations are omitted here, and operations during initialization are explained using FIG. 5B.

Figure 5B:
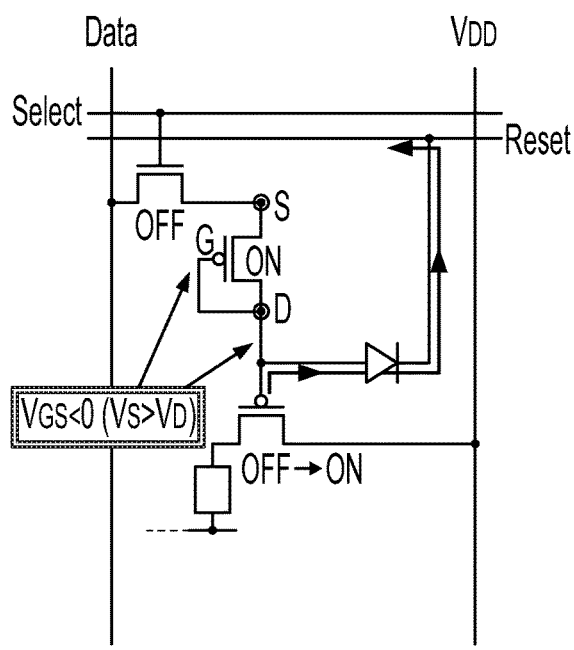

The second gate signal line 503 is set to H level in an initial state. A forward bias is applied to the diode if the electric potential of the second gate signal line 503 is reduced at an initialization timing. Electric current develops from the high electric potential side to the low electric potential side, that is as shown in FIG. 5B, and the electric potentials of the gates of the TFTs 505 and 506 are reduced. If the voltages between the gates and the sources of the TFTs 505 and 506 soon exceed the absolute values of the threshold values Vth of the TFTs 505 and 506, respectively, the TFT 505 turns on. The second gate signal line 503 later returns once again to H level while input of the image signal is being performed. The image signal is then input, and the diode 507 is in a state in which a reverse bias is always applied, and electric current therefore does not develop.

A desired electric current then flows in the EL device 509, similar to Embodiment Mode 1, and the EL device 509 emits light.

Figure 5C:
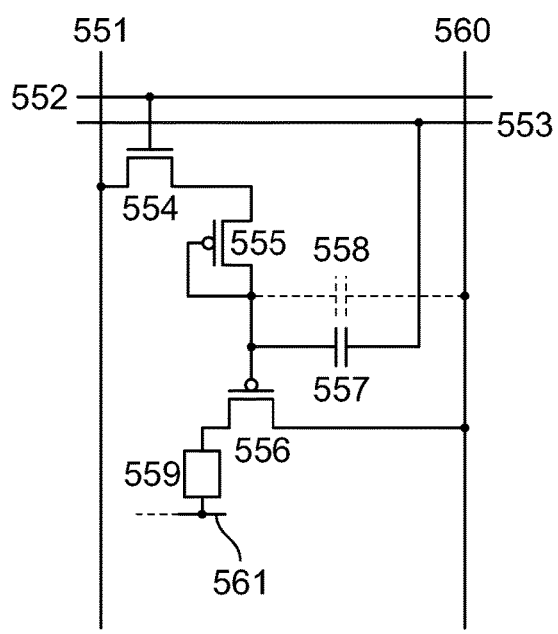
Figure 5D:
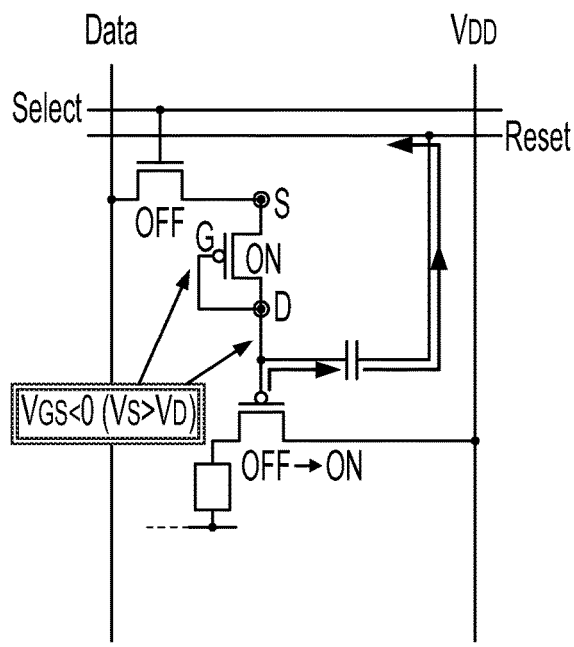

FIG. 5C shows an example in which a capacitive means 557 is formed as a substitute for the diode 507. A first electrode of the capacitive means 557 is connected to a gate electrode and a second electrode of a TFT 555, and to a gate electrode of a TFT 556. A second electrode of the capacitive means 557 is connected to a second gate signal line 553. Operation is also similar to that of FIG. 5B in this case. The second gate signal line 553 is set to H level in an initial state, and the electric potential of the second gate signal line 553 is reduced at an initialization timing. A TFT 554 is off at this point, and therefore the second electrode of the capacitive means 557 is in a floating state. If the electric potential of the first electrode of the capacitive means 557 is then reduced, the electric potential of the second electrode, that is the electric potential of the gate electrodes of the TFTs 555 and 556, is also reduced due to capacitive coupling. If the voltages between the gates and the sources of the TFTs 555 and 556 soon exceed the absolute value of the threshold values Vth of the TFTs 555 and 556, respectively, the TFTs 555 and 556 turn on.

The TFT 554 then turns on, and input of the image signal is performed. The second gate signal line 553 is L level at this point, but may also be set to H level while the image signal is being input, that is while the TFT 554 is on.

A desired electric current then flows in the EL device 559, similar to Embodiment Mode 1, and the EL device 559 emits light.

In contrast to the gate signal line and the reset electric power source line, which are necessary for initialization in FIG. 1A, it is possible to perform initialization in accordance with the structure of Embodiment Mode 8 by using only the gate signal line (the second gate signal lines 503 and 553 in FIG. 5). The number of wirings needed in a pixel portion can therefore be reduced by one, and this contributes to increasing the aperture ratio.

Embodiment Mode 9

Figure 6A:
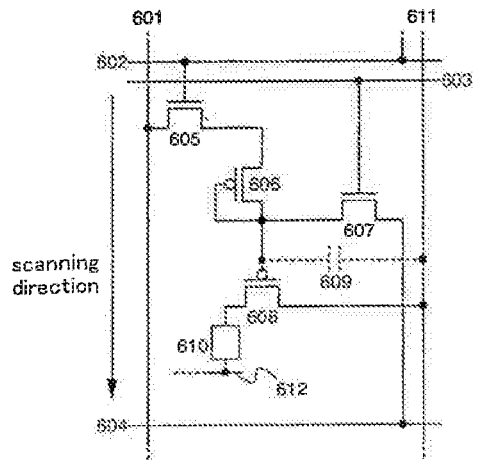
FIGS. 6A and 6B are diagrams for explaining an embodiment mode of the present invention, and operation of the embodiment mode.
Figure 6B:
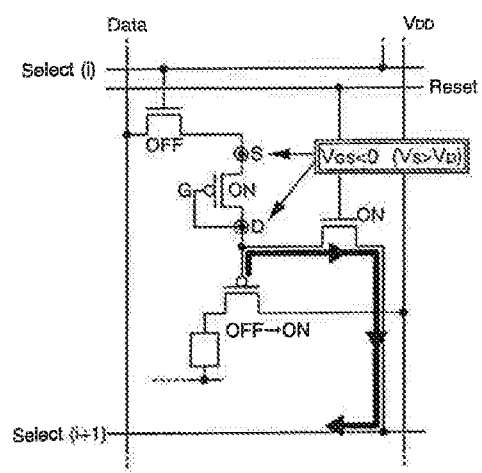

FIG. 6A shows a structure in which a portion of the connections in the structure disclosed by Embodiment Mode 1 is changed. The second electrode of the TFT 106 is connected to the reset electric power source line 111 in Embodiment Mode 1, as shown in FIG. 1, but in Embodiment Mode 9, the connection is made in an i-th row pixel to a first gate signal line of an (i+1)th row, as shown in FIG. 6A. Gate signal lines of the (i+1)th row are not yet selected when initialization of the i-th row is performed, and are thus L level. The gate signal lines are at a fixed electric potential during a period when a gate signal line selection pulse is not being input, and therefore the gate signal lines of the (i+1)th row may be shared and also used as reset electric power source lines, as shown in FIG. 6B. Reset electric power source lines can therefore be omitted, similar to the structure of Embodiment Mode 8.

In this case it is necessary that the shared gate signal lines become L level in an unselected state. A TFT controlled by pulses input to the gate signal lines, namely a TFT 605, is therefore an n-channel TFT.

It is possible to combine the structure of Embodiment Mode 9 with other embodiment modes. For example, it becomes possible to omit a reset electric power source line 911 by connecting a TFT 906 in accordance with Embodiment Mode 9 for cases in which an erasure gate signal line is added, and for other cases, as shown in FIG. 9, FIG. 10, and the like.

Further, if a capacitive means 609 is formed in order to store an image signal, it may be formed between a gate electrode of a TFT 608 and a position at which a fixed electric potential can be obtained, such as an electric current supply line 611. Furthermore, the capacitive means 609 may also be formed between a second electrode of the TFT 605 and a fixed electric potential, such as the electric current supply line 611, and the capacitive means 609 may also be formed in both locations if it is desired to make the storage capacitance value larger.

Embodiment Mode 10

Figure 7A:
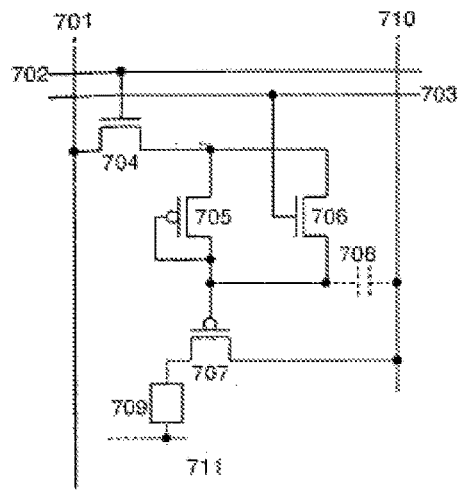
FIGS. 7A-7E are diagrams for explaining an embodiment mode of the present invention, and operation of the embodiment mode.

FIG. 7A shows a structure in which a portion of the connections in the structure disclosed by Embodiment Mode 1 is changed, similar to Embodiment Mode 9. In contrast to Embodiment Mode 1, in which the second electrode of the TFT 106 is connected to the reset electric power source line 111, as shown in FIG. 1, the connection is made to a second electrode of a TFT 704 in Embodiment Mode 10. Further, if a capacitive means 708 is formed in order to store an image signal, it may be formed between a gate electrode of a TFT 707 and a position at which a fixed electric potential can be obtained, such as an electric current supply line 710. Furthermore, the capacitive means 708 may also be formed between the second electrode of the TFT 704 and a fixed electric potential, such as the electric current supply line 710, and the capacitive means 708 may also be formed in both locations if it is desired to make the storage capacitance value larger.

Figure 7B:
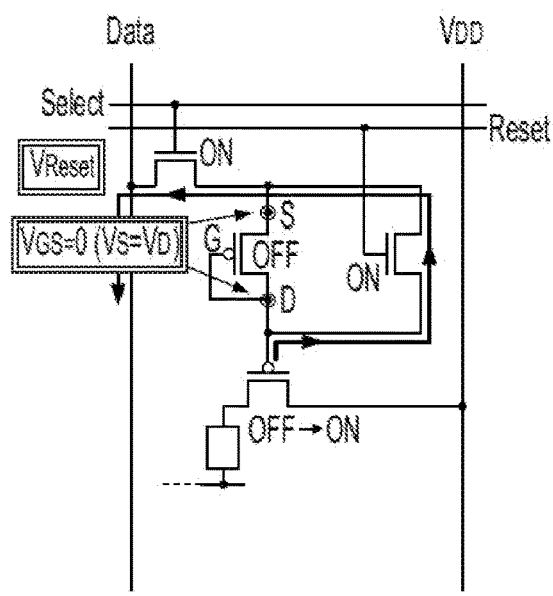
Figure 7C:
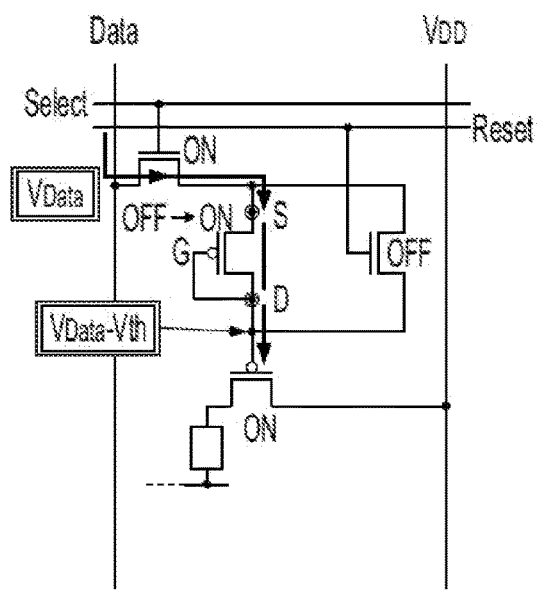
Figure 7D:
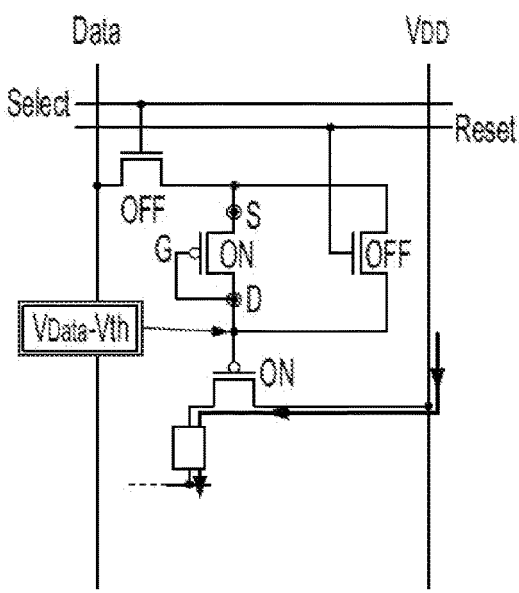
Figure 7E:
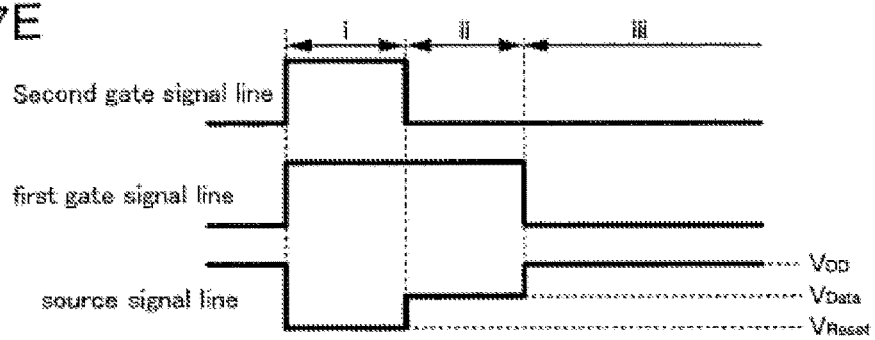

Operation is explained using FIGS. 7B to 7E. FIGS. 7B to 7D show circuit operation from initialization to light emission, and FIG. 7E is a diagram showing the electric potentials of a first gate signal line 702, a second gate signal line 703, and a source signal line 701. A period denoted by reference symbol i in FIG. 7E is for initialization (FIG. 7B), a period denoted by reference symbol ii is for input of an image signal (FIG. 7C), and a period denoted by reference symbol iii is a light emitting period (FIG. 7D).

First, the first gate signal line 702 and the second gate signal line 703 become H level, and the TFT 704 and a TFT 706 turn on. The electric potential of the source signal line 701 at this point is set to VReset as shown in FIG. 7E. This electric potential is set to an electric potential lower than the image signal by the amount of the threshold value of a TFT 705, or to an even lower electric potential. The electric potentials of a gate electrode of the TFT 705 and the gate electrode of the 707 thus become lower, as shown in FIG. 7B, and the TFT 707 turns on at the point where the electric potentials exceed the threshold value of the TFT 707. As is clear from FIG. 7B, the voltage between the gate and the source of the TFT 705 becomes zero, and therefore the TFT 705 turns off.

The second gate signal line 703 then becomes L level, the TFT 706 turns off, the electric potential of the source signal line becomes VData from VReset, and input of the image signal begins. VReset+|Vth|<VData here, and therefore the voltage between the gate and the source of the TFT 705 exceeds the threshold value of the TFT 705, which turns on. The image signal, to which the threshold value is added, is therefore applied to the gate electrode of the TFT 707 as shown in FIG. 7C.

The first gate signal line 702 then becomes L level, the TFT 704 turns off, and operation moves to the light emitting period. The image signal VData, to which the threshold value is added, is applied to the gate electrode of the TFT 707 at this point, and electric current corresponding to the image signal plus the threshold value is supplied to an EL device 709, and the EL device 709 emits light.

Further, although a second electrode of the TFT 706 is connected to the second electrode of the TFT 704 here, operations at a similar timing are also possible if the second electrode of the TFT 706 is connected to the source signal line 701, or between the gate electrode of the TFT 707 and the source signal line.

Embodiment Mode 11

Figure 8A:
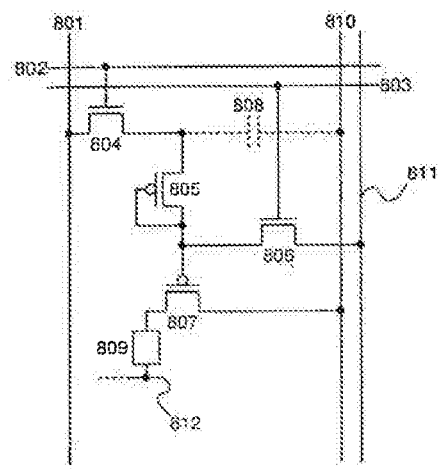
FIGS. 8A and 8B are diagrams showing an embodiment mode of the present invention.
Figure 8B:
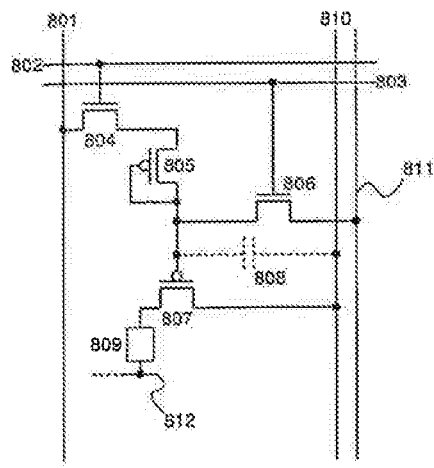

A capacitive means for storing an image signal may be used in the present invention, as discussed above. The arrangement examples of capacitive means are disclosed in Embodiment Mode 1 and the like. The capacitive means may be formed between a TFT 804 and a fixed electric potential such as an electric current supply line 810, in order to store the electric potential of the source of the TFT 805, as shown in FIG. 8A. The capacitive means may also be formed between a gate electrode of a TFT 807, and a fixed electric potential such as the electric current supply line 810, as shown in FIG. 8B, in order to store the electric potential of the gate electrode of the TFT 807. Note that the connecting point for the capacitive means is not limited to the electric current supply line. An electric potential can be stored if the capacitive means is connected to a node possessing a fixed electric potential, and therefore any location may be used.

EMBODIMENTS

Embodiments of the present invention are discussed below.

Embodiment 1

Figure 24A:
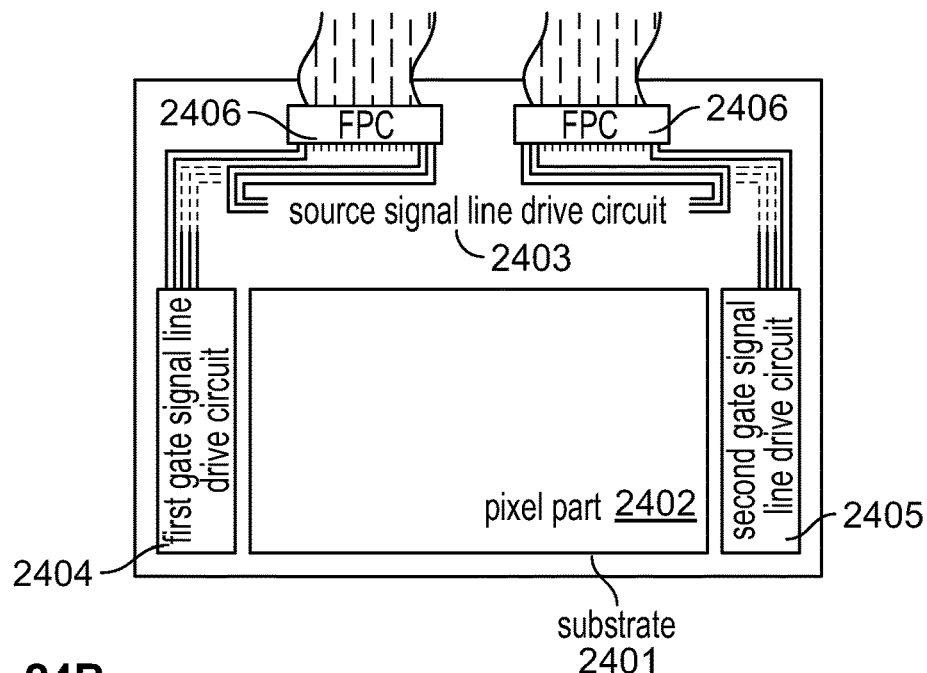
FIGS. 24A-24C are diagrams for explaining an outline of a light emitting device employing an analog signal method.

In this embodiment, the configuration of a light emitting device in which analogue video signals are used for video signals for display will be described. FIG. 24A depicts the exemplary configuration of the light emitting device. The device has a pixel part 2402 where a plurality of pixels is arranged in a matrix shape over a substrate 2401, and it has a source signal line drive circuit 2403 and first and second gate signal line drive circuits 2404 and 2405 around the pixel part. In FIG. 24A, two gate signal line drive circuits are used to control a first and a second gate signal line in the pixel shown in FIG. 1, respectively.

Signals inputted to the source signal line drive circuit 2403, and the first and second gate signal line drive circuits 2404 and 2405 are fed from outside through a flexible printed circuit (FPC) 2406.

Figure 24B:
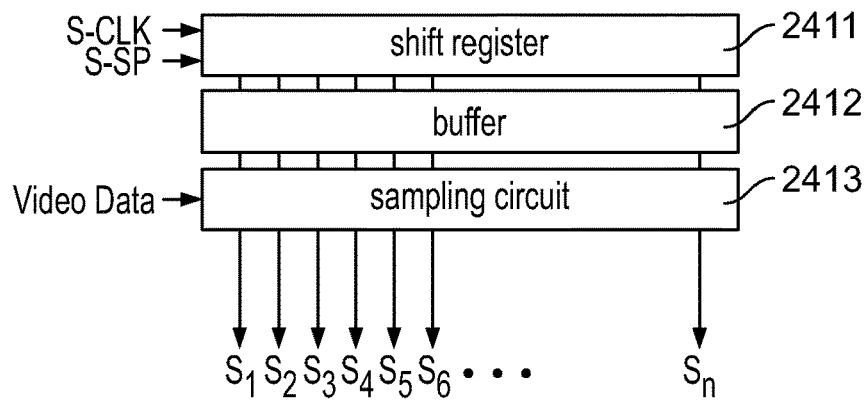
Figure 24C:
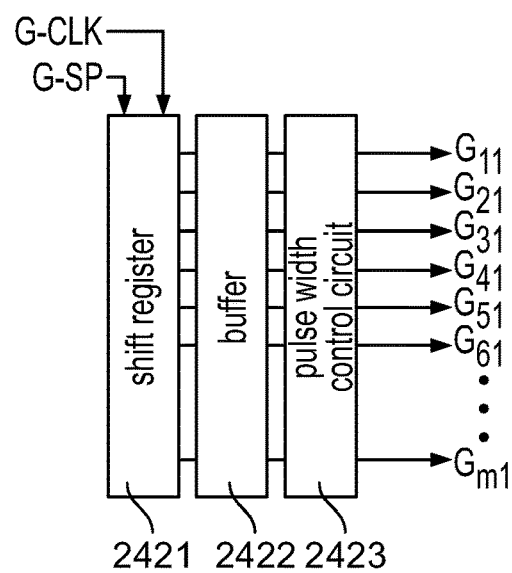

FIG. 24B depicts the exemplary configuration of the source signal line drive circuit. This is the source signal line drive circuit for using analogue video signals for video signals for display, which has a shift register 2411, a buffer 2412, and a sampling circuit 2413. Not shown particularly, but a level shifter may be added as necessary.

Figure 25A:
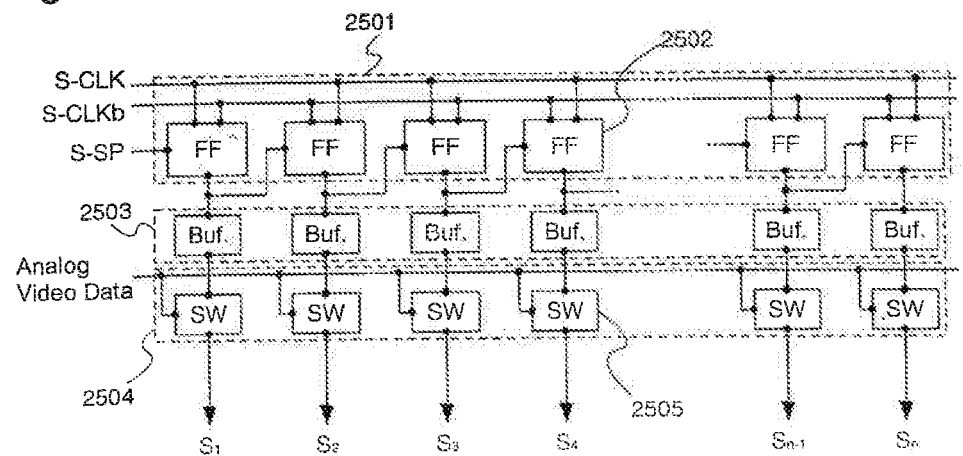
FIGS. 25A and 25B are diagrams showing examples of the structure of a source signal line driver circuit and a gate signal line driver circuit used in FIG. 24.

The operation of the source signal line drive circuit will be described. FIG. 25A shows the more detailed configuration, thus referring to the drawing.

A shift register 2501 is formed of a plurality of flip-flop circuits (FF) 2502, to which the clock signal (S-CLK), the clock inverted signal (S-CLKb), and the start pulse (S-SP) are inputted. In response to the timing of these signals, sampling pulses are outputted sequentially.

The sampling pulses outputted from the shift register 2501 are passed through a buffer 2503 and amplified, and then inputted to a sampling circuit. The sampling circuit 2504 is formed of a plurality of sampling switches (SW) 2505, which samples video signals in a certain column in accordance with the timing of inputting the sampling pulses. More specifically, when the sampling pulses are inputted to the sampling switches, the sampling switches 2505 are turned on. The potential held by the video signals at this time is outputted to the separate source signal lines through the sampling switches.

Figure 25B:
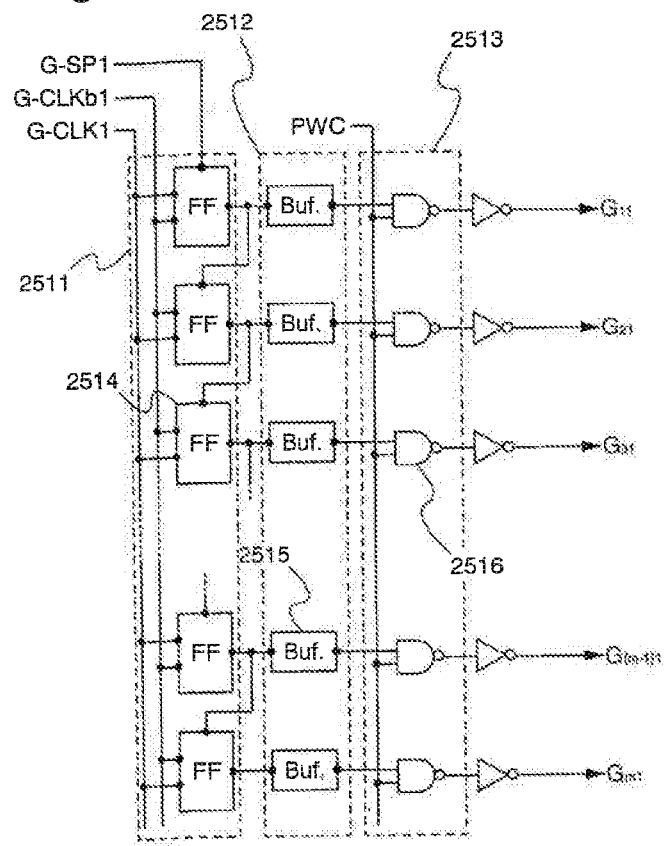

Subsequently, the operation of the gate signal line drive circuit will be described. FIG. 25B depicts the more detailed exemplary configuration of the first and second gate signal line drive circuits 2404 and 2405 shown in FIG. 24A. The first gate signal line drive circuit has a shift register circuit 2511, and a buffer 2512, which is driven in response to the clock signal (G-CLK1), the clock inverted signal (G-CLKb1), and the start pulse (G-SP1). The second gate signal line drive circuit 2505 may also be configured similarly. In addition, in FIG. 24A, although the first and second gate signal line drive circuits are arranged symmetrically via the pixel part 2402 therebetween, they may be arranged in parallel to the same direction.

The operation from the shift register to the buffer is the same as that in the source signal line drive circuit. The sampling pulses amplified by the buffer select separate gate signal lines for them. The first gate signal line drive circuit sequentially selects first gate signal lines G11, G21, . . . and Gm1, and the second gate signal line drive circuit sequentially selects second gate signal lines G12, G22, . . . and Gm2. A third gate signal line drive circuit, not shown, is also the same as the first and second gate signal line drive circuits, sequentially selecting third gate signal lines G13, G23, . . . and Gm3. In the selected row, video signals are written in the pixel to emit light according to the procedures described in the embodiments.

In addition, as one example of the shift register, that formed of a plurality of D flip-flops is shown here. However, such the configuration is acceptable that signal lines can be selected by a decoder.

Embodiment 2

Figure 26A:
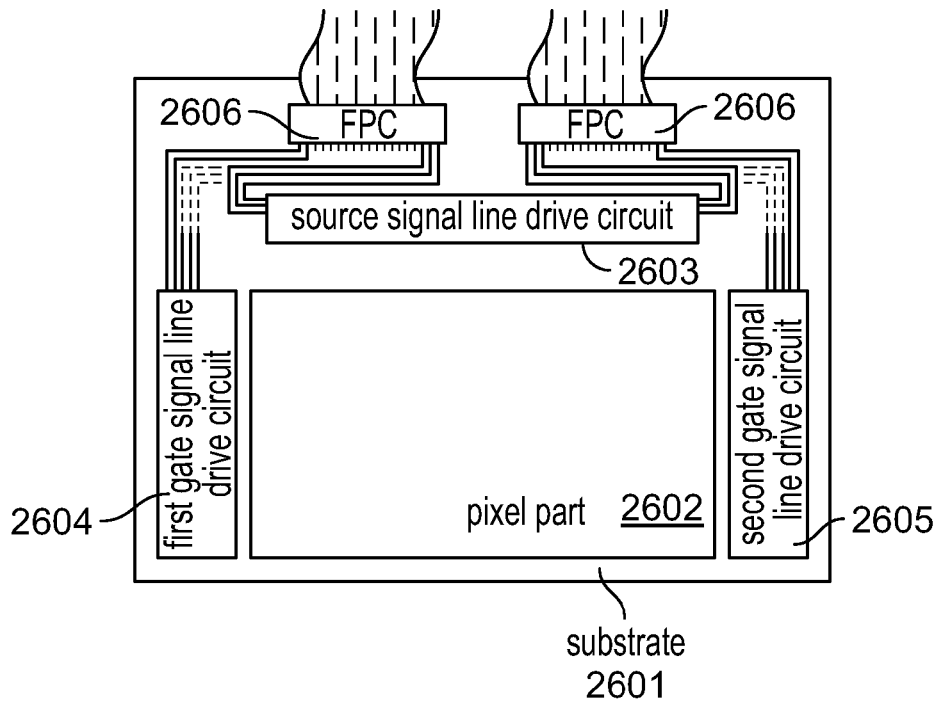
FIGS. 26A and 26B are diagrams for explaining an outline of a light emitting device employing a digital signal method.

In this embodiment, the configuration of a light emitting device in which digital video signals are used for video signals for display will be described. FIG. 26A depicts the exemplary configuration of a light emitting device. The device has a pixel part 2602 where a plurality of pixels is arranged in a matrix shape over a substrate 2601, and it has a source signal line drive circuit 2603, and first and second gate signal line circuits 2604 and 2605 around the pixel part. In FIG. 26A, two gate signal line drive circuits are used to control the first and second gate signal lines in the pixel shown in FIG. 1, respectively.

Signals inputted to the source signal line drive circuit 2603, and the first and second gate signal line drive circuits 2604 and 2605 are fed from outside through a flexible printed circuit (FPC) 2606.

Figure 26B:
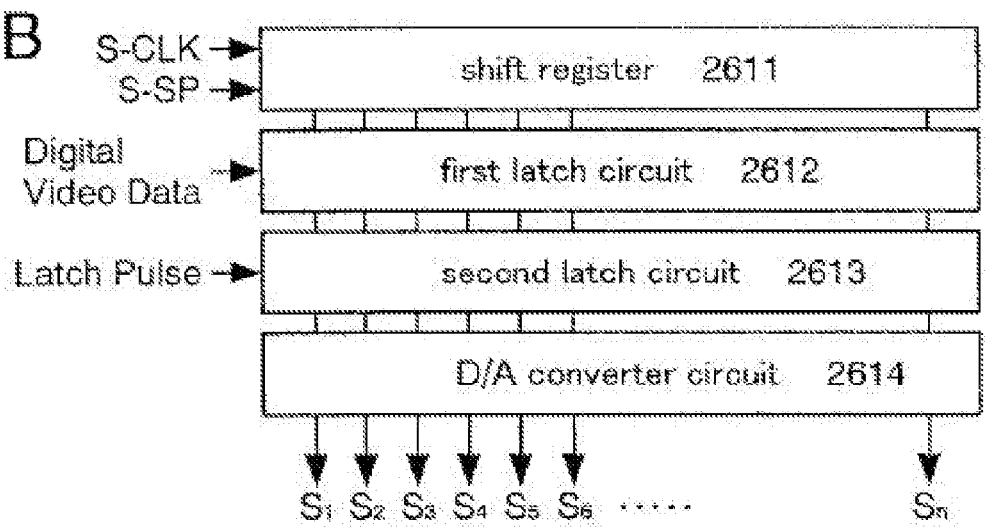

FIG. 26B depicts the exemplary configuration of the source signal line drive circuit. This is the source signal line drive circuit for using digital video signals for video signals for display, which has a shift register 2611, a first latch circuit 2612, a second latch circuit 2613, and a D/A converter circuit 2614. Not shown in the drawing particularly, but a level shifter may be added as necessary.

The first and second gate signal line drive circuits 2604 and 2605 are fine to be those shown in the embodiment 11, thus omitting the illustration and description here.

Figure 27A:
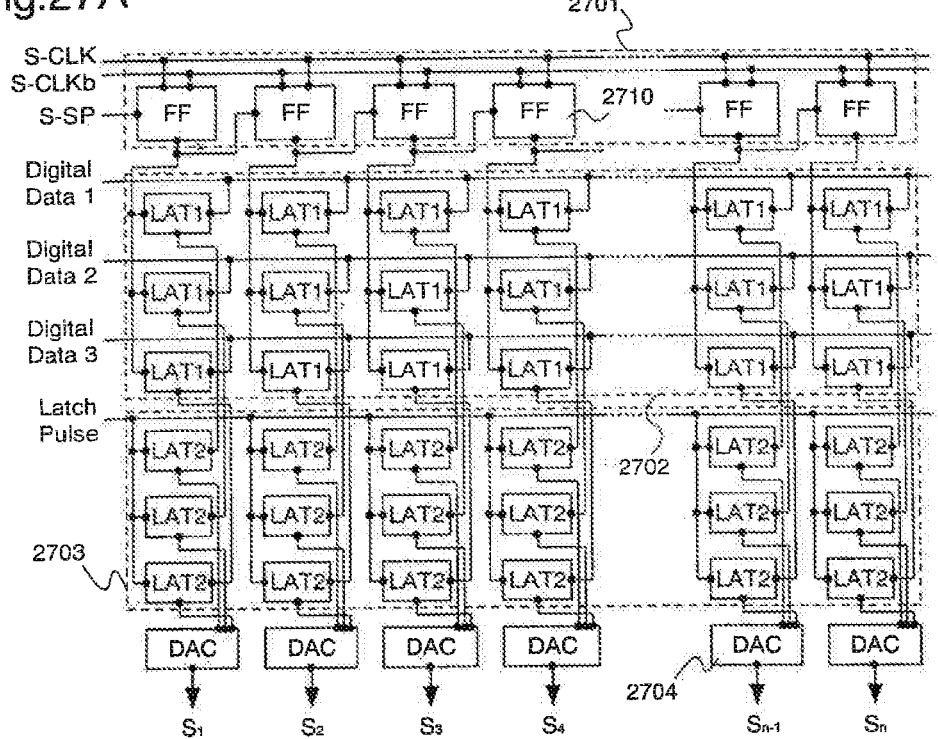
FIGS. 27A and 27B are diagrams showing examples of the structure of a source signal line driver circuit used in FIG. 25.

The operation of the source signal line drive circuit will be described. FIG. 27A shows the more detailed configuration, thus referring to the drawing.

A shift register 2701 is formed of a plurality of flip-flop circuits (FF) 2710, to which the clock signal (S-CLK), the clock inverted signal (S-CLKb), and the start pulse (S-SP) are inputted. Sampling pulses are sequentially outputted in response to the timing of these signals.

The sampling pulses outputted from the shift register 2701 are inputted to first latch circuits 2702. Digital video signals are being inputted to the first latch circuits 2702. The digital video signals are held at each stage in response to the timing of inputting the sampling pulses. Here, the digital video signals are inputted by three bits. The video signals at each bit are held in the separate first latch circuits. Here, three first latch circuits are operated in parallel by one sampling pulse.

When the first latch circuits 2702 finish to hold the digital video signals up to the last stage, latch pulses are inputted to second latch circuits 2703 during the horizontal retrace period, and the digital video signals held in the first latch circuits 2702 are transferred to the second latch circuits 2703 all at once. After that, the digital video signals held in the second latch circuits 1903 for one row are inputted to D/A converter circuits 2704 simultaneously.

While the digital video signals held in the second latch circuits 2703 are being inputted to the D/A converter circuits 2704, the shift register 2701 again outputs sampling pulses. Subsequent to this, the operation is repeated to process the video signals for one frame.

The D/A converter circuits 2704 convert the inputted digital video signals from digital to analogue and output them to the source signal lines as the video signals having the analogue voltage.

The operation described above is conducted throughout the stages during one horizontal period. Accordingly, the video signals are outputted to the entire source signal lines.

In addition, as described in the embodiment 11, such the configuration is acceptable that a decoder is used instead of the shift register to select signal lines.

Embodiment 3

Figure 27B:
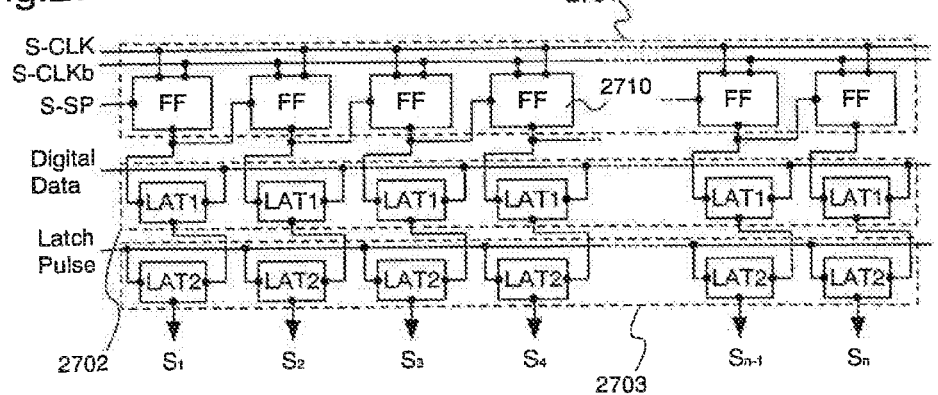

In the embodiment 2, digital video signals are converted from digital to analogue by the D/A converter circuits and are written in the pixels. The light emitting device of the invention can also express gray scales by the time gray scale system. In this case, the D/A converter circuits are not needed as shown in FIG. 27B, and gray scales are controlled over the expression by the length of time that the EL device is emitting light for a long tome or short time. Thus, the video signals of each bit do not need to undergo parallel processing. Therefore, both the first and second latch circuits are fine for one bit. At this time, the digital video signals of each bit are serially inputted, sequentially held in the latch circuits and written in the pixels. Of course, it is acceptable that latch circuits for necessary bits are arranged in parallel.

Embodiment 4

In this specification, a substrate in which a driver circuit including a CMOS circuit and a pixel part having a switching TFT and a drive TFT are formed on the same substrate is called an active matrix substrate as a matter of convenience. In addition, in this embodiment, a process of manufacturing the active matrix substrate will be described using FIGS. 13A to 13D and 14A to 14D.

A quartz substrate, a silicon substrate, a metallic substrate, or a stainless substrate, in which an insulating film is formed on the surface thereof is used as a substrate 5000. In addition, a plastic substrate having a heat resistance, which is resistant to a processing temperature in this manufacturing process may be used. In this embodiment, the substrate 5000 made of glass such as barium borosilicate glass or aluminoborosilicate glass is used.

Next, a base film 5001 made from an insulating film such as a silicon oxide film, a silicon nitride film, or a silicon oxynitride film is formed on the substrate 5000. In this embodiment, a two-layer structure is used for the base film 5001. However, a single layer structure of the insulating film or a structure in which two layers or more of the insulating film are laminated may be used.

In this embodiment, as a first layer of the base film 5001, a silicon oxynitride film 5001a is formed at a thickness of 10 nm to 200 nm (preferably, 50 nm to 100 nm) by a plasma CVD method using SiH4, NH3, and N2O as reactive gases. In this embodiment, the silicon oxynitride film 5001a is formed at a thickness of 50 nm. Next, as a second layer of the base film 5001, a silicon oxynitride film 5001b is formed at a thickness of 50 nm to 200 nm (preferably, 100 nm to 150 nm) by a plasma CVD method using SiH4 and N2O as reactive gases. In this embodiment, the silicon oxynitride film 5001b is formed at a thickness of 100 nm.

Subsequently, semiconductor layers 5002 to 5005 are formed on the base film 5001. The semiconductor layers 5002 to 5005 are formed as follows. That is, a semiconductor film is formed at a thickness of 25 nm to 80 nm (preferably, 30 nm to 60 nm) by known means (such as a sputtering method, an LPCVD method, or a plasma CVD method). Next, the semiconductor film is crystallized by a known crystallization method (such as a laser crystallization method, a thermal crystallization method using RTA or a furnace anneal furnace, a thermal crystallization method using a metallic element for promoting crystallization, or the like). Then, the obtained crystalline semiconductor film is patterned in a predetermined shape to form the semiconductor layers 5002 to 5005. Note that an amorphous semiconductor film, a micro-crystalline semiconductor film, a crystalline semiconductor film, a compound semiconductor film having an amorphous structure such as an amorphous silicon germanium film, or the like may be used as the semiconductor film.

In this embodiment, an amorphous silicon film having a film thickness of 55 nm is formed by a plasma CVD method. A solution containing nickel is held on the amorphous silicon film and it is dehydrogenated at 500° C. for 1 hour, and then thermal crystallization is conducted at 550° C. for 4 hours to form a crystalline silicon film. After that, patterning processing using a photolithography method is performed to form the semiconductor layers 5002 to 5005.

Note that, when the crystalline semiconductor film is formed by a laser crystallization method, a gas laser or a solid laser, which conducts continuous oscillation or pulse oscillation is preferably used as the laser. An excimer laser, a YAG laser, a YVO4 laser, a YLF laser, a YAlO3 laser, a glass laser, a ruby laser, a Ti:sapphire laser, and the like can be used as the former gas laser. In addition, a laser using a crystal such as YAG, YVO4, YLF or YAlO3, which is doped with Cr, Nd, Er, Ho, Ce, Co, Ti, or Tm can be used as the latter solid laser. The fundamental of the laser is changed according to a doping material and laser light having a fundamental of the neighborhood of 1 µm is obtained. A harmonic to the fundamental can be obtained by using a non-linear optical device. Note that, in order to obtain a crystal having a large grain size at the crystallization of the amorphous semiconductor film, it is preferable that a solid laser capable of conducting continuous oscillation is used and a second harmonic to a fourth harmonic of the fundamental are applied. Typically, a second harmonic (532 nm) or a third harmonic (355 nm) of an Nd:YVO4 laser (fundamental of 1064 nm) is applied.

Also, laser light emitted from the continuous oscillation YVO4 laser having an output of 10 W is converted into a harmonic by a non-linear optical device. Further, there is a method of locating an YVO4 crystal and a non-linear optical device in a resonator and emitting a harmonic. Preferably, laser light having a rectangular shape or an elliptical shape is formed on an irradiation surface by an optical system and irradiated to an object to be processed. At this time, an energy density of about 0.01 MW/cm2 to 100 MW/cm2 (preferably, 0.1 MW/cm2 to 10 MW/cm2) is required. The semiconductor film is moved relatively to the laser light at a speed of about 10 cm/s to 2000 cm/s to be irradiated with the laser light.

Also, when the above laser is used, it is preferable that a laser beam emitted from a laser oscillator is linearly condensed by an optical system and irradiated to the semiconductor film. A crystallization condition is set as appropriate. When an excimer laser is used, it is preferable that a pulse oscillation frequency is set to 300 Hz and a laser energy density is set to 100 mJ/cm2 to 700 mJ/cm2 (typically, 200 mJ/cm2 to 300 mJ/cm2). In addition, when a YAG laser is used, it is preferable that the second harmonic is used, a pulse oscillation frequency is set to 1 Hz to 300 Hz, and a laser energy density is set to 300 mJ/cm2 to 1000 mJ/cm2 (typically, 350 mJ/cm2 to 500 mJ/cm2). A laser beam linearly condensed at a width of 100 µm to 1000 µm (preferably, 400 µm) is irradiated over the entire surface of the substrate. At this time, an overlap ratio with respect to the linear beam may be set to 50% to 98%.

However, in this embodiment, the amorphous silicon film is crystallized using a metallic element for promoting crystallization so that the metallic element remains in the crystalline silicon film. Thus, an amorphous silicon film having a thickness of 50 nm to 100 nm is formed on the crystalline silicon film, heat treatment (thermal anneal using an RTA method or a furnace anneal furnace) is conducted to diffuse the metallic element into the amorphous silicon film, and the amorphous silicon film is removed by etching after the heat treatment. As a result, the metallic element contained in the crystalline silicon film can be reduced or removed.

Note that, after the formation of the semiconductor layers 5002 to 5005, doping with a trace impurity element (boron or phosphorus) may be conducted in order to control a threshold value of a TFT.

Next, a gate insulating film 5006 covering the semiconductor layers 5002 to 5005 is formed. The gate insulating film 5006 is formed from an insulating film containing silicon at a film thickness of 40 nm to 150 nm by a plasma CVD method or a sputtering method. In this embodiment, a silicon oxynitride film is formed as the gate insulating film 5006 at a thickness of 115 nm by the plasma CVD method. Of course, the gate insulating film 5006 is not limited to the silicon oxynitride film. Another insulating film containing silicon may be used as a single layer or a laminate structure.

Note that, when a silicon oxide film is used as the gate insulating film 5006, a plasma CVD method is employed, TEOS (tetraethyl orthosilicate) and O2 are mixed, a reactive pressure is set to 40 Pa, and a substrate temperature is set to 300° C. to 400° C. Then, discharge may occur at a high frequency (13.56 MHz) power density of 0.5 W/cm2 to 0.8 W/cm2 to form the silicon oxide film. After that, when thermal anneal is conducted for the silicon oxide film formed by the above steps at 400° C. to 500° C., a preferable property as to the gate insulating film 5006 can be obtained.

Next, a first conductive film 5007 having a film thickness of 20 nm to 100 nm and a second conductive film 5008 having a film thickness of 100 nm to 400 nm are laminated on the gate insulating film 5006. In this embodiment, the first conductive film 5007 which has the film thickness of 30 nm and is made from a TaN film and the second conductive film 5008 which has the film thickness of 370 nm and is made from a W film are laminated.

In this embodiment, the TaN film as the first conductive film 5007 is formed by a sputtering method using Ta as a target in an atmosphere containing nitrogen. The W film as the second conductive film 5008 is formed by a sputtering method using W as a target. In addition, it can be formed by a thermal CVD method using tungsten hexafluoride (WF6). In any case, when they are used for a gate electrode, it is necessary to reduce a resistance, and it is desirable that a resistivity of the W film is set to 20 µΩ cm or lower. When a crystal grain is enlarged, the resistivity of the W film can be reduced. However, if a large number of impurity elements such as oxygen exist in the W film, the crystallization is suppressed so that the resistance is increased. Therefore, in this embodiment, the W film is formed by a sputtering method using high purity W (purity of 99.9999%) as a target while taking into a consideration that an impurity does not enter the film from a gas phase at film formation. Thus, a resistively of 9µΩcm to 20 µΩcm can be realized.

Note that, in this embodiment, the TaN film is used as the first conductive film 5007 and the W film is used as the second conductive film 5008. However, materials which compose the first conductive film 5007 and the second conductive film 5008 are not particularly limited. The first conductive film 5007 and the second conductive film 5008 each may be formed from an element selected from Ta, W, Ti, Mo, Al, Cu, Cr, and Nd, or an alloy material or a compound material, which contains mainly the above element. In addition, they may be formed from a semiconductor film which is represented by a polycrystalline silicon film doped with an impurity element such as phosphorus, or an AgPdCu alloy.

Figure 13A:
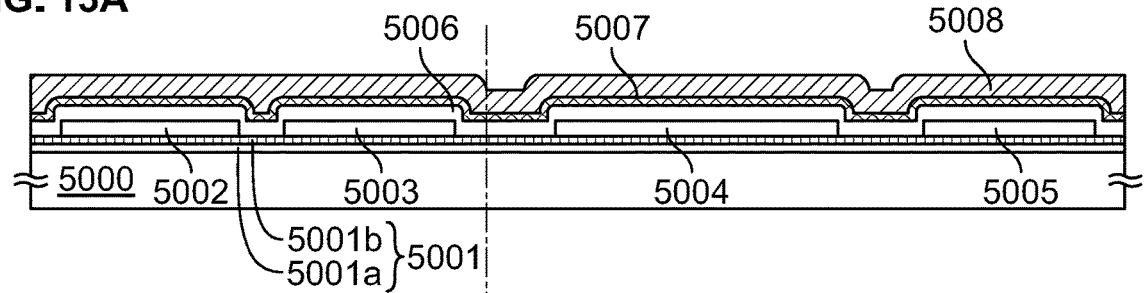
FIGS. 13A-13D are diagrams for explaining a process of manufacturing a light emitting device.
Figure 13B:
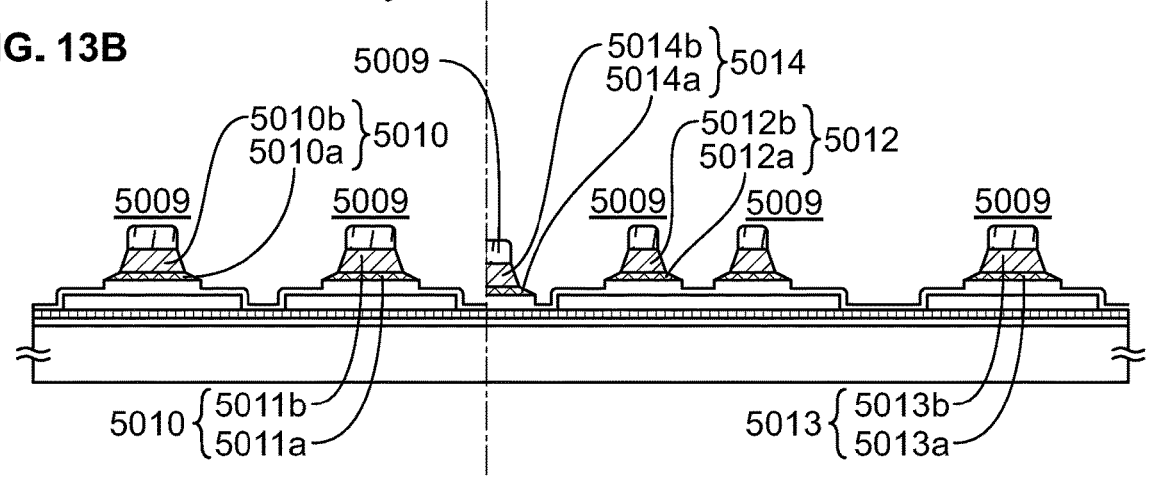

Next, a mask 5009 made of a resist is formed by using a photolithography method and first etching processing for forming electrodes and wirings is performed. The first etching processing is performed under a first etching condition and a second etching condition (FIG. 13B).

In this embodiment, as the first etching condition, an ICP (inductively coupled plasma) etching method is used. In addition, CF4, Cl2, and O2 are used as etching gases and a ratio of respective gas flow rates is set to 25:25:10 (sccm). RF power having 500 W and 13.56 MHz is supplied to a coil type electrode at a pressure of 1.0 Pa to produce plasma, thereby conducting etching. RF power having 150 W and 13.56 MHz is supplied to a substrate side (sample stage) to apply a substantially negative self bias voltage thereto. The W film is etched under this first etching condition so that end portions of the first conductive layer 5007 are made to have taper shapes.

Subsequently, the etching condition is changed to the second etching condition without removing the mask 5009 made of a resist. CF4 and Cl2 are used as etching gases and a ratio of respective gas flow rates is set to 30:30 (sccm). RF power having 500 W and 13.56 MHz is supplied to a coil type electrode at a pressure of 1.0 Pa to produce plasma, thereby conducting etching for about 15 seconds. RF power having 20 W and 13.56 MHz is supplied to a substrate side (sample stage) to apply a substantially negative self bias voltage thereto. In the second etching condition, both the first conductive film 5007 and the second conductive film 5008 are etched to the same degree. Note that, in order to conduct etching without leaving the residue on the gate insulating film 5006, it is preferable that an etching time is increased at a rate of about 10 to 20%.

In the above first etching processing, when a shape of the mask made of a resist is made suitable, the end portions of the first conductive film 5007 and the end portions of the second conductive film 5008 become taper shapes by an effect of the bias voltage applied to the substrate side. Thus, first-shaped conductive layers 5010 to 5014 made from the first conductive layer 5007 and the second conductive layer 5008 are formed by the first etching processing. With respect to the insulating film 5006, regions which are not covered with the first-shaped conductive layers 5010 to 5014 are etched by about 20 nm to 50 nm so that thinner regions are formed.

Figure 13C:
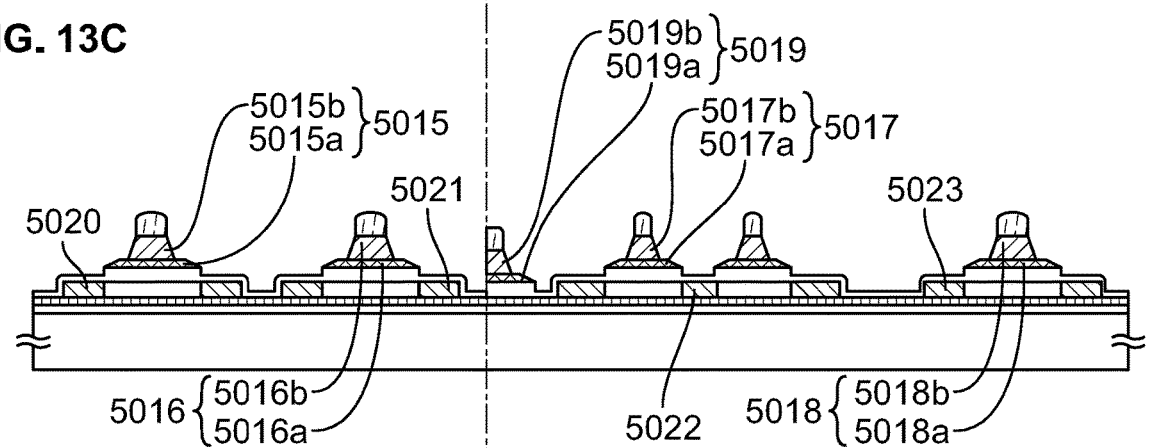
Figure 13D:
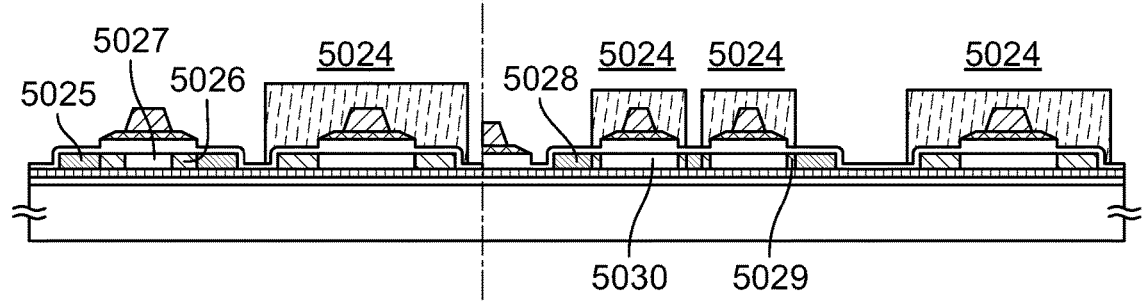

Next, second etching processing is performed without removing the mask 5009 made of a resist (FIG. 13C). In the second etching processing, SF6, Cl2, and O2 are used as etching gases and a ratio of respective gas flow rates is set to 24:12:24 (sccm). RF power having 700 W and 13.56 MHz is supplied to a coil type electrode at a pressure of 1.3 Pa to produce plasma, thereby conducting etching for about 25 seconds. RF power having 10 W and 13.56 MHz is supplied to a substrate side (sample stage) to apply a substantially negative self bias voltage thereto. Thus, the W film is selectively etched to form second-shaped conductive layers 5015 to 5019. At this time, first conductive layers 5015$a$ to 5019$a$ are hardly etched.

Then, first doping processing is performed without removing the mask 5009 made of a resist to add an impurity element for providing an N-type to the semiconductor layers 5002 to 5005 at a low concentration. The first doping processing is preferably performed by an ion doping method or an ion implantation method. With respect to a condition of the ion doping method, a dose is set to 1×1013 atoms/cm2 to 5×1014 atoms/cm2 and an accelerating voltage is set to 40 keV to 80 keV In this embodiment, a dose is set to 5.0×1013 atoms/cm2 and an accelerating voltage is set to 50 keV. As the impurity element for providing an N-type, an element which belongs to Group 15 is preferably used, and typically, phosphorus (P) or arsenic (As) is used. In this embodiment, phosphorus (P) is used. In this case, the second-shaped conductive layers 5015 to 5019 become masks to the impurity element for providing an N-type. Thus, first impurity regions (N− regions) 5020 to 5023 are formed in a self alignment. Then, the impurity element for providing an N-type is added to the first impurity regions 5020 to 5023 at a concentration range of 1×1018 atoms/cm3 to 1×1020 atoms/cm3.

Subsequently, after the mask 5009 made of a resist is removed, a new mask 5024 made of a resist is formed and second doping processing is performed at a higher accelerating voltage than that in the first doping processing. In a condition of an ion doping method, a dose is set to 1×1013 atoms/cm2 to 3×1015 atoms/cm2 and an accelerating voltage is set to 60 keV to 120 keV. In this embodiment, a dose is set to 3.0×1015 atoms/cm2 and an accelerating voltage is set to 65 keV In the second doping processing, second conductive layers 5015$b$ to 5018$b$ are used as masks to an impurity element and doping is conducted such that the impurity element is added to the semiconductor layers located under the taper portions of the first conductive layers 5015$a$ to 5018$a$.

As a result of the above second doping processing, the impurity element for providing an N-type is added to second impurity regions (N− regions; Lov regions) 5026 overlapped with the first conductive layers at a concentration range of 1×1018 atoms/cm3 to 5×1019 atoms/cm3. In addition, the impurity element for providing an N-type is added to third impurity regions (N+ regions) 5025 and 5028 at a concentration range of 1×1019 atoms/cm3 to 5×1021 atoms/cm3. After the first and second doping processing, regions to which no impurity element is added or regions to which the trace impurity element is added are formed in the semiconductor layers 5002 to 5005. In this embodiment, the regions to which the impurity element is not completely added or the regions to which the trace impurity element is added are called channel regions 5027 and 5030. In addition, there are, of the first impurity regions (N− regions) 5020 to 5023 formed by the above first doping processing, regions covered with the resist 5024 in the second doping processing. In this embodiment, they are continuously called first impurity regions (N− regions; LDD regions) 5029.

Note that, in this embodiment, the second impurity regions (N− regions) 5026 and the third impurity regions (N+ regions) 5025 and 5028 are formed by only the second doping processing. However, the present invention is not limited to this. A condition for doping processing may be changed as appropriate and doping processing may be performed plural times to form those regions.

Figure 14A:
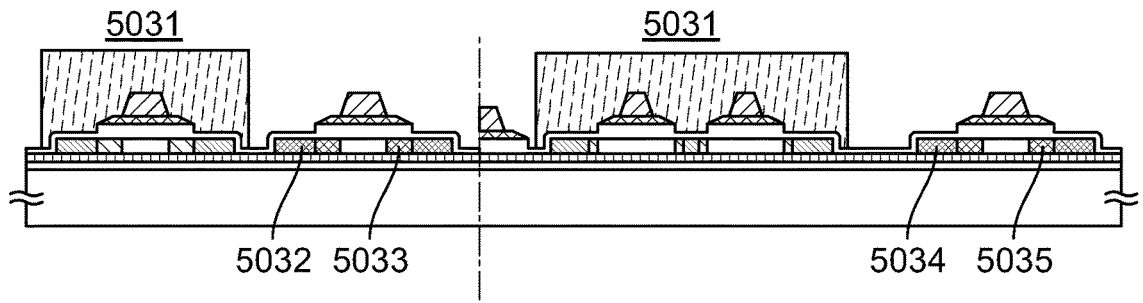
FIGS. 14A-14D are diagrams for explaining a process of manufacturing the light emitting device.

Next, as shown in FIG. 14A, after the mask 5024 made of a resist is removed, a new mask 5031 made of a resist is formed. After that, third doping processing is performed. By the third doping processing, fourth impurity regions (P+ regions) 5032 and 5034 and fifth impurity regions (P− regions) 5033 and 5035 to which an impurity element for providing a conductivity type reverse to the above first conductivity type is added are formed in the semiconductor layers as active layers of P-channel TFTs.

In the third doping processing, the second conductive layers 5016$b$ and 5018$b$ are used as masks to the impurity element. Thus, the impurity element for providing a P-type is added to form the fourth impurity regions (P+ regions) 5032 and 5034 and the fifth impurity regions (P− regions) 5033 and 5035 in a self alignment.

In this embodiment, the fourth impurity regions 5032 and 5034 and the fifth impurity regions 5033 and 5035 are formed by an ion doping method using diborane (B2H6). In a condition of the ion doping method, a dose is set to 1×1016 atoms/cm2 and an accelerating voltage is set to 80 keV.

Note that, in the third doping processing, the semiconductor layers composing N-channel TFTs are covered with the masks 5031 made of a resist.

Here, by the first and second doping processing, phosphorus is added to the fourth impurity regions (P+ regions) 5032 and 5034 and the fifth impurity regions (P− regions) 5033 and 5035 at different concentrations. In the third doping processing, doping processing is conducted such that a concentration of the impurity element for providing a P-type is 1×1019 atoms/cm3 to 5×1021 atoms/cm3 in any region of the fourth impurity regions (P+ regions) 5032 and 5034 and the fifth impurity regions (P− regions) 5033 and 5035. Thus, the fourth impurity regions (P+ regions) 5032 and 5034 and the fifth impurity regions (P− regions) 5033 and 5035 serve as the source regions and the drain regions of the P-channel TFTs without causing a problem.

Note that, in this embodiment, the fourth impurity regions (P+ regions) 5032 and 5034 and the fifth impurity regions (P− regions) 5033 and 5035 are formed by only the third doping processing. However, the present invention is not limited to this. A condition for doping processing may be changed as appropriate and doping processing may be performed plural times to form those regions.

Figure 14B:
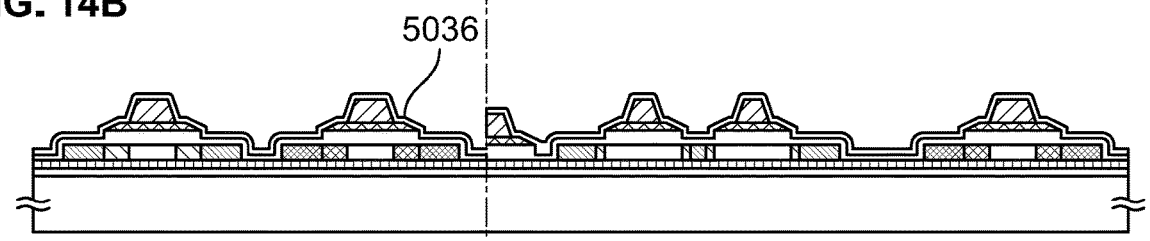

Next, as shown in FIG. 14B, the mask 5031 made of a resist is removed and a first interlayer insulating film 5036 is formed. An insulating film containing silicon is formed as the first interlayer insulating film 5036 at a thickness of 100 nm to 200 nm by a plasma CVD method or a sputtering method. In this embodiment, a silicon oxynitride film is formed at a film thickness of 100 nm by plasma CVD method. Of course, the first interlayer insulating film 5036 is not limited to the silicon oxynitride film, and therefore another insulating film containing silicon may be used as a single layer or a laminate structure.

Figure 14C:
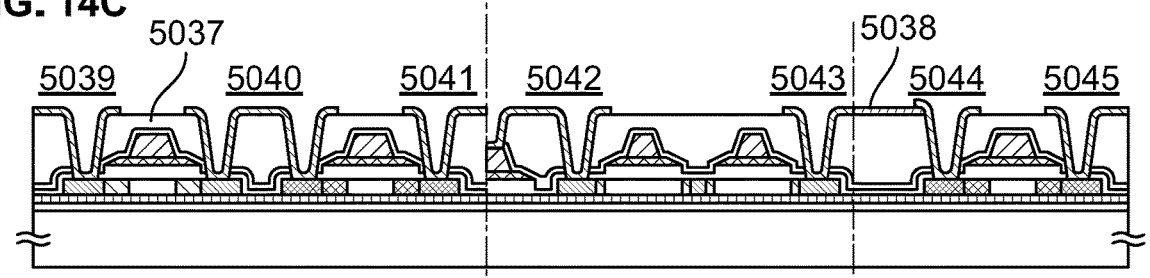

Next, as shown in FIG. 14C, heat treatment is performed for the recovery of crystallinity of the semiconductor layers and the activation of the impurity element added to the semiconductor layers. This heat treatment is performed by a thermal anneal method using a furnace anneal furnace. The thermal anneal method is preferably conducted in a nitrogen atmosphere in which an oxygen concentration is 1 ppm or less, preferably, 0.1 ppm or less at 400° C. to 700° C. In this embodiment, the heat treatment at 410° C. for 1 hour is performed for the activation processing. Note that a laser anneal method or a rapid thermal anneal method (RTA method) can be applied in addition to the thermal anneal method.

Also, the heat treatment may be performed before the formation of the first interlayer insulating film 5036. However, if materials which compose the first conductive layers 5015a to 5019a and the second conductive layers 5015b to 5019b are sensitive to heat, it is preferable that heat treatment is performed after the first interlayer insulating film 5036 (insulating film containing mainly silicon, for example, silicon nitride film) for protecting a wiring and the like is formed as in this embodiment.

As described above, when the heat treatment is performed after the formation of the first interlayer insulating film 5036 (insulating film containing mainly silicon, for example, silicon nitride film), the hydrogenation of the semiconductor layer can be also conducted simultaneously with the activation processing. In the hydrogenation step, a dangling bond of the semiconductor layer is terminated by hydrogen contained in the first interlayer insulating film 5036.

Note that heat treatment for hydrogenation which is different from the heat treatment for activation processing may be performed.

Here, the semiconductor layer can be hydrogenated regardless of the presence or absence of the first interlayer insulating film 5036. As another means for hydrogenation, means for using hydrogen excited by plasma (plasma hydrogenation) or means for performing heat treatment in an atmosphere containing hydrogen of 3% to 100% at 300° C. to 450° C. for 1 hour to 12 hours may be used.

Next, a second interlayer insulating film 5037 is formed on the first interlayer insulating film 5036. An inorganic insulating film can be used as the second interlayer insulating film 5037. For example, a silicon oxide film formed by a CVD method, a silicon oxide film applied by an SOG (spin on glass) method, or the like can be used. In addition, an organic insulating film can be used as the second interlayer insulating film 5037. For example, a film made of polyimide, polyamide, BCB (benzocyclobutene), acrylic, or the like can be used. Further, a laminate structure of an acrylic film and a silicon oxide film may be used.

In this embodiment, an acrylic film having a film thickness of 1.6 μm is formed. When the second interlayer insulating film 5037 is formed, unevenness caused by TFTs formed on the substrate 5000 is reduced and the surface can be leveled. In particular, the second interlayer insulating film 5037 has a strong sense of leveling. Thus, a film having superior evenness is preferable.

Next, using dry etching or wet etching, the second interlayer insulating film 5037, the first interlayer insulating film 5036, and the gate insulating film 5006 are etched to form contact holes which reach the third impurity regions 5025 and 5028 and the fourth impurity regions 5032 and 5034.

Next, a pixel electrode 5038 made from a transparent conductive film is formed. A compound of indium oxide and tin oxide (indium tin oxide: ITO), a compound of indium oxide and zinc oxide, zinc oxide, tin oxide, indium oxide, or the like can be used for the transparent conductive film. In addition, the transparent conductive film to which gallium is added may be used. The pixel electrode corresponds to the anode of an EL device.

In this embodiment, an ITO film is formed at a thickness of 110 nm and then patterned to form the pixel electrode 5038.

Next, wirings 5039 to 5045 electrically connected with the respective impurity regions are formed. Note that, in this embodiment, a Ti film having a film thickness of 100 nm, an Al film having a film thickness of 350 nm, and a Ti film having a film thickness of 100 nm are formed into a laminate in succession by a sputtering method and a resultant laminate film is patterned in a predetermined shape so that the wirings 5039 to 5045 are formed.

Of course, they are not limited to a three-layer structure. A single layer structure, a two-layer structure, or a laminate structure composed of four layers or more may be used. Materials of the wirings are not limited to Al and Ti, and therefore other conductive films may be used. For example, an Al film or a Cu film is formed on a TaN film, a Ti film is formed thereon, and then a resultant laminate film is patterned to form the wirings.

Thus, one of the source and the drain of an N-channel TFT in a pixel part is electrically connected with a source signal line (laminate of 5019a and 5019b) through the wiring 5042 and the other is electrically connected with the gate electrode of a P-channel TFT in the pixel part through the wiring 5043. In addition, one of the source and the drain of the P-channel TFT in the pixel part is electrically connected with a pixel electrode 5038 through the wiring 5044. Here, a portion on the pixel electrode 5038 and a portion of the wiring 5044 are overlapped with each other so that electrical connection between the wiring 5044 and the pixel electrode 5038 is produced.

Figure 14D:
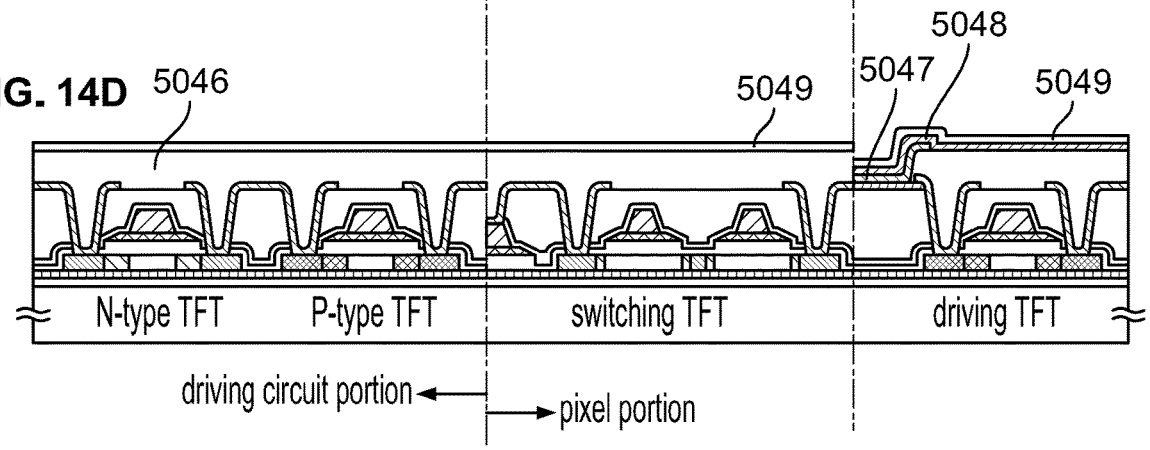

By the above steps, as shown in FIG. 14D, the driver circuit portion including the CMOS circuit composed of the N-channel TFT and the P-channel TFT and the pixel part including the switching TFT and the drive TFT can be formed on the same substrate.

The N-channel TFT in the driver circuit portion includes low concentration impurity regions 5026 (Lov regions) overlapped with the first conductive layer 5015a composing a portion of the gate electrode and high concentration impurity regions 5025 which each serve as the source region or the drain region. The P-channel TFT which is connected with the N-channel TFT through the wiring 5040 and composes the CMOS circuit includes low concentration impurity regions 5033 (Lov regions) overlapped with the first conductive layer 5016a composing a portion of the gate electrode and high concentration impurity regions 5032 which each serve as the source region or the drain region.

The N-channel switching TFT in the pixel part includes low concentration impurity regions 5029 (Loff regions) formed outside the gate electrode and high concentration impurity regions 5028 which each serve as the source region or the drain region. In addition, the P-channel drive TFT in the pixel part includes low concentration impurity regions 5035 (Lov regions) overlapped with the first conductive layer 5018a composing a portion of the gate electrode and high concentration impurity regions 5034 which each serve as the source region or the drain region.

Next, a third interlayer insulating film 5046 is formed. An inorganic insulating film or an organic insulating film can be used as the third interlayer insulating film. A silicon oxide film formed by a CVD method, a silicon oxide film applied by an SOG (spin on glass) method, or the like can be used as the inorganic insulating film. In addition, an acrylic resin film or the like can be used as the organic insulating film.

Examples of a combination of the second interlayer insulating film 5037 and the third interlayer insulating film 5046 will be described below.

There is a combination in which a laminate film stacked by acrylic and a silicon oxynitride film formed by a sputtering method is used as the second interlayer insulating film 5037, and a silicon oxynitride film formed by a sputtering method is used as the third interlayer insulating film 5046. In addition, there is a combination in which a silicon oxide film formed by an SOG method is used as the second interlayer insulating film 5037 and a silicon oxide film formed by an SOG method is used as the third interlayer insulating film 5046. In addition, there is a combination in which a laminate film of a silicon oxide film formed by an SOG method and a silicon oxide film formed by a plasma CVD method is used as the second interlayer insulating film 5037 and a silicon oxide film formed by a plasma CVD method is used as the third interlayer insulating film 5046. In addition, there is a combination in which acrylic is used for the second interlayer insulating film 5037 and acrylic is used for the third interlayer insulating film 5046. In addition, there is a combination in which a laminate film of an acrylic film and a silicon oxide film formed by a plasma CVD method is used as the second interlayer insulating film 5037 and a silicon oxide film formed by a plasma CVD method is used as the third interlayer insulating film 5046. In addition, there is a combination in which a silicon oxide film formed by a plasma CVD method is used as the second interlayer insulating film 5037 and acrylic is used for the third interlayer insulating film 5046.

An opening portion is formed at a position corresponding to the pixel electrode 5038 in the third interlayer insulating film 5046. The third interlayer insulating film serves as a bank. When a wet etching method is used at the formation of the opening portion, it can be easily formed as a side wall having a taper shape. If the side wall of the opening portion is not sufficiently gentle, the deterioration of an EL layer by a step becomes a marked problem. Thus, attention is required.

A carbon particle or a metallic particle may be added into the third interlayer insulating film to reduce resistivity, thereby suppressing the generation of static electricity. At this time, the amount of carbon particle or metallic particle to be added is preferably adjusted such that the resistivity becomes $1 \times 10^6$ $\Omega$m to $1 \times 10^{12}$ $\Omega$m (preferably, $1 \times 10^8$ $\Omega$m to $1 \times 10^{10}$ $\Omega$m).

Next, an EL layer 5047 is formed on the pixel electrode 5038 exposed in the opening portion of the third interlayer insulating film 5046.

An organic light emitting material or an inorganic light emitting material which are known can be used as the EL layer 5047.

A low molecular weight based organic light emitting material, a high molecular weight based organic light emitting material, or a medium molecular weight based organic light emitting material can be freely used as the organic light emitting material. Note that in this specification, a medium molecular weight based organic light emitting material indicates an organic light emitting material which has no sublimation property and in which the number of molecules is 20 or less or a length of chained molecules is 10 μm or less.

The EL layer 5047 has generally a laminate structure. Typically, there is a laminate structure of "a hole transporting layer, a light emitting layer, and an electron transporting layer". In addition to this, a structure in which "a hole injection layer, a hole transporting layer, a light emitting layer, and an electron transporting layer" or "a hole injection layer, a hole transporting layer, a light emitting layer, an electron transporting layer, and an electron injection layer" are laminated on an anode in this order may be used. A light emitting layer may be doped with fluorescent pigment or the like.

In this embodiment, the EL layer 5047 is formed by an evaporation method using a low molecular weight based organic light emitting material. Specifically, a laminate structure in which a copper phthalocyanine (CuPc) film having a thickness of 20 nm is provided as the hole injection layer and a tris-8-quinolinolato aluminum complex (Alq3) film having a thickness of 70 nm is provided thereon as the light emitting layer is used. A light emission color can be controlled by adding fluorescent pigment such as quinacridon, perylene, or DCM1 to Alq3.

Note that only one pixel is shown in FIG. 14D. However, a structure in which the EL layers 5047 corresponding to respective colors of, plural colors, for example, R (red), G (green), and B (blue) are separately formed can be used.

Also, as an example using the high molecular weight based organic light emitting material, the EL layer 5047 may be constructed by a laminate structure in which a polythiophene (PEDOT) film having a thickness of 20 nm is provided as the hole injection layer by a spin coating method and a paraphenylenevinylene (PPV) film having a thickness of about 100 nm is provided thereon as the light emitting layer. When 2l conjugated system polymer of PPV is used, a light emission wavelength from red to blue can be selected. In addition, an inorganic material such as silicon carbide can be used as the electron transporting layer and the electron injection layer.

Note that the EL layer 5047 is not limited to a layer having a laminate structure in which the hole injection layer, the hole transporting layer, the light emitting layer, the electron transporting layer, the electron injection layer, and the like are distinct. In other words, the EL layer 5047 may have a laminate structure with a layer in which materials composing the hole injection layer, the hole transporting layer, the light emitting layer, the electron transporting layer, the electron injection layer, and the like are mixed.

For example, the EL layer 5047 may have a structure in which a mixed layer composed of a material composing the electron transporting layer (hereinafter referred to as an electron transporting material) and a material composing the light emitting layer (hereinafter referred to as a light emitting material) is located between the electron transporting layer and the light emitting layer.

Next, a pixel electrode 5048 made from a conductive film is provided on the EL layer 5047. In the case of this embodiment, an alloy film of aluminum and lithium is used as the conductive film. Of course, a known MgAg film (alloy film of magnesium and silver) may be used. The pixel electrode 5048 corresponds to the cathode of the EL device. A conductive film made of an element which belongs to Group 1 or Group 2 of the periodic table or a conductive film to which those elements are added can be freely used as a cathode material.

When the pixel electrode 5048 is formed, the EL device is completed. Note that the EL device indicates a device composed of the pixel electrode (anode) 5038, the EL layer 5047, and the pixel electrode (cathode) 5048.

It is effective that a passivation film 5049 is provided to completely cover the EL device. A single layer of an insulating film such as a carbon film, a silicon nitride film, or a silicon oxynitride film, or a laminate layer of a combination thereof can be used as the passivation film 5049.

It is preferable that a film having good coverage is used as the passivation film 5049, and it is effective to use a carbon film, particularly, a DLC (diamond like carbon) film. The DLC film can be formed at a temperature range of from a room temperature to 100° C. Thus, a film can be easily formed over the EL layer 5047 having a low heat-resistance. In addition, the DLC film has a high blocking effect to oxygen so that the oxidization of the EL layer 5047 can be suppressed. Therefore, a problem in that the EL layer 5047 is oxidized can be prevented.

Note that, it is effective that steps up to the formation of the passivation film 5049 after the formation of the third interlayer insulating film 5046 are conducted in succession using a multi-chamber type (or in-line type) film formation apparatus without being exposed to air.

Note that, actually, when it is completed up to the state shown in FIG. 14D, in order not to be exposed to air, it is preferable that packaging (sealing) is conducted using a protective film (laminate film, ultraviolet curable resin film, or the like) or a transparent sealing member which has a high airtight property and low degassing. At this time, when an inner portion surrounded by the sealing member is made to an inert atmosphere or a hygroscopic material (for example, barium oxide) is located in the inner portion, the reliability of the EL device is improved.

Also, after an airtightnesslevel is increased by processing such as packaging, a connector (flexible printed circuit: FPC) for connecting terminals led from devices or circuits which are formed on the substrate 5000 with external signal terminals is attached so that it is completed as a product.

Also, according to the steps described in this embodiment, the number of photo masks required for manufacturing a semiconductor device can be reduced. As a result, the process is shortened and it can contribute to the reduction in manufacturing cost and the improvement of a yield.

Embodiment 5

In this embodiment, a process of manufacturing the active matrix substrate having a structure different from that described in Embodiment 4 will be described using FIGS. 15A to 15D.

Figure 15A:
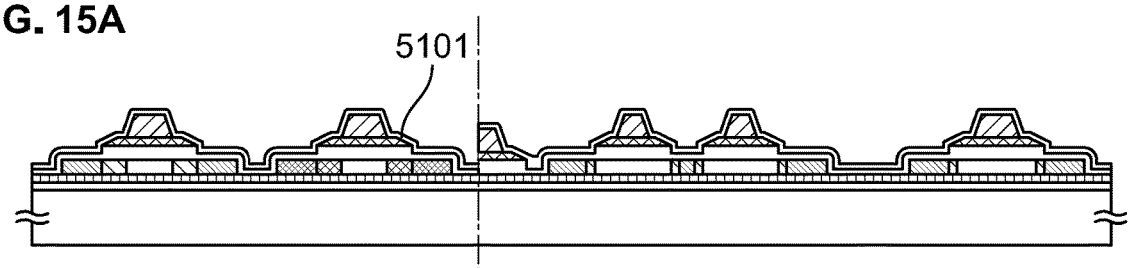
FIGS. 15A-15D are diagrams for explaining a process of manufacturing a light emitting device.

Note that, the steps up to the step shown in FIG. 15A are similar to those shown in FIGS. 13A to 13D and 14A in Embodiment 4. Note that it is different from Embodiment 4 at a point that a drive TFT composing a pixel part is an N-channel TFT having low concentration impurity regions (Loff regions) formed outside the gate electrode. With respect to the drive TFT, as described in Embodiment 4, the low concentration impurity regions (Loff regions) may be formed outside the gate electrode using a mask made of a resist.

Portions similar to FIGS. 13A to 13D and 14A to 14D are indicated using the same symbols and the description is omitted here.

As shown in FIG. 15A, a first interlayer insulating film 5101 is formed. An insulating film containing silicon is formed as the first interlayer insulating film 5101 at a thickness of 100 nm to 200 nm by a plasma CVD method or a sputtering method. In this embodiment, a silicon oxynitride film having a film thickness of 100 nm is formed by a plasma CVD method. Of course, the first interlayer insulating film 5101 is not limited to the silicon oxynitride film, and therefore another insulating film containing silicon may be used as a single layer or a laminate structure.

Figure 15B:
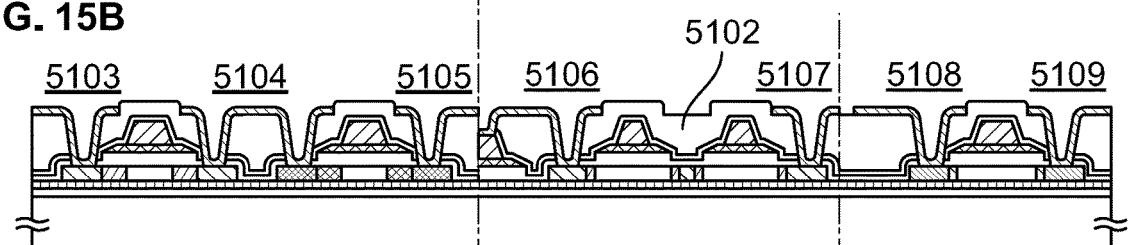

Next, as shown in FIG. 15B, heat treatment (thermal processing) is performed for the recovery of crystallinity of the semiconductor layers and the activation of the impurity element added to the semiconductor layers. This heat treatment is performed by a thermal anneal method using a furnace anneal furnace. The thermal anneal method is preferably conducted in a nitrogen atmosphere in which an oxygen concentration is 1 ppm or less, preferably, 0.1 ppm or less at 400° C. to 700° C. In this embodiment, the heat treatment at 410° C. for 1 hour is performed for the activation processing. However, if a laser anneal method or a rapid thermal anneal method (RTA method) can be applied in addition to the thermal anneal method.

Also, the heat treatment may be performed before the formation of the first interlayer insulating film 5101. Note that, the first conductive layers 5015a to 5019a and the second conductive layers 5015b to 5019b are sensitive to heat, it is preferable that heat treatment is performed after the first interlayer insulating film 5101 (insulating film containing mainly silicon, for example, silicon nitride film) for protecting a wiring and the like is formed as in this embodiment.

As described above, when the heat treatment is performed after the formation of the first interlayer insulating film 5101 (insulating film containing mainly silicon, for example, silicon nitride film), the hydrogenation of the semiconductor layer can be also conducted simultaneously with the activation processing. In the hydrogenation step, a dangling bond of the semiconductor layer is terminated by hydrogen contained in the first interlayer insulating film 5101.

Note that heat treatment for hydrogenation other than the heat treatment for activation processing may be performed. Here, the semiconductor layer can be hydrogenated regardless of the presence or absence of the first interlayer insulating film 5101. As another means for hydrogenation, means for using hydrogen excited by plasma (plasma hydrogenation) or means for performing heat treatment in an atmosphere containing hydrogen of 3% to 100% at 300° C. to 450° C. for 1 hour to 12 hours may be used.

By the above steps, the driver circuit portion including the CMOS circuit composed of the N-channel TFT and the P-channel TFT and the pixel part including the switching TFT and the drive TFT can be formed on the same substrate.

Next, a second interlayer insulating film 5102 is formed on the first interlayer insulating film 5101. An inorganic insulating film can be used as the second interlayer insulating film 5102. For example, a silicon oxide film formed by a CVD method, a silicon oxide film applied by an SOG (spin on glass) method, or the like can be used. In addition, an organic insulating film can be used as the second interlayer insulating film 5102. For example, a film made of polyimide, polyamide, BCB (benzocyclobutene), acrylic, or the like can be used. Further, a laminate structure of an acrylic film and a silicon oxide film may be used. Still further, a laminate structure of an acrylic film and a silicon oxynitride film formed by a sputtering method may be used.

Next, using dry etching or wet etching, the first interlayer insulating film 5101, the second interlayer insulating film 5102, and the gate insulating film 5006 are etched to form contact holes which reach impurity regions (third impurity regions (N+ regions) and fourth impurity regions (P+ regions)) of respective TFTs which compose the driver circuit portion and the pixel part.

Next, wirings 5103 to 5109 electrically connected with the respective impurity regions are formed. Note that, in this embodiment, a Ti film having a film thickness of 100 nm, an Al film having a film thickness of 350 nm, and a Ti film having a film thickness of 100 nm are formed in succession by a sputtering method and a resultant laminate film is patterned in a predetermined shape so that the wirings 5103 to 5109 are formed.

Of course, they are not limited to a three-layer structure. A single layer structure, a two-layer structure, or a laminate structure composed of four layers or more may be used. Materials of the wirings are not limited to Al and Ti, and therefore other conductive films may be used. For example, it is preferable that an Al film or a Cu film is formed on a TaN film, a Ti film is formed thereon, and then a resultant laminate film is patterned to form the wirings.

One of the source region and the drain region of a switching TFT in a pixel part is electrically connected with a source signal line (laminate of 5019*a* and 5019*b*) through the wiring 5106 and the other is electrically connected with the gate electrode of a drive TFT in the pixel part through the wiring 5107.

Figure 15C:
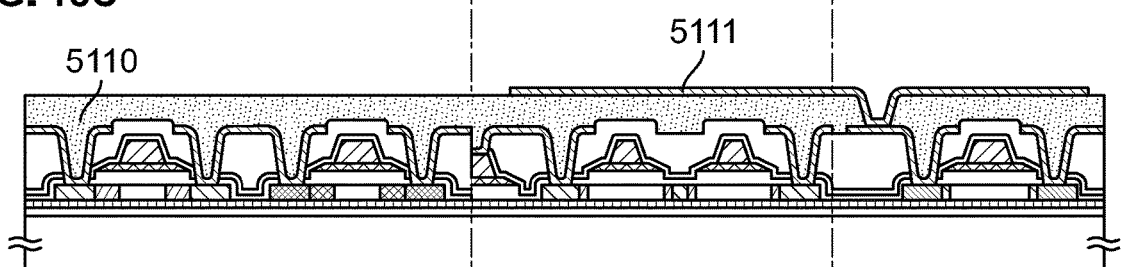

Next, as shown in FIG. 15C, a third interlayer insulating film 5110 is formed. An inorganic insulating film or an organic insulating film can be used as the third interlayer insulating film 5110. A silicon oxide film formed by a CVD method, a silicon oxide film applied by an SOG (spin on glass) method, or the like can be used as the inorganic insulating film. In addition, as the organic insulating film, used may be an acrylic resin film or the like, and, may be a laminate structure of an acrylic film and a silicon oxynitride film formed by a sputtering method.

When the third interlayer insulating film 5110 is formed, unevenness caused by TFTs formed on the substrate 5000 is reduced and the surface can be leveled. In particular, the third interlayer insulating film 5110 is for leveling. Thus, a film having superior evenness is preferable.

Next, using dry etching or wet etching, the third interlayer insulating film 5110 is etched to form contact holes which reach the wiring 5108.

Next, a conductive film is patterned to form a pixel electrode 5111. In the case of this embodiment, an alloy film of aluminum and lithium is used as the conductive film. Of course, a known MgAg film (alloy film of magnesium and silver) may be used. The pixel electrode 5111 corresponds to the cathode of the EL device. A conductive film made of an element which belongs to Group 1 or Group 2 of the periodic table or a conductive film to which those elements are added can be freely used as a cathode material.

The pixel electrode 5111 is electrically connected with the wiring 5108 through a contact hole formed in the third interlayer insulating film 5110. Thus, the pixel electrode 5111 is electrically connected with one of the source region and the drain region of the drive TFT.

Figure 15D:
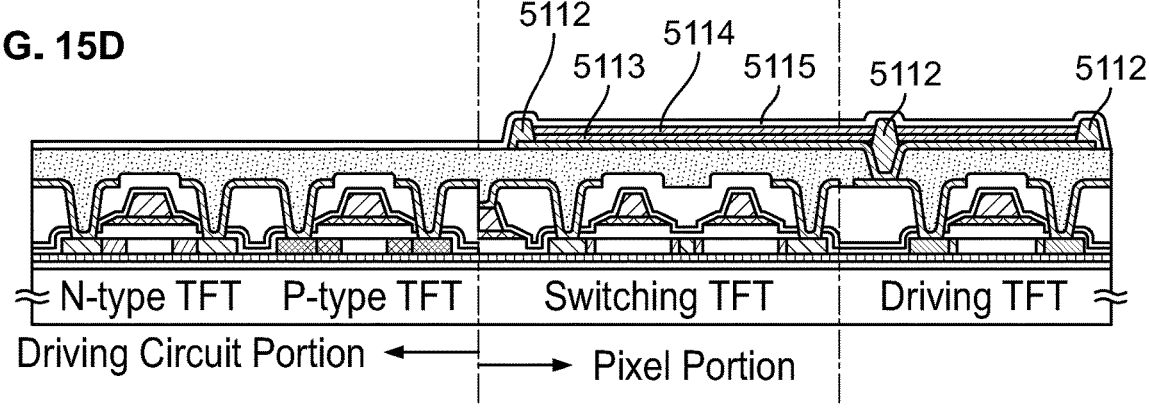

Next, as shown in FIG. 15D, banks 5112 are formed such that EL layers of respective pixels are separated from each other. The banks 5112 are formed from an inorganic insulating film or an organic insulating film. A silicon oxynitride film formed by a sputtering method, a silicon oxide film formed by a CVD method, or a silicon oxide film applied by an SOG method, and the like can be used as the inorganic insulating film. In addition, an acrylic resin film or the like can be used as the organic insulating film.

Here, when a wet etching method is used at the formation of the banks 5112, they can be easily formed as side walls having taper shapes. If the side walls of the banks 5112 are not sufficiently gentle, the deterioration of an EL layer caused by a step becomes a marked problem. Thus, attention is required.

Note that, when the pixel electrode 5111 and the wiring 5108 are electrically connected with each other, the banks 5112 are formed in portions of the contact holes formed in the third interlayer insulating film 5110. Thus, unevenness of the pixel electrode caused by unevenness of the contact hole portions is leveled by the banks 5112 so that the deterioration of the EL layer caused by the step is prevented.

Examples of a combination of the third interlayer insulating film 5110 and the banks 5112 will be described below.

There is a combination in which a laminate film stacked by an acrylic and a silicon oxynitride film formed by a sputtering method is used as the third interlayer insulating film 5110 and a silicon oxynitride film formed by a sputtering method is used as the banks 5112. In addition, there is a combination in which a silicon oxide film formed by an SOG method is used as the third interlayer insulating film 5110 and a silicon oxide film formed by an SOG method is used as the banks 5112. In addition, there is a combination in which a laminate film of a silicon oxide film formed by an SOG method and a silicon oxide film formed by a plasma CVD method is used as the third interlayer insulating film 5110 and a silicon oxide film formed by a plasma CVD method is used as the banks 5112. In addition, there is a combination in which acrylic is used for the third interlayer insulating film 5110 and acrylic is used for the banks 5112. In addition, there is a combination in which a laminate film of an acrylic film and a silicon oxide film formed by a plasma CVD method is used as the third interlayer insulating film 5110 and a silicon oxide film formed by a plasma CVD method is used as the banks 5112. In addition, there is a combination in which a silicon oxide film formed by a plasma CVD method is used as the third interlayer insulating film 5110 and acrylic is used for the banks 5112.

A carbon particle or a metallic particle may be added into the banks 5112 to reduce resistivity, thereby suppressing the generation of static electricity. At this time, the amount of carbon particle or metallic particle to be added is preferably adjusted such that the resistivity becomes $1\times10^6$ Ωm to $1\times10^{12}$ Ωm (preferably, $1\times10^8$ Ωm to $1\times10^{10}$ Ωm).

Next, an EL layer 5113 is formed on the pixel electrode 5111 which is surrounded by the banks 5112 and exposed.

An organic light emitting material or an inorganic light emitting material, which is known, can be used as the EL layer 5113.

A low molecular weight based organic light emitting material, a high molecular weight based organic light emitting material, or a medium molecular weight based organic light emitting material can be freely used as the organic light emitting material. Note that in this specification, a medium molecular weight based organic light emitting material indicates an organic light emitting material which has no sublimation property and in which the number of molecules is 20 or less or a length of chained molecules is 10 μm or less.

The EL layer 5113 has generally a laminate structure. Typically, there is a laminate structure of "a hole transporting layer, a light emitting layer, and an electron transporting layer". In addition to this, a structure in which "an electron transporting layer, a light emitting layer, a hole transporting layer, and an hole injection layer" or "an electron injection layer, a light emitting layer, an hole transporting layer, and a hole injection layer" are laminated on an cathode in this order may be used. A light emitting layer may be doped with fluorescent pigment or the like.

In this embodiment, the EL layer 5113 is formed by an evaporation method using a low molecular weight based organic light emitting material. Specifically, a laminate structure in which a tris-8-quinolinolato aluminum complex (Alq3) film having a thickness of 70 nm is provided as the light emitting layer and a copper phthalocyanine (CuPc) film having a thickness of 20 nm is provided thereon as the light emitting layer is used. A light emission color can be controlled by adding fluorescent pigment such as quinacridon, perylene, or DCM1 to Alq3.

Note that only one pixel is shown in FIG. 15D. However, a structure in which the EL layers 5113 corresponding to respective colors of, plural colors, for example, R (red), G (green), and B (blue) are separately formed can be used.

Also, as an example using the high molecular weight based organic light emitting material, the EL layer 5113 may be constructed by a laminate structure in which a polythiophene (PEDOT) film having a thickness of 20 nm is provided as the hole injection layer by a spin coating method and a paraphenylenevinylene (PPV) film having a thickness of about 100 nm is provided thereon as the light emitting layer. When π conjugated system polymer of PPV is used, a light emission wavelength from red to blue can be selected. In addition, an inorganic material such as silicon carbide can be used for the electron transporting layer and the electron injection layer.

Note that the EL layer 5113 is not limited to a layer having a laminate structure in which the hole injection layer, the hole transporting layer, the light emitting layer, the electron transporting layer, the electron injection layer, and the like are distinct. In other words, the EL layer 5113 may have a laminate structure with a layer in which materials composing the hole injection layer, the hole transporting layer, the light emitting layer, the electron transporting layer, the electron injection layer, and the like are mixed.

For example, the EL layer 5113 may have a structure in which a mixed layer composed of a material composing the electron transporting layer (hereinafter referred to as an electron transporting material) and a material composing the light emitting layer (hereinafter referred to as a light emitting material) is located between the electron transporting layer and the light emitting layer.

Next, a pixel electrode 5114 made from a transparent conductive film is formed on the EL layer 5113. A compound of indium oxide and tin oxide (ITO), a compound of indium oxide and zinc oxide, zinc oxide, tin oxide, indium oxide, or the like can be used for the transparent conductive film. In addition, the transparent conductive film to which gallium is added may be used. The pixel electrode 5114 corresponds to the anode of the EL device.

When the pixel electrode 5114 is formed, the EL device is completed. Note that the EL device indicates a diode composed of the pixel electrode (cathode) 5111, the EL layer 5113, and the pixel electrode (anode) 5114.

In this embodiment, the pixel electrode 5114 is made from the transparent conductive film. Thus, light emitted from the EL device is radiated to an opposite side to the substrate 5000. In addition, through the third interlayer insulating film 5110, the pixel electrode 5111 is formed in the layer different from the layer in which the wirings 5106 to 5109 are formed. Thus, an aperture ratio can be increased as compared with the structure described in Embodiment 4.

It is effective that a protective film (passivation film) 5115 is provided to completely cover the EL device. A single layer of an insulating film such as a carbon film, a silicon nitride film, or a silicon oxynitride film, or a laminate layer of a combination thereof can be used as the protective film 5115.

Note that, when light emitted from the EL device is radiated from the pixel electrode 5114 side as in this embodiment, it is necessary to use a film which transmits light as a protective film 5115.

Note that it is effective that steps up to the formation of the protective film 5115 after the formation of the banks 5112 are conducted in succession using a multi-chamber type (or in-line type) film formation apparatus without being exposed to air.

Note that, actually, when it is completed up to the state shown in FIG. 15D, in order not to be exposed to air, it is preferable that packaging (sealing) is conducted using a protective film (laminate film, ultraviolet curable resin film, or the like) or a sealing member which has a high airtight property and low degassing. At the same time, when an inner portion surrounded by the sealing member is made to an inert atmosphere or a hygroscopic material (for example, barium oxide) is located in the inner portion, the reliability of the EL device is improved.

Also, after an airtightness level is improved by processing such as packaging, a connector (flexible printed circuit: FPC) for connecting terminals led from devices or circuits which are formed on the substrate 5000 with external signal terminals is attached so that it is completed as a product.

Embodiment 6

In this embodiment, an example in which a light emitting device is manufactured according to the present invention will be described using FIGS. 30A to 30C.

FIG. 30A is a top view of a light emitting device produced by sealing a device substrate in which TFTs are formed with a sealing member. FIG. 30B is a cross sectional view along a line A-A' in FIG. 30A. FIG. 30C is a cross sectional view along a line B-B' in FIG. 30A.

A seal member 4009 is provided to surround a pixel part 4002, a source signal line driver circuit 4003, and first and second gate signal line driver circuits 4004a and 4004b which are provided on a substrate 4001. In addition, a sealing member 4008 is provided over the pixel part 4002, the source signal line driver circuit 4003, and the first and second gate signal line driver circuits 4004a and 4004b. Thus, the pixel part 4002, the source signal line driver circuit 4003, and the first and second gate signal line driver circuits 4004a and 4004b are sealed with the substrate 4001, the seal member 4009 and the sealing member 4008 and filled with a filling agent 4210.

Also, the pixel part 4002, the source signal line driver circuit 4003, and the first and second gate signal line driver circuits 4004a and 4004b which are provided on the substrate 4001 each have a plurality of TFTs. In FIG. 30B, TFTs (note that an N-channel TFT and a P-channel TFT are shown here) 4201 included in the source signal line driver circuit 4003 and a TFT 4202 included in the pixel part 4002, which are formed on a base film 4010 are typically shown.

An interlayer insulating film (planarization film) 4301 is formed on the TFTs 4201 and 4202, and a pixel electrode (anode) 4203 electrically connected with the drain of the TFT 4202 is formed thereon. A transparent conductive film having a large work function is used as the pixel electrode 4203. A compound of indium oxide and tin oxide, a compound of indium oxide and zinc oxide, zinc oxide, tin oxide, or indium oxide can be used for the transparent conductive film. In addition, the transparent conductive film to which gallium is added may be used.

An insulating film 4302 is formed on the pixel electrode 4203. An opening portion is formed in the insulating film 4302 on the pixel electrode 4203. In the opening portion, an organic light emitting layer 4204 is formed on the pixel electrode 4203. An organic light emitting material or an inorganic light emitting material which are known can be used as the organic light emitting layer 4204. In addition, the organic light emitting material includes a low molecular weight based (monomer system) material and a high molecular weight based (polymer system) material, and any material may be used.

An evaporation technique or an applying method technique which are known is preferably used as a method of forming the organic light emitting layer 4204. In addition, a laminate structure or a single layer structure which is obtained by freely combining a hole injection layer, a hole transporting layer, a light emitting layer, an electron transporting layer, and an electron injection layer.

A cathode 4205 made from a conductive film having a light shielding property (typically, a conductive film containing mainly aluminum, copper, or silver, or a laminate film of the conductive film and another conductive film) is formed on the organic light emitting layer 4204. In addition, it is desirable that moisture and oxygen which exist in an interface between the cathode 4205 and the organic light emitting layer 4204 are minimized. Thus, a devise is required in which the organic light emitting layer 4204 is formed in a nitrogen atmosphere or a noble gas atmosphere and the cathode 4205 without being exposed to oxygen and moisture is formed. In this embodiment, the above film formation is possible by using a multi-chamber type (cluster tool type) film formation apparatus. A predetermined voltage is supplied to the cathode 4205.

By the above steps, a light emitting device 4303 composed of the pixel electrode (anode) 4203, the organic light emitting layer 4204, and the cathode 4205 is formed. A protective film 4209 is formed on the insulating film 4302 so as to cover the light emitting device 4303. The protective film 4209 is effective to prevent oxygen, moisture, and the like from penetrating the light emitting device 4303.

Reference numeral 4005a denotes a lead wiring connected with a power source, which is connected with a first electrode of the TFT 4202. The lead wiring 4005a is passed between the seal member 4009 and the substrate 4001 and electrically connected with an FPC wiring 4301 of an FPC 4006 through an anisotropic conductive film 4300.

A glass material, a metallic member (typically, a stainless member), a ceramic member, a plastic member (including a plastic film) can be used as the sealing member 4008. An FRP (fiberglass reinforced plastic) plate, a PVF (polyvinyl fluoride) film, a Mylar film, a polyester film, or an acrylic resin film can be used as the plastic member. In addition, a sheet having a structure in which aluminum foil is sandwiched by a PVF film and a Mylar film can be used.

Note that, when a radiation direction of light from the light emitting device is toward a cover member side, it is required that the cover member is transparent. In this case, a transparent material such as a glass plate, a plastic plate, a polyester film, or acrylic film is used.

Also, in addition to an inert gas such as nitrogen or argon, ultraviolet curable resin or thermal curable resin can be used for the filling agent 4210. PVC (polyvinyl chloride), acrylic, polyimide, epoxy resin, silicon resin, PVB (polyvinyl butyral), or EVA (ethylene vinyl acetate) can be used. In this embodiment, nitrogen is used for the filling agent.

Also, in order to expose the filling agent 4210 to a hygroscopic material (preferably barium oxide) or a material capable of absorbing oxygen, a concave portion 4007 is provided to the surface of the sealing member 4008 in the substrate 4001 side, and the hygroscopic material or the material capable of absorbing oxygen which is indicated by 4207 is located. In order to prevent the material 4207 having a hygroscopic property or being capable of absorbing oxygen from flying off, the material 4207 having a hygroscopic property or being capable of absorbing oxygen is held in the concave portion 4007 by a concave cover member 4208. Note that concave cover member 4208 is formed in a fine meshed shape and constructed such that it transmits air and moisture but does not transmit the material 4207 having a hygroscopic property or being capable of absorbing oxygen. When the material 4207 having a hygroscopic property or being capable of absorbing oxygen is provided, the deterioration of the light emitting device 4303 can be suppressed.

As shown in FIG. 30C, a conductive film 4203a is formed on the lead wiring 4005a such that it is in contact with the lead wiring 4005a simultaneously with the formation of the pixel electrode 4203.

Also, the anisotropic conductive film 4300 has a conductive filler 4300a. When the substrate 4001 and the FPC 4006 are bonded to each other by thermal compression, the conductive film 4203a located over the substrate 4001 and the FPC wiring 4301 located on the FPC 4006 are electrically connected with each other through the conductive filler 4300a.

Embodiment 7

In this embodiment, an external light emitting quantum efficiency can be remarkably improved by using an EL material by which phosphorescence from a triplet exciton can be employed for emitting a light. As a result, the power consumption of the EL device can be reduced, the lifetime of the EL device can be elongated and the weight of the EL device can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical formula 1)

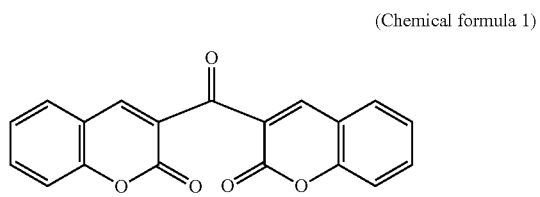 [SMILES: O=C(c1cc2ccccc2oc1=O)c1cc2ccccc2oc1=O]

(M. A. Baldo, D. F. O□ Brien, Y. You, A. Shoustikov, S. Sibley, M. E. Thompson, S. R. Forrest, Nature 395 (1998) p. 151)

The molecular formula of an EL material (Pt complex) reported by the above article is represented as follows.

(Chemical formula 2)

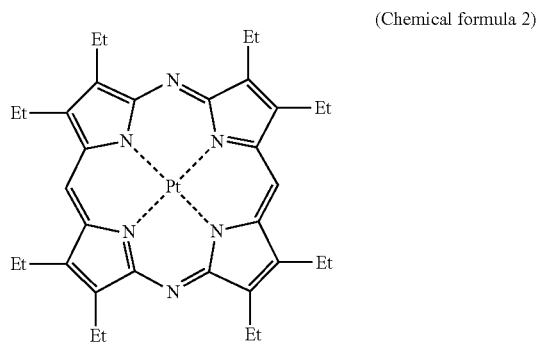

(M. A. Baldo, S. Lamansky, P. E. Burrows, M. E. Thompson, S. R. Forrest, Appl. Phys. Lett., 75 (1999) p. 4.)
(T. Tsutsui, M.-J. Yang, M. Yahiro, K. Nakamura, T. Watanabe, T. Tsuji, Y Fukuda, T. Wakimoto, S. Mayaguchi, Jpn, Appl. Phys., 38 (12B) (1999) L1502)

The molecular formula of an EL material (Ir complex) reported by the above article is represented as follows.

(Chemical formula 3)

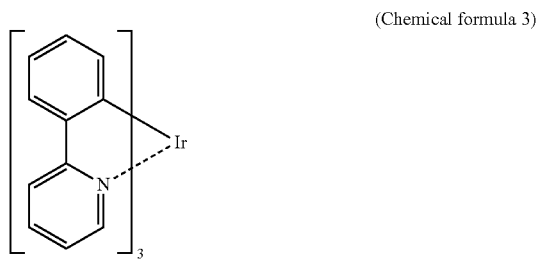

As described above, if phosphorescence from a triplet exciton can be put to practical use, it can realize the external light emitting quantum efficiency three to four times as high as that in the case of using fluorescence from a singlet exciton in principle.

Embodiment 8

Figure 32A:
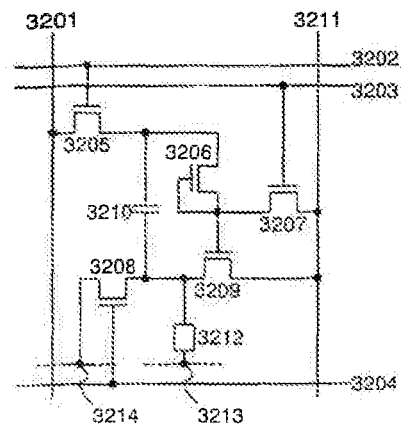
FIGS. 32A-32E are diagrams for explaining an additional structural example that differs from the embodiment modes of the present invention.

Although p-channel TFTs are used in the driver TFTs for the structures disclosed up to this point in this specification, it is also possible to apply the present invention to a structure in which n-channel TFTs are used in the driver TFTs. The structure is shown in FIG. 32A.

A driver TFT 3209 is an n-channel TFT. In this case, a source region is a side connected to an anode of an EL device 3212, and a drain region is a side connected to an electric current supply line 3211. A capacitive means 3210 is formed at a node at which the voltage between the gate and the source of the driver TFT 3209 can be stored. The capacitive means 3210 may therefore also be formed between a gate electrode of the driver TFT 3209 and a source region of the driver TFT 3209, in addition to the node shown in FIG. 32A.

Figure 32B:
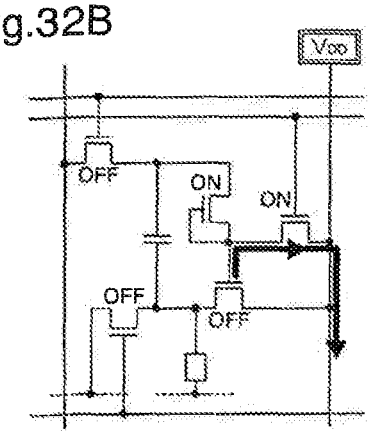
Figure 32C:
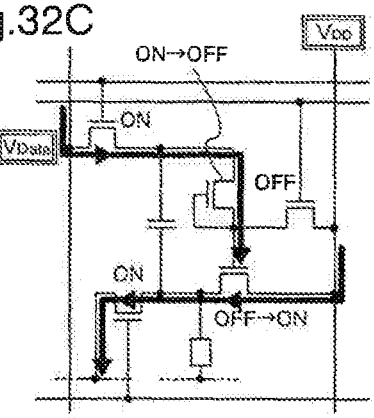
Figure 32D:
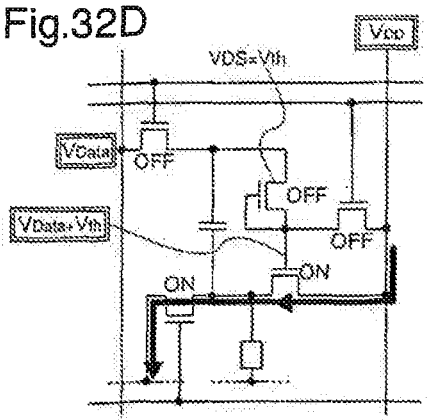
Figure 32E:
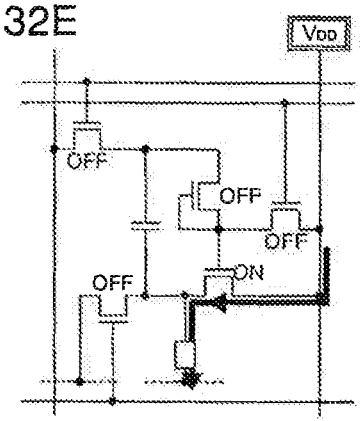

Operation is explained. First, a TFT 3207 is turned on, and the electric potential of a drain region of a TFT 3206 is set high, as shown in FIG. 32B. The TFT 3205 then turns on as shown in FIG. 32C, and input of an image signal is performed. The TFT 3206 turns off at the point when the voltage between its source and drain becomes equal to the threshold value of the TFT 3206, resulting in a state as shown in FIG. 32D. The electric potential of a source region of the TFT 3206 is VData, and therefore the electric potential of the drain region of the TFT 3206, that is the electric potential of the gate electrode of the driver TFT 3209, is VData+Vth.

If a TFT 3208 then turns off, electric current flowing from the electric current supply line through the driver TFT 3209 flows into the EL device 3212, which then emits light. Even if there is dispersion in the threshold voltages of the driver TFTs 3209 between adjacent pixels, the voltage between the source and the drain of the TFT 3206, namely the threshold voltage of the TFT 3206, is added to the image signal regardless of such dispersion, and therefore dispersion in the voltages between the gate and the source of the driver TFTs 3209 does not occur between adjacent pixels.

In addition, the voltage between an anode and a cathode increases when there is degradation of the EL device 3212 due to light emission with the structure shown in FIG. 32. Normally, this would cause a problem in which the electric potential of the source region of the TFT 3209 rises, thus making the voltage between the gate and the source during light emission smaller as a result. In accordance with the structure disclosed in Embodiment 8, however, the electric potential of the source region of the driver TFT 3209 is fixed at the electric potential of an electric power source line 3214 by turning the TFT 3208 on during input of the image signal in FIGS. 32C and 32D. The capacitive means 3210 therefore stores the voltage between the gate and the source of the driver TFT 3209 as discussed above, and the voltage between the gate and the source does not become smaller even if the electric potential of the source region of the driver TFT 3209 changes. Reduction in brightness over time can therefore be suppressed.

Note that the TFT 3206, which is diode connected, and the driver TFT 3209 are n-channel TFTs in Embodiment 8. All other TFTs are only used as switching devices for performing only on and off control, and therefore may be of any polarity.

Further, the wirings may also be shared as in the case where the driver TFT is a p-channel TFT. For example, a gate signal line 3203 for controlling the TFT 3207 may also be used as a gate signal line of the previous stage. Furthermore, it is also possible for the electric power source line 3214 to be shared with a gate signal line of any row except for the one currently being selected, provided that the gate signal line has a fixed electric potential, during a period for performing the operations of FIGS. 32C and 32D. An electric power source line 3213 and the electric power source line 3214 may also be shared.

Further, the addition of TFTs and other steps may be taken if an erasure period is provided, similar to the case in which the driver TFT is a p-channel TFT, and a means for cutting off electric current supplied to the EL device 3212 during an arbitrary period may also be formed.

Embodiment 9

An example of a different circuit structure utilizing a voltage effect caused by a diode connection is explained in Embodiment 9.

Figure 33A:
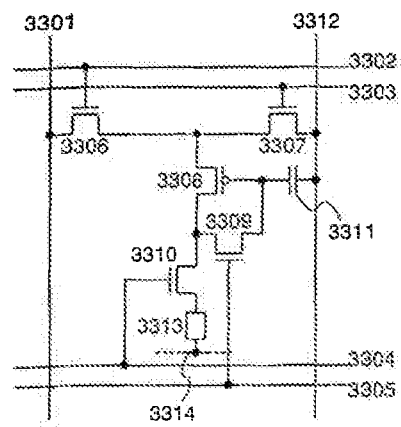
FIGS. 33A-33E are diagrams for explaining an additional structural example that differs from the embodiment modes of the present invention.

An example structure is shown in FIG. 33A. A TFT 3309 is formed between a gate electrode and a drain electrode of a TFT 3309, and the TFT 3308 exhibits the behavior as a diode connected TFT when the TFT 3309 is on. The TFT 3309 behaves as a driver TFT for performing control of electric current supplied to an EL device 3313 when the TFT 3309 is off.

Figure 33B:
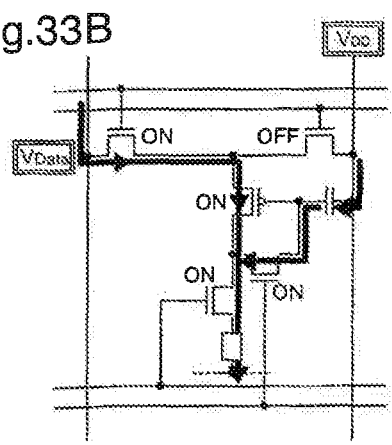
Figure 33C:
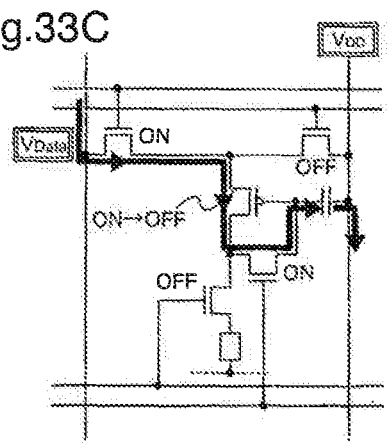
Figure 33D:
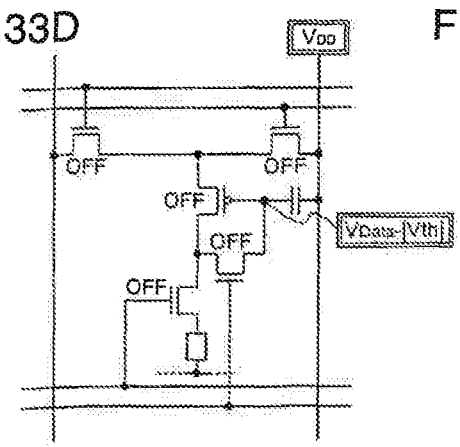

Operation is explained. First, the TFT 3306 turns on, and an image signal VData is input as shown in FIG. 33B. In addition, the TFT 3309 and a TFT 3310 turn on, and the TFT 3308 thus behaves as a diode connected TFT. When the TFT 3310 then turns off, electric charge moves as shown in FIG. 33C. The voltage between the source and the drain of the TFT 3308, in other words the voltage between the gate and the source of the TFT 3308, eventually becomes equal to the threshold voltage, at which point the TFT 3308 turns off as shown in FIG. 33D.

Figure 33E:
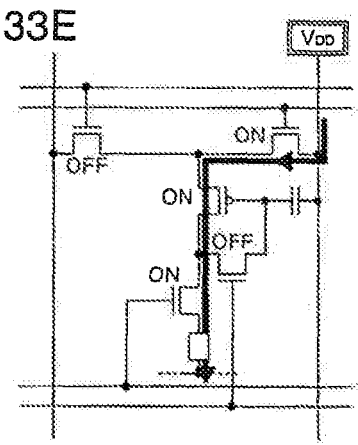

The TFTs 3307 and 3310 then turn on. The electric potential of a source region of the TFT 3308 increases from VData to VDD as the TFT 3307 turns on. The voltage between the gate and the source of the TFT 3308 therefore exceeds the threshold voltage to cause it to turn on, so that electric current flows in the EL device 3313 to cause it to emit light, as shown in FIG. 33E.

Thus, an electric potential difference equal to the threshold value can be produced between the gate and the source of the driver TFT 3308 in advance in accordance with the above processes, so that even if there is dispersion in the threshold voltages of the TFTs 3308 between adjacent pixels, there is no dispersion in the voltages between the gate and the source of the driver TFTs 3308 of adjacent pixels. In addition, correction of dispersions in the threshold values is performed in the foregoing embodiments by a method in which the threshold voltage of a diode connected TFT is added to the image signal, and then input to the gate electrode of another driver TFT. However, satisfactory correction cannot be performed by this method for cases in which there is dispersion in the threshold voltages between the diode connected TFT and the driver TFT. In contrast, the same TFT is used for the TFT that acquires the threshold value by a diode connection and the driver TFT in accordance with the structure of Embodiment 9 shown in FIG. 33A. Therefore, even if dispersion occurs in the threshold values between adjacent TFTs, the threshold value of the above TFT itself is used as it is for the correction, and therefore threshold value correction is performed correctly in all cases.

Further, the TFT 3310 can also be used as an erasure TFT when applying a driving method that uses a digital time gray scale method. In addition, the erasure TFT can be placed in any location, provided that it is a location at which electric current supplied to the EL device can be cut off at an arbitrary timing.

Figure 34A:
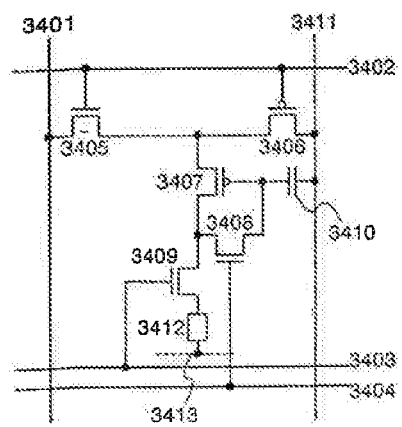
FIGS. 34A and 34B are diagrams for explaining an additional structural example that differs from the embodiment modes of the present invention.
Figure 34B:
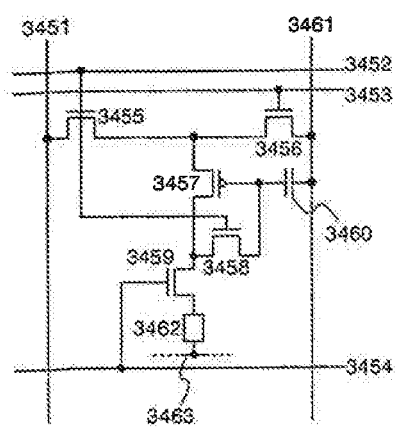

Furthermore, a gate signal line for controlling a TFT can be shared among a plurality of TFTs, as shown in FIGS. 34A and 34B. For example, the TFT 3306 and the TFT 3307 are controlled so as to turn on and off at mutually opposite timings, and therefore the polarity of one of the TFTs may be made opposite to the polarity of the other TFT, and both of the TFTs can thus be controlled by the same gate signal line 3402, as shown in FIG. 34A. Similarly, the TFT 3306 and the TFT 3309 in FIG. 33A are controlled to turn on and off at the same timing. They can therefore be controlled by using the same gate signal line 3452, as shown in FIG. 34B. The structures shown in FIGS. 34A and 34B may also be combined, of course.

TFTs 3409 and 3459 can also be used as erasure TFTs here.

Embodiment 10

Figure 35A:
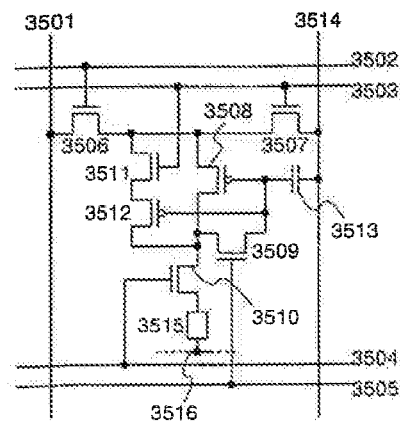
FIGS. 35A-35E are diagrams for explaining an additional structural example that differs from the embodiment modes of the present invention.
Figure 35B:
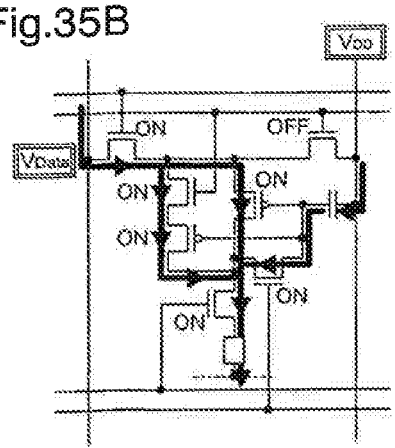
Figure 35C:
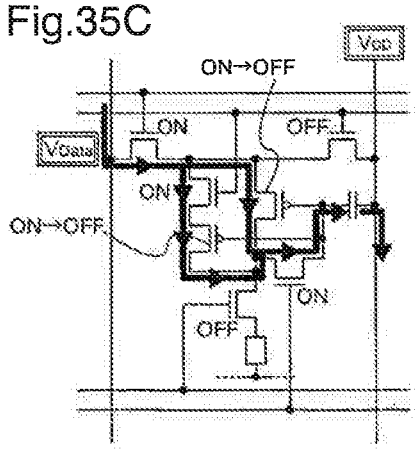
Figure 35D:
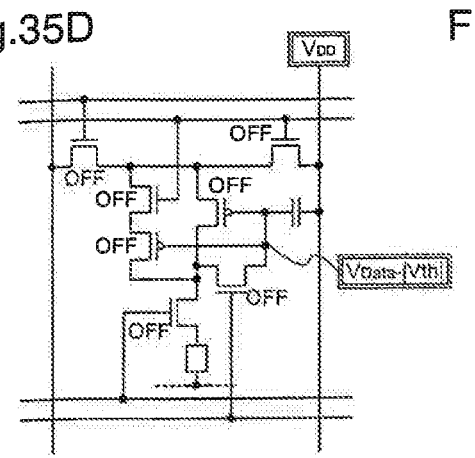
Figure 35E:
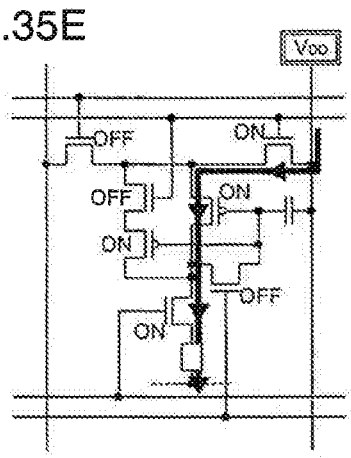

Threshold voltage acquisition can be performed at high speed by adding TFTs 3511 and 3512, as shown in FIG. 35A, to the structure shown in FIG. 33A. Two TFTs, a TFT 3508 and a TFT 3512, are used in a period for performing threshold voltage acquisition, as shown in FIGS. 35B and 35C, and only one TFT, the TFT 3508, is used in a period for supplying electric current to an EL device 3515 for during light emission, as shown in FIG. 35E. Threshold voltage acquisition can be performed at very high speed by making a channel length L and a channel width W of the TFT 3512 such that W/L becomes larger.

It is also possible to use a TFT 3510 as an erasure TFT in this case.

Embodiment 11

In the structures shown FIGS. 33 to 35, there are cases in which electric current flows in the EL device to cause light emission, before or after threshold voltage acquisition, that is during a period that is not the normal light emitting period. In these cases the value of the electric current flowing in the EL device is not necessarily equal to the image signal plus the correct threshold value, and this therefore causes errors to develop between the actual brightness and the target brightness.

Figure 36A:
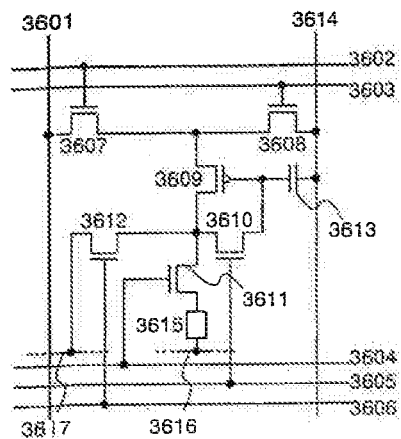
FIGS. 36A-36E are diagrams for explaining an additional structural example that differs from the embodiment modes of the present invention.
Figure 36B:
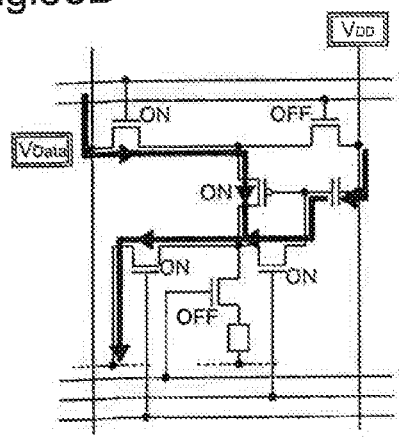
Figure 36C:
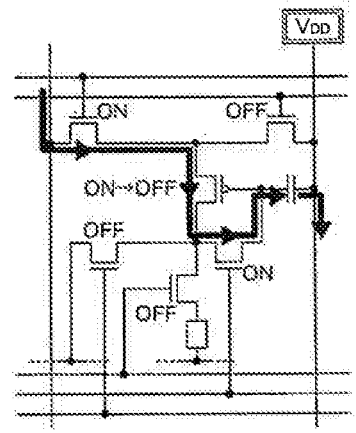
Figure 36D:
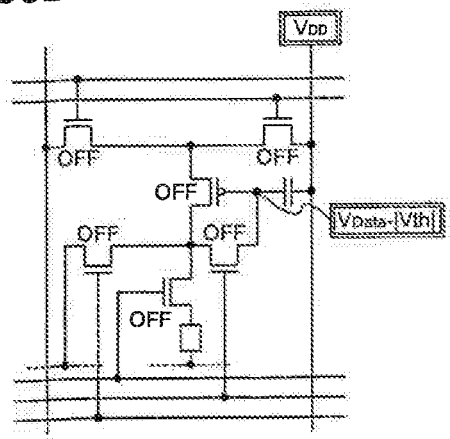
Figure 36E:
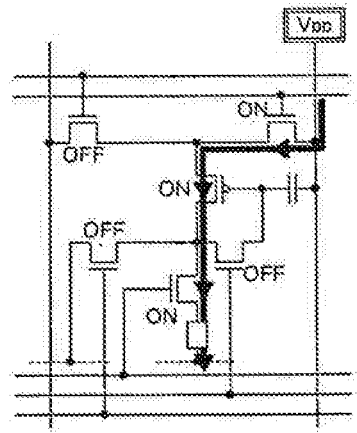

A TFT 3612 is therefore added as shown in FIG. 36A. Electric current flowing in the TFT 3609 during input of the image signal flows through the TFT 3612 and to an electric power source line 3617. An electric current path to the EL device 3615 is cut off by a TFT 3611, and therefore the EL device 3615 does not emit light. Light emission by the EL device during unnecessary periods can thus be prevented by using this type of structure.

It is also possible to use the TFT 3611 as an erasure TFT in this case.

Further, the electric power source line 3617 may also be shared with a gate signal line of another row, similar to other embodiments. In addition, it is possible for a gate signal line 3604 and a gate signal line 3606 to be shared with each other. However, it is necessary to adjust the electric potentials of an electric power source line 3616 and the electric power source line 3617 so that electric current does not flow to the EL device 3615 when the TFT 3612 is on.

Embodiment 12

Figure 37A:
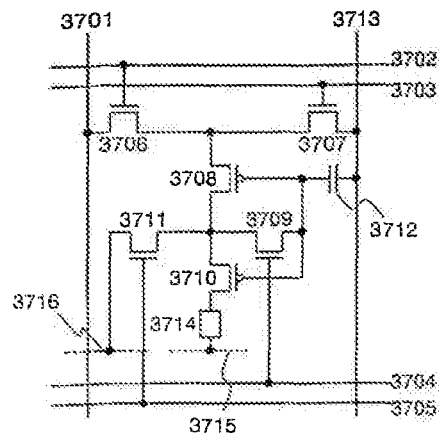
FIGS. 37A-37E are diagrams for explaining an additional structural example that differs from the embodiment modes of the present invention.

The structure shown in FIG. 37A can be given as an additional structure for performing the threshold voltage acquisition at higher speed. TFTs 3708 and 3709, which have the same polarity, are connected in series as driver TFTs. P-channel TFTs are used here. Further, a TFT 3709, which connects a gate electrode and a drain region of the driver TFT 3708, is also structured to connect a gate electrode and a source region of the driver TFT 3710 at the same time.

Figure 37B:
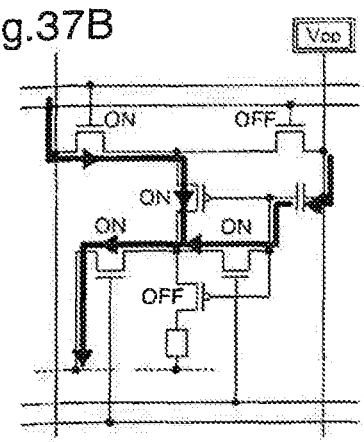
Figure 37C:
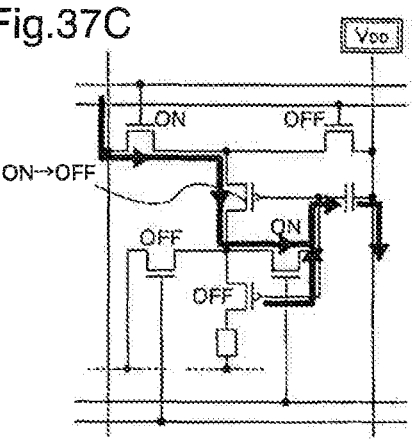
Figure 37D:
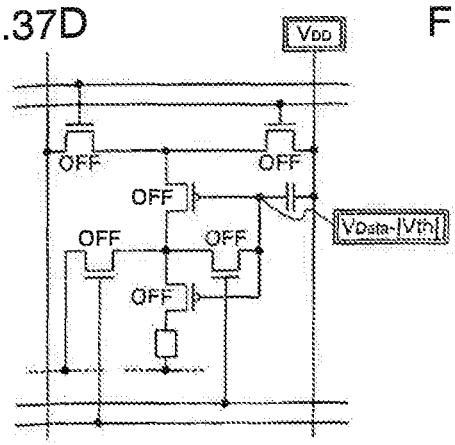

As shown in FIGS. 37B and 37C, the driver TFT 3708 behaves as a diode connected TFT by turning the TFT 3709 on in a period for acquiring the threshold voltage from an image signal input, and the threshold voltage can be acquired between the source and the drain. The TFT 3708 is made to perform high speed acquisition of the threshold voltage by making W/L larger at this time. On the other hand, if one looks at the TFT 3710, which is connected in series with the driver TFT 3708, there is obtained a connection between the gate electrode and the source region of the TFT 3710 when the TFT 3709 turns on. That is, the voltage between the gate and the source of the driver TFT 3710 becomes zero when the TFT 3709 turns on in this period, so that the TFT 3710 turns off. Electric current therefore does not flow in the EL device 3714, but rather flows through the TFT 3711 to the electric power source line 3716.

Figure 37E:
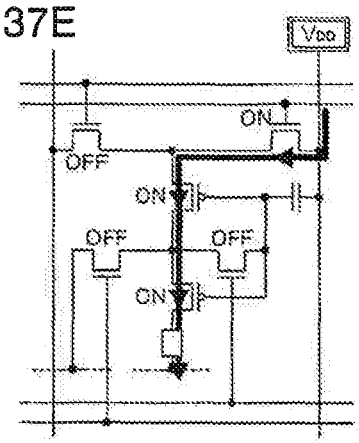

The TFT 3709 is turned off in the subsequent light emitting period, and the connection between the gate electrode and the source region of the driver TFT 3710 is cut off. A part of an electric charge storing the threshold voltage of the driver TFT 3708 therefore moves to the gate electrode of the driver TFT 3710, and the TFT 3710 automatically turns on. The driver TFTs 3708 and 3710 have a connection between their gate electrodes at this point, and therefore operate as a multi-gate TFT. L therefore becomes larger during light emission than during threshold voltage acquisition. The electric current flowing through the driver TFTs 3708 and 3710 thus becomes very small. In other words, the electric current flowing in the EL device can be made small even if W/L is made large for the driver TFT 3708. Electric current consequently flows through both of the driver TFTs 3708 and 3710 into the EL device 3714, which then emits light, as shown in FIG. 37E. Light emission by the EL device during unnecessary periods can therefore be suppressed, similar to the case of FIG. 36.

Note that the voltage between the gate and the source of the driver TFT 3710 can be forcibly set to zero, to turn the driver TFT 3710 off, by turning the TFT 3709 on for cases in which an erasure period is formed, and therefore EL light emission can be stopped.

Further, the electric power source line 3716 can also be shared with a gate signal line of another row, similar to other embodiments. Furthermore, the gate signal lines may also be shared as shown in FIGS. 34A and 34B.

Embodiment 13

A structure differing from that of Embodiment 8 for a case of using an n-channel TFT in a driver TFT is explained in Embodiment 13.

Figure 38A:
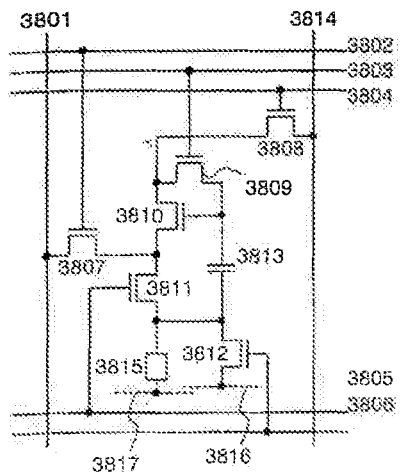
FIGS. 38A-38E are diagrams for explaining an additional structural example that differs from the embodiment modes of the present invention.

FIG. 38A shows an example structure. The basic structural principle is similar to those of other embodiments, and a TFT 3809 is formed in a position for connecting a gate electrode and a drain electrode of a driver TFT 3810.

Figure 38B:
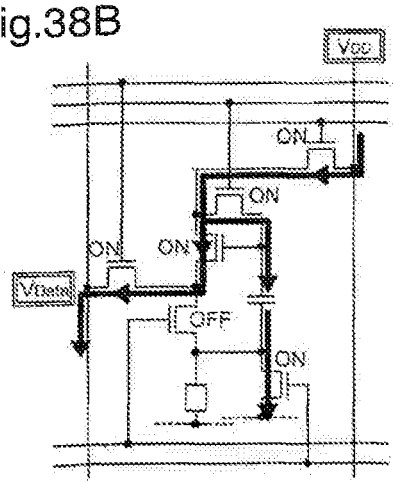
Figure 38C:
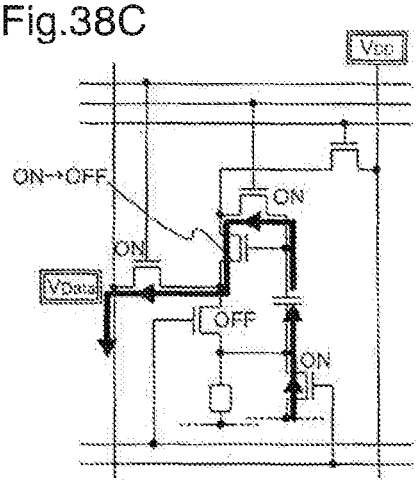
Figure 38D:
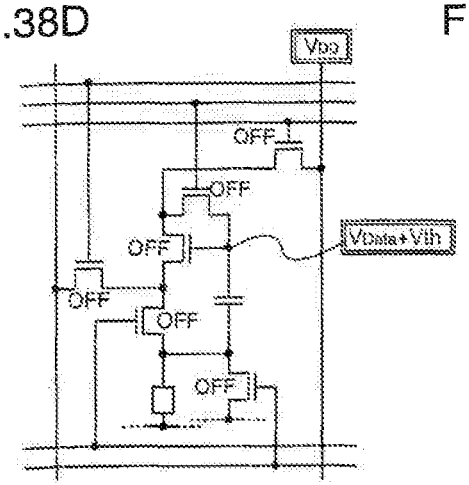

Operation is explained. An image signal VData is input, and movement of electric charge is caused as shown in FIG. 38B. By turning a TFT 3811 off at this point, an EL device 3815 is made not to emit light. Acquisition of the threshold voltage of the TFT 3810 is then performed as shown in FIG. 38C, and the TFT 3810 turns off when the voltage between the source and the drain of the TFT 3810 eventually becomes equal to its threshold voltage. Acquisition of the threshold voltage is thus complete, as shown in FIG. 38D.

Figure 38E:
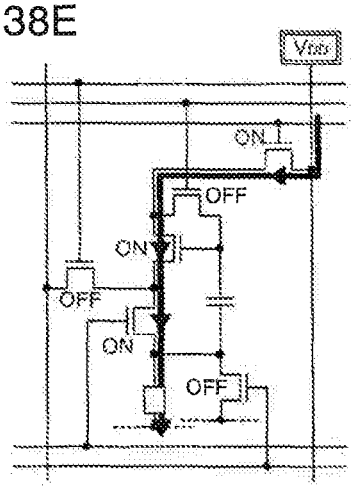

A TFT 3808 and the TFT 3811 are then turned on, electric current flows as shown in FIG. 38E, and the EL device 3815 emits light. Note that a capacitive means 3813 may be formed at a location for storing the voltage between the gate and the source of the TFT 3810 during light emission. Even if the electric potential of an anode of the EL device 3815 increases due to degradation of the EL device 3815 over time, the voltage between the gate and the source of the TFT 3810 is thus prevented from becoming smaller. This can contribute to deterring drops in brightness caused by degradation of the EL device 3815.

It is also possible to use the TFT 3811 as an erasure TFT in this case.

Further, the electric power source line 3817 can also be shared with a gate signal line of another row, similar to other embodiments. Furthermore, the gate signal lines may also be shared as shown in FIGS. 34A and 34B.

Embodiment 14

Figure 39A:
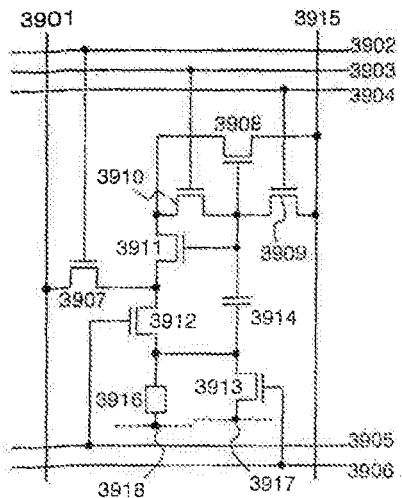
FIGS. 39A-39E are diagrams for explaining an additional structural example that differs from the embodiment modes of the present invention.

An additional example of a structure using an n-channel TFT in a driver TFT is shown in FIG. 39A. TFTs 3908 and 3911 are connected in series as driver TFTs, and a gate electrode and a drain region of the TFT 3911 are connected by a TFT 3911. The TFT 3910 also connects a gate electrode and a source region of the TFT 3908 at the same time.

Figure 39B:
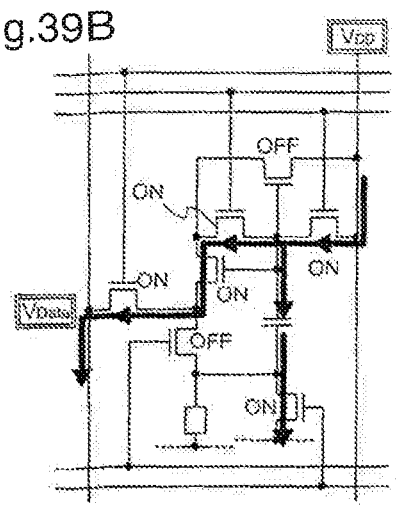

Movement of electric charge occurs as shown in FIG. 39B during image signal input. The gate electrode and the drain region of the TFT 3911 are connected by turning the TFT 3910 on at this point, and the TFT 3911 behaves as a diode connected TFT. On the other hand, the gate electrode and the source region of the TFT 3908 are similarly connected by turning the TFT 3910 on, that is, the voltage between the gate and the source of the TFT 3908 becomes zero, and therefore electric current does not flow.

Figure 39C:
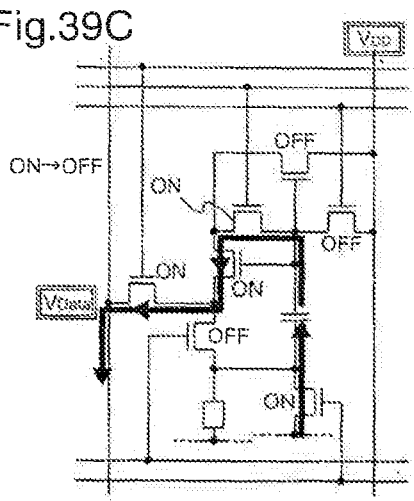
Figure 39D:
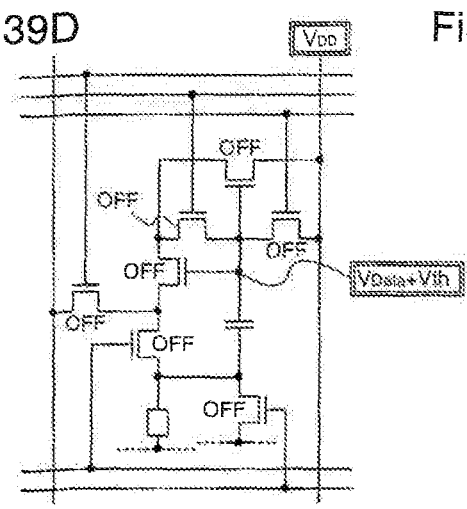

Electric charge then moves as shown in FIG. 39C if the TFT 3909 is turned off, and acquisition of the threshold voltage of the TFT 3911 is performed. The TFT 3911 turns off at the point when the voltage between the source and the drain of the TFT 3911 becomes equal to the threshold voltage. Acquisition of the threshold voltage is thus complete, as shown in FIG. 39D.

Figure 39E:
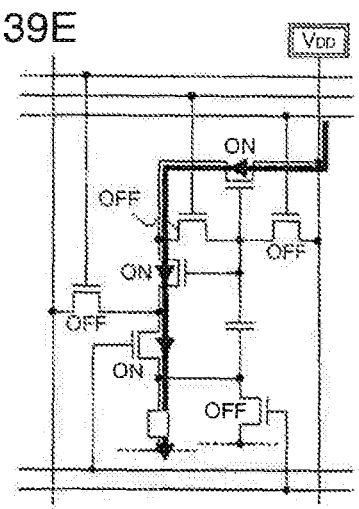

Electric current then flows in an EL device 3916 as shown in FIG. 39E, and the EL device 3916 emits light. Note that a capacitive means 3914 may be formed at a location for storing the voltage between the gate and the source of the TFT 3911 during light emission. Even if the electric potential of an anode of the EL device 3916 increases due to degradation of the EL device 3916 over time, the voltage between the gate and the source of the TFT 3911 is thus prevented from becoming smaller. This can contribute to deterring drops in brightness caused by degradation of the EL device 3916.

The gate electrodes of the driver TFTs 3908 and 3911 are also connected here, similar to the structure shown in FIG. 37, and therefore the driver TFTs 3908 and 3911 each function as a multi-gate TFT. The electric current flowing in the EL device 3916 can therefore be made small, even if W/L of the driver TFT 3911 is increased in order to perform threshold voltage acquisition at higher speed.

It is also possible to use a TFT 3912, or the TFT 3910, as an erasure TFT here. An electric current path to the EL device 3916 can be cut off by turning the TFT 3912 off. Further, the voltage between the gate and the source of the driver TFT 3908 is forcibly set to zero, to turn the TFT 3908 off, by turning the TFT 3910 on, and therefore light emission by the EL device 3916 can be stopped.

Embodiment 15

The method disclosed in Embodiment 10 can also be applied to a structure using an n-channel TFT in a driver TFT. An example structure is shown in FIG. 40A.

Figure 40A:
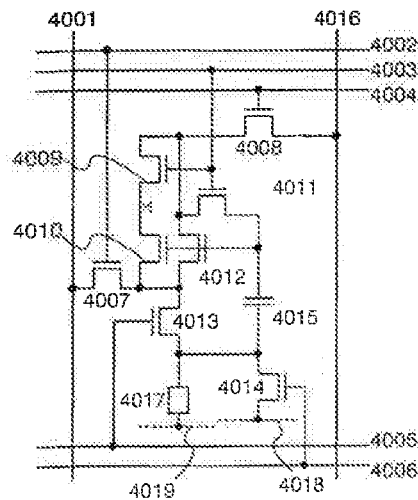
FIGS. 40A-40E are diagrams for explaining an additional structural example that differs from the embodiment modes of the present invention.
Figure 40B:
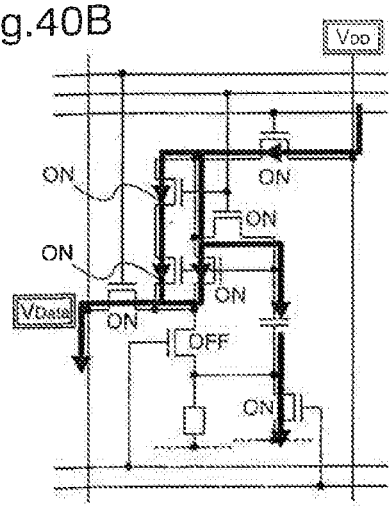
Figure 40C:
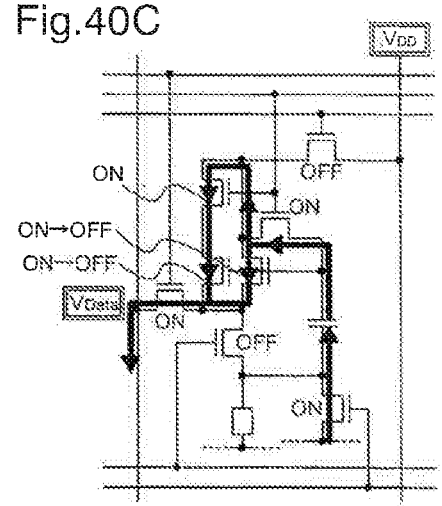
Figure 40D:
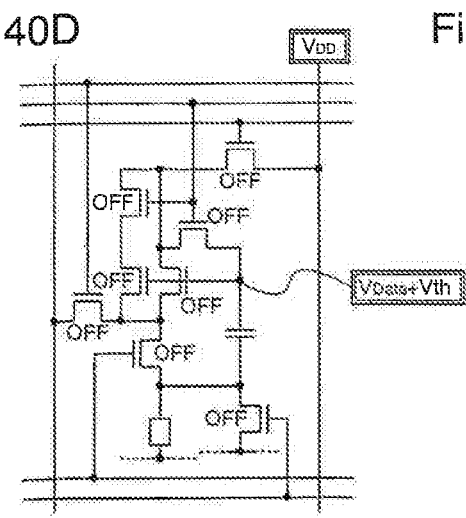
Figure 40E:
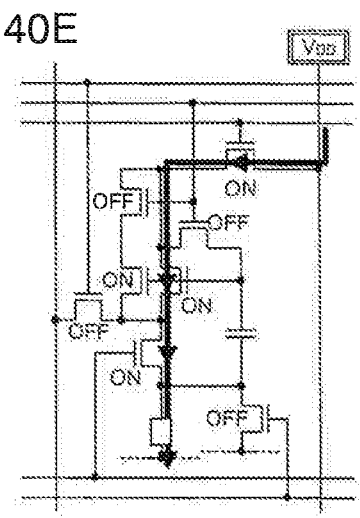

The structure shown in FIG. 40A is one in which TFTs 4009 and 4010 are added to the structure shown in FIG. 38A. The TFTs 4010 and 4012 are disposed in parallel, and both of the TFTs 4010 and 4012, connected in parallel as shown in FIG. 40C, are used in a period for threshold voltage acquisition. The TFT 4009 is turned off during a light emitting period, and electric current is supplied to an EL device 4017 only through the TFT 4012. Acquisition of the threshold voltage can be performed at higher speed by making W/L of the TFT 4010, which is not used as an electric current path during the light emitting period, larger.

It is also possible to use a TFT 4013 as an erasure TFT in this case.

Embodiment 16

A phenomenon in which current flows between the source and the drain of a transistor used for making corrections, while causing short circuit between the gate and the drain thereof to turn the transistor into a diode, whereby there is a, and the voltage between the source and the drain of the transistor becomes equal to the threshold value of the transistor, is utilized as a method of correcting the threshold value of the transistor in the present invention, but it is also possible to apply this method to a driver circuit, not only to a pixel portion as introduced by the present invention.

A current source circuit in a driver circuit for outputting current to pixels and the like can be given as an example. The current source circuit is a circuit for outputting a desired current from an input voltage signal. The voltage signal is input to a gate electrode of a current source transistor within the current source circuit, and a current corresponding to the voltage between the gate and the source of the current source transistor is output through the current source transistor. That is, the threshold value correction method of the present invention is used in correcting the threshold value of the current source transistor.

Figure 41A:
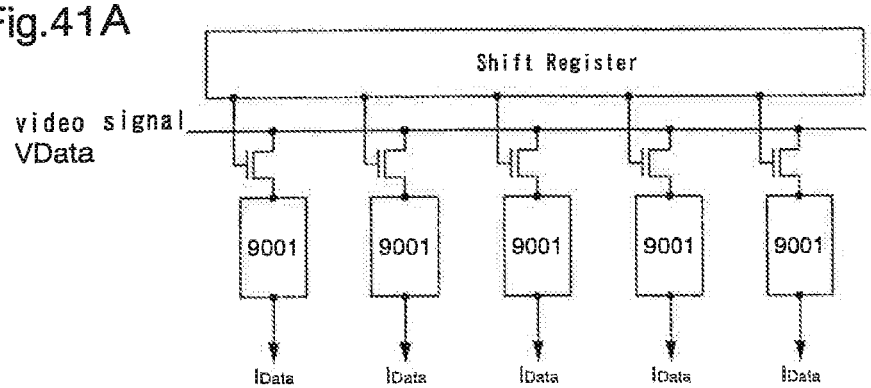
FIGS. 41A and 41B are diagrams showing an example of structuring an electric current source circuit by use of a threshold value correction principle of the present invention.

An example of an application of the current source circuit is shown in FIG. 41A. Sampling pulses are output one after another from a shift register circuit, the sampling pulses are each input to a current source circuit 9001, and sampling of a video signal is performed in accordance with the timing at which the sampling pulses are input to the current source circuit 9001. Sampling operations are performed in a dot sequential manner in this case.

Figure 41B:
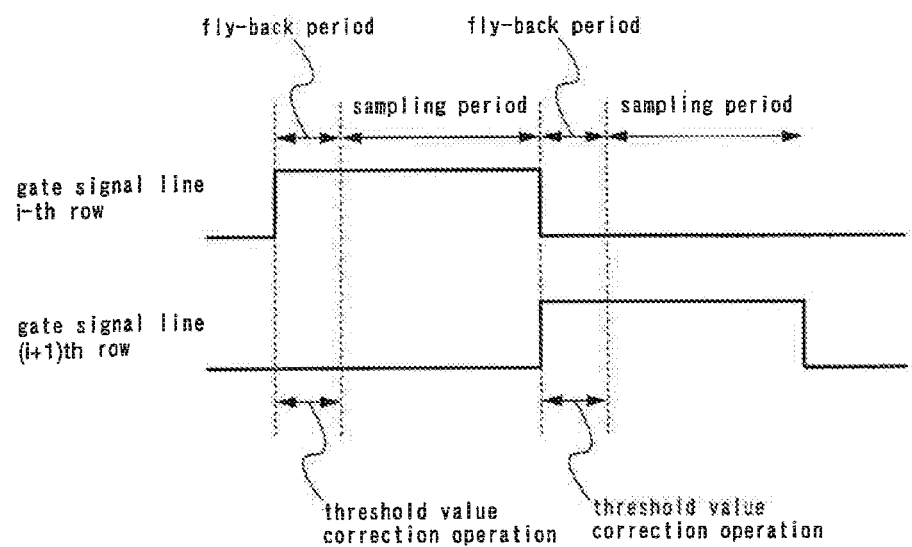

A simple operation timing is shown in FIG. 41B. A period during which an i-th gate signal line is selected is divided into a period for outputting the sampling pulses from the shift register and performing sampling of the video signal, and a fly-back period. The threshold value correction operations of the present invention, that is, a series of operations including the initialization of the electric potential of each portion, the acquisition of transistor threshold value voltages, or the like is performed during this fly-back period. That is, the threshold value acquisition operations can be performed per single horizontal period.

Figure 42A:
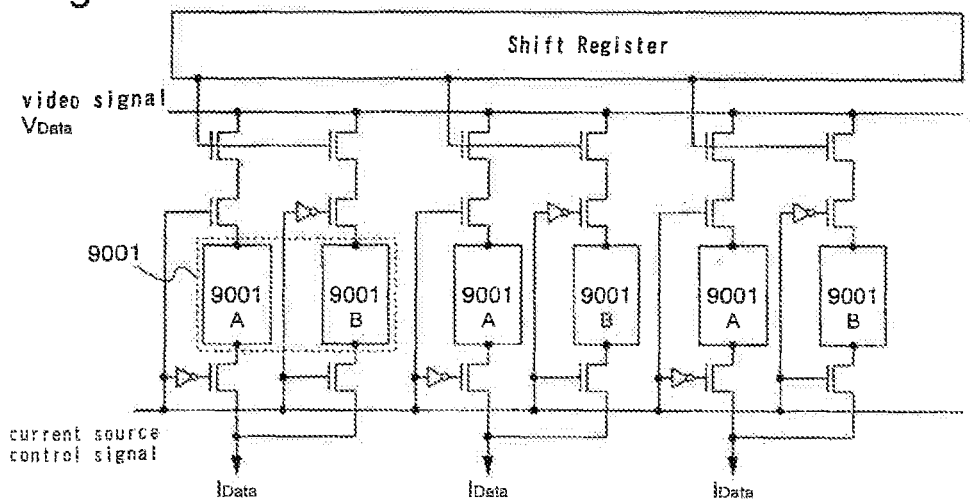
FIGS. 42A and 42B are diagrams showing an example of structuring an electric current source circuit by use of a threshold value correction principle of the present invention.

The structure of a driver circuit, which differs from that of FIG. 41, for outputting current to pixels and the like is shown in FIG. 42A. Points of difference with the case of FIG. 41 are that the current source circuit 9001, which is controlled by one stage of sampling pulses, becomes two current source circuits 9001A and 9001B, and operations of both circuits are selected by a current source control signal.

Figure 42B:
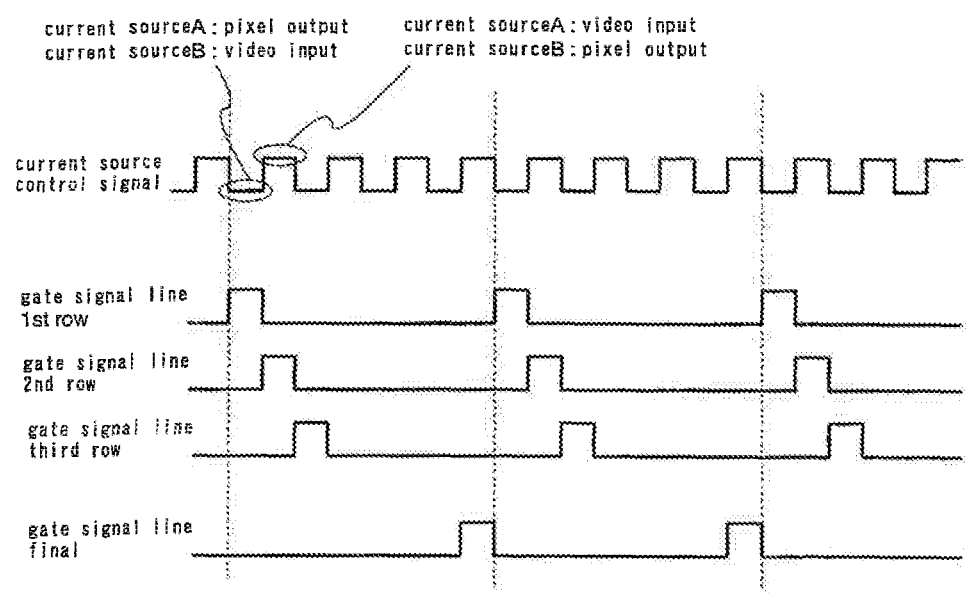

The current source control signal is switched per single horizontal period, for example, as shown in FIG. 42B. The operations of the current source circuits 9001A and 9001B are thus performed such that one performs current output to the pixels and the like, while the other performs video signal input and the like. This is switched every row. Sampling operations are thus performed in a line sequential manner in this case.

The driver circuit of another different structure is shown in FIG. 43A. It doesn't matter whether the video signal is digital or analog in FIG. 41 and FIG. 42, but a digital video signal is input with the structure of FIG. 43A. The input digital video signal is taken in by a first latch circuit in accordance with output sampling pulses, is transferred to a second latch circuit after the video signals corresponding to one row have been taken in, and then output to each of the current source circuits 9001A to 9001C. The values of the currents output by each of the current source circuits 9001A to 9001C differ from each other. For example, the ratio of the current values may become 1:2:4. That is, the output current value can be changed linearly by disposing n current source circuits in parallel, setting the ratio of their current values to 1:2:4: . . . :2(n−1), and adding the currents output from each of the current source circuits.

Operation timing is nearly similar to that shown in FIG. 41, and threshold value correction operations in the current source circuit 9001 are performed within a fly-back period during which sampling operations are not performed. Data stored in the latch circuit is then transferred, V-I conversion is performed in the current source circuit 9001, and current is output to pixels. The sampling operations are performed in a line sequential manner, similar to the structure shown in FIG. 42.

Figure 44A:
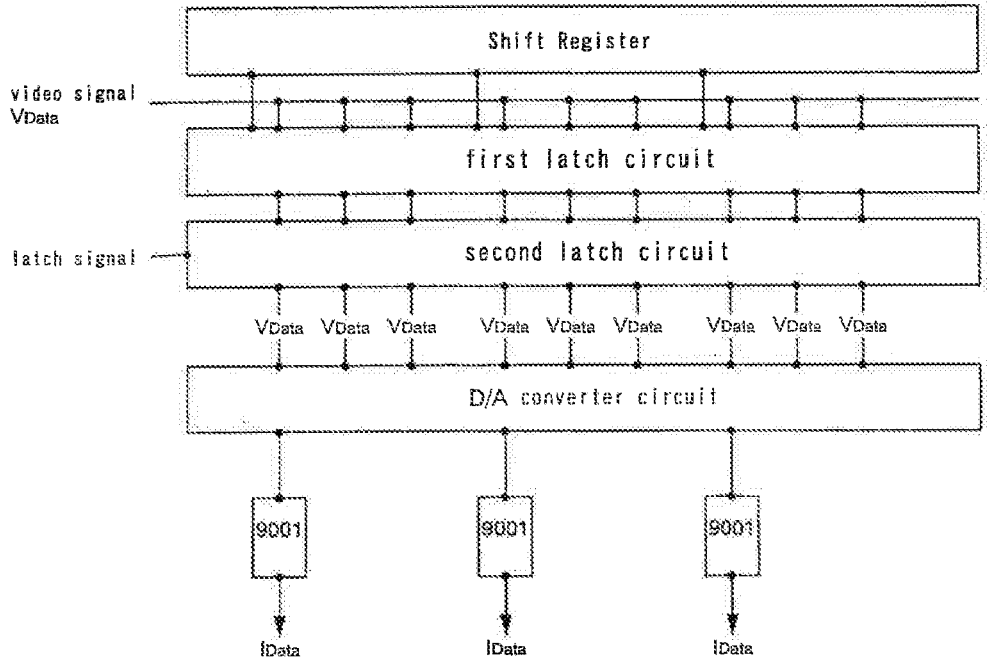
FIGS. 44A and 44B are diagrams showing an example of structuring an electric current source circuit by use of a threshold value correction principle of the present invention.

The driver circuit of another different structure for outputting current to pixels and the like is shown in FIG. 44A. With this structure, a digital video signal taken in by a latch circuit is transferred to a D/A converter circuit in accordance with input of a latch signal, the digital video signal is converted to an analog video signal, the analog video signal is input to each current source circuit 9001, and current is output.

Further, this type of D/A converter circuit may also be given a gamma correction function, for example.

Figure 44B:
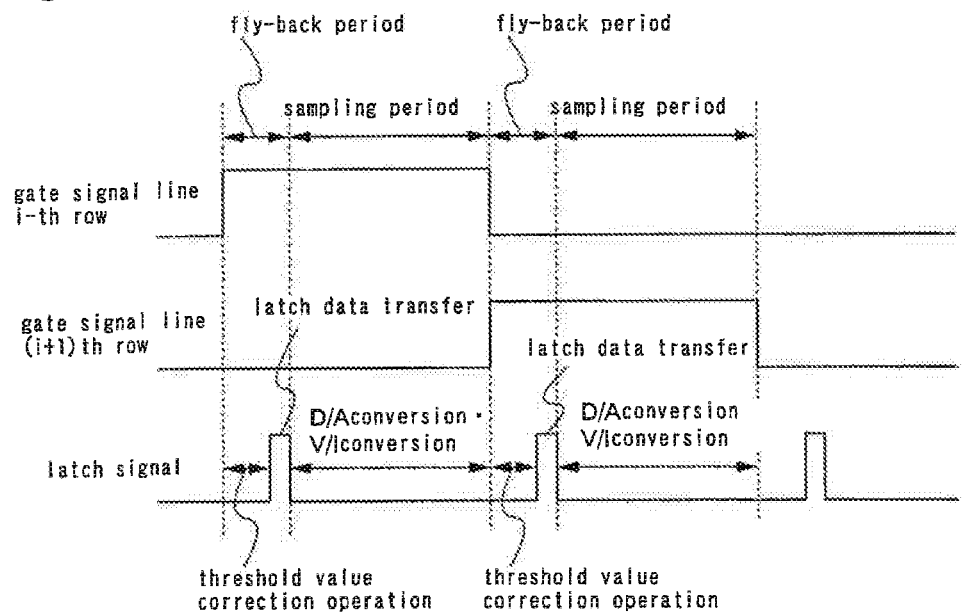

Threshold value correction and latch data transfer are performed within a fly-back period as shown in FIG. 44B, and during a period for performing sampling operations of a certain row, V-I conversion of the video signal of the previous row, and output of current to the pixels and the like are performed. The sampling operations are performed in a line sequential manner, similar to the structure shown in FIG. 42.

The present invention is not limited to the structures shown above, and it is possible to apply the threshold value correction means of the present invention to cases in which V-I conversion is performed by a current source circuit. Further, a structure in which a plurality of current source circuits are disposed in parallel and switchingly used, as shown in FIG. 42, may be used in combination with the structures of FIG. 43, FIG. 44, and the like.

Embodiment 17

As light emitting devices using light emitting devices are self-luminous, they are superior in visibility in bright places and have wider angle of view compared with a liquid crystal display device. Therefore, they can be used in display portions of various electronic equipment.

Examples of electronic equipment using the light emitting device of the present invention include, video cameras, digital cameras, goggle type displays (head mounted displays), navigation systems, audio playback devices (car audios, audio components, etc.), notebook type personal computers, game machines, portable information terminals (mobile computers, mobile telephones, mobile type game machines, electronic books, etc.), image reproduction devices equipped with a recording medium (specifically, devices equipped with a display capable of reproducing the recording medium such as a digital versatile disk (DVD) and displaying the image thereof), and the like. In particular, as to the portable information terminals, in which there are a lot of opportunities to look at the screen from a diagonal direction, since the extent of angle of view is regarded as important, the light emitting device is desirably used. Concrete examples of these electronic equipment are shown in FIG. 31.

Figure 31A:
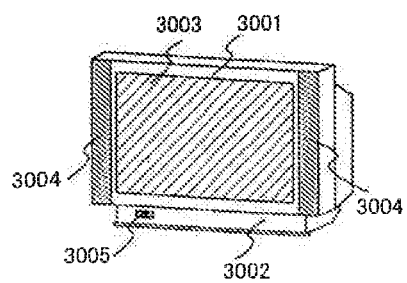
FIGS. 31A-31H are diagrams showing examples of electronic equipment capable of applying the present invention.

FIG. 31A is a light emitting device display device, which is composed of a frame 3001, a support base 3002, a display portion 3003, a speaker portion 3004, a video input terminal 3005, and the like. The light emitting device of the present invention can be used in the display portion 3003. Since the light emitting device is self-luminous, there is no need for a backlight, whereby it is possible to obtain a thinner display portion than that of a liquid crystal display device. Note that the term light emitting device display device includes all display devices for displaying information, such as personal computer monitors, display devices for receiving TV broadcasting, and display devices for advertising.

Figure 31B:
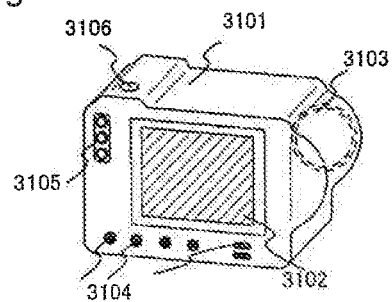

FIG. 31B is a digital still camera, which is composed of a main body 3101, a display portion 3102, an image-receiving portion 3103, operation keys 3104, an external connection port 3105, a shutter 3106, and the like. The light emitting device of the present invention can be used in the display portion 3102.

Figure 31C:
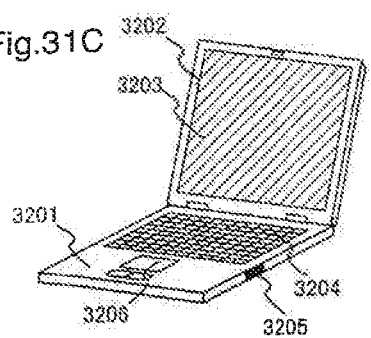

FIG. 31C is a notebook type personal computer, which is composed of a main body 3201, a frame 3202, a display portion 3203, a keyboard 3204, an external connection port 3205, a pointing mouse 3206, and the like. The light emitting device of the present invention can be used in the display portion 3203.

Figure 31D:
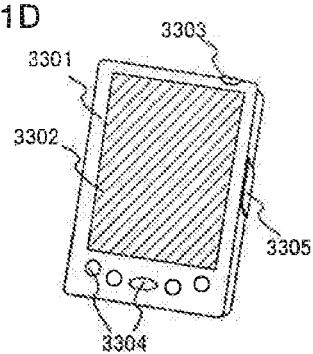

FIG. 31D is a mobile computer, which is composed of a main body 3301, a display portion 3302, a switch 3303, operation keys 3304, an infrared port 3305, and the like. The light emitting device of the present invention can be used in the display portion 3302.

Figure 31E:
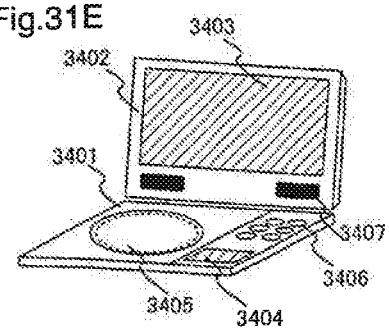

FIG. 31E is a portable image reproduction device provided with a recording medium (specifically, a DVD playback device), which is composed of a main body 3401, a frame 3402, a display portion A 3403, a display portion B 3404, a recording medium (such as a DVD) read-in portion 3405, operation keys 3406, a speaker portion 3407, and the like. The display portion A 3403 mainly displays image information, and the display portion B 3404 mainly displays character information, and the light emitting device of the present invention can be used in the display portion A 3403 and in the display portion B 3404. Note that image reproduction device provided with a recording medium includes game machines for domestic use and the like.

Figure 31F:
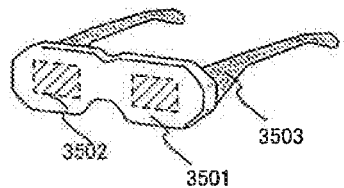
Figure 31G:
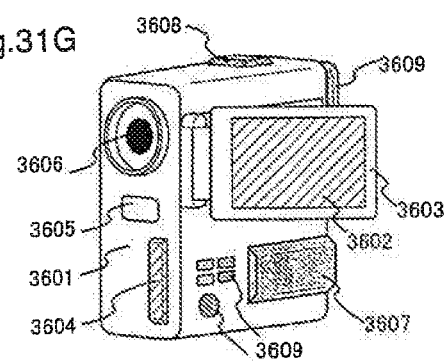

FIG. 31F is a goggle type display (head mounted display), which is composed of a main body 3501, a display portion 3502, an arm portion 3503, and the like. The light emitting device of the present invention can be used in the display portion 3502.

FIG. 13G is a video camera, which is composed of a main body 3601, a display portion 3602, a frame 3603, an external connection port 3604, a remote control receiving portion 3605, an image receiving portion 3606, a battery 3607, an audio input portion 3608, operation keys 3609, and the like. The light emitting device of the present invention can be used in the display portion 3602.

Figure 31H:
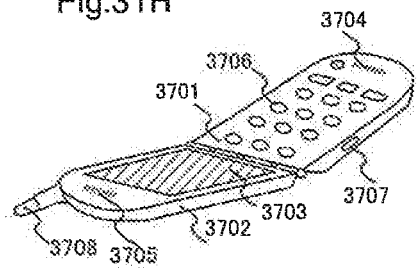

FIG. 31H is a mobile telephone, which is composed of a main body 3701, a frame 3702, a display portion 3703, an audio input portion 3704, an audio output portion 3705, operation keys 3706, an external connection port 3707, an antenna 3708, and the like. The light emitting device of the present invention can be used in the display portion 3703. Note that by displaying white characters on a black background, the display portion 3703 can suppress the power consumption of the mobile telephone.

Note that if the emission luminance of the organic material becomes higher in the future, light including the outputted image information is magnified-projected with a lens or the like, whereby it will be possible to use the projected light in front type projectors or rear type projectors.

Further, the above-described electronic equipment often displays information transmitted through electronic transmission circuits such as the Internet and CATV (cable television), and in particular, opportunities for displaying dynamic information are increasing. The response speed of organic light emitting materials are extremely high, and therefore it is preferable to use light emitting devices for dynamic display.

Further, light emitting devices consume electric power in their light emitting portions, and therefore it is preferable that information is displayed such that the light emitting portions can be made as small as possible. It is therefore preferable to perform driving such that non-light emitting portions form a background, and character information is formed by the light emitting portions, for cases in which the light emitting device is used in a display portion of a portable information terminal, in particular that of a portable telephone or an audio playback device which mainly uses character information.

The applicable range of the present invention is thus extremely wide, and it is possible to use the present invention in electronic equipment of all fields. Further, the electronic equipment of Embodiment 16 may use a light emitting device having the structure of any of Embodiments 1 to 15.

Effect of the Invention

Dispersions in the threshold values of TFTs can be corrected to be rendered normal irrespective of influence of dispersions and the like in the capacitance values of capacitive means, in accordance with the present invention. In addition, when applying the present invention to a light emitting device as shown in FIG. 22, and FIG. 23, although there are many operations to be performed within one horizontal period in the conventional example, it becomes possible to achieve high speed circuit operation based on the simplified operational principle of the present invention and therefore simple operation timing is also simple. In particular, it becomes possible to display a high quality image using an image signal having a very large number of bits when performing display by a method in which a digital gray scale method and a time gray scale method are combined.

What is claimed is:

1. A semiconductor device comprising:
   a pixel comprising:
      a first transistor;
      a second transistor;
      a third transistor;
      a fourth transistor;
      a fifth transistor;
      a sixth transistor;
      an electroluminescent device; and
      a capacitor,
   wherein a gate of the first transistor is electrically connected to a first electrode of the capacitor,
   wherein a second electrode of the capacitor is electrically connected to the electroluminescent device,
   wherein the second transistor is configured to control an establishment of an electrical continuity between a source signal line and one of a source and a drain of the first transistor not via any of the first transistor, the third transistor, the fourth transistor, the fifth transistor, the sixth transistor, the electroluminescent device and the capacitor,
   wherein the third transistor is configured to control an establishment of an electrical continuity between the gate of the first transistor and the other of the source and the drain of the first transistor not via any of the first transistor, the second transistor, the fourth transistor, the fifth transistor, the sixth transistor, the electroluminescent device and the capacitor,
   wherein the fourth transistor is configured to control an establishment of an electrical continuity between the electroluminescent device and the one of the source and the drain of the first transistor not via any of the first transistor, the second transistor, the third transistor, the fifth transistor, the sixth transistor, the electroluminescent device and the capacitor,
   wherein the fifth transistor is configured to control an establishment of an electrical continuity between an electric current supply line and the other of the source and the drain of the first transistor not via any of the first transistor, the second transistor, the third transistor, the fourth transistor, the sixth transistor, the electroluminescent device and the capacitor, and
   wherein the sixth transistor is configured to control an establishment of an electrical continuity between an electric power source line and the second electrode of the capacitor not via any of the first transistor, the second transistor, the third transistor, the fourth transistor, the fifth transistor, the electroluminescent device and the capacitor.

2. The semiconductor device according to claim 1,
   wherein a gate of the third transistor and a gate of the sixth transistor are electrically connected to different gate signal lines.

3. The semiconductor device according to claim 1,
   wherein each of the first transistor, the second transistor, the third transistor, the fourth transistor, the fifth transistor and the sixth transistor is an n-channel thin film transistor.

4. A semiconductor device comprising:
   a pixel comprising:
      a first transistor;
      a second transistor;
      a third transistor;
      a fourth transistor;
      a fifth transistor;
      a sixth transistor;
      an electroluminescent device; and
      a capacitor,
   wherein a gate of the first transistor is directly connected to a first electrode of the capacitor,
   wherein a second electrode of the capacitor is directly connected to the electroluminescent device,
   wherein one of a source and a drain of the second transistor is directly connected to a source signal line,
   wherein the other of the source and the drain of the second transistor is directly connected to one of a source and a drain of the first transistor,
   wherein one of a source and a drain of the third transistor is directly connected to the gate of the first transistor,
   wherein the other of the source and the drain of the third transistor is directly connected to the other of the source and the drain of the first transistor,
   wherein one of a source and a drain of the fourth transistor is directly connected to the one of the source and the drain of the first transistor,
   wherein the other of the source and the drain of the fourth transistor is directly connected to the electroluminescent device,
   wherein one of a source and a drain of the fifth transistor is directly connected to the other of the source and the drain of the first transistor,
   wherein the other of the source and the drain of the fifth transistor is directly connected to an electric current supply line,
   wherein one of a source and a drain of the sixth transistor is directly connected to the second electrode of the capacitor, and
   wherein the other of the source and the drain of the sixth transistor is directly connected to an electric power source line.

5. The semiconductor device according to claim 4,
   wherein a gate of the third transistor and a gate of the sixth transistor are directly connected to different gate signal lines.

6. The semiconductor device according to claim 4,
   wherein each of the first transistor, the second transistor, the third transistor, the fourth transistor, the fifth transistor and the sixth transistor is an n-channel thin film transistor.

7. A driving method for a semiconductor device comprising a pixel, wherein the pixel comprises a first transistor, a second transistor, a third transistor, a fourth transistor, a fifth transistor, a sixth transistor, an electroluminescent device, and a capacitor, wherein a gate of the first transistor is electrically connected to the electroluminescent device via the capacitor, wherein one of a source and a drain of the first transistor is electrically connected to a source signal line via the second transistor, wherein the other of the source and the drain of the first transistor is electrically connected to a gate of the first transistor via the third transistor, wherein the one of the source and the drain of the first transistor is electrically connected to the electroluminescent device via the fourth transistor, wherein the other of the source and the drain of the first transistor is electrically connected to an electric current supply line via the fifth transistor, and wherein the gate of the first transistor is electrically connected to an electric power source line via the capacitor and the sixth transistor, the driving method comprising the steps of:

putting the pixel into a first state in which the second transistor, the third transistor, the fifth transistor, and the sixth transistor are in on-state and the fourth transistor is in off-state;

putting the pixel into a second state in which the second transistor, the third transistor, and the sixth transistor are in on-state and the fourth transistor and the fifth transistor are in off-state; and putting the pixel into a third state in which the fourth transistor and the fifth transistor are in on-state and the second transistor, the third transistor, and the sixth transistor are in off-state.

8. The driving method according to claim 7, wherein a gate of the third transistor and a gate of the sixth transistor are electrically connected to different gate signal lines.

9. The driving method according to claim 7, wherein each of the first transistor, the second transistor, the third transistor, the fourth transistor, the fifth transistor and the sixth transistor is an n-channel thin film transistor.

\* \* \* \* \*